US012635345B2

(12) United States Patent
Xu

(10) Patent No.: US 12,635,345 B2
(45) Date of Patent: May 19, 2026

(54) DISPLAY SUBSTRATE INCLUDING AN ANODE COMPRISING A MAIN BODY AND A PROTRUSION PORTION AND A DISPLAY DEVICE HAVING THE SAME

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Cheng Xu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 497 days.

(21) Appl. No.: 18/020,301

(22) PCT Filed: Jun. 29, 2022

(86) PCT No.: PCT/CN2022/102336
§ 371 (c)(1),
(2) Date: Feb. 8, 2023

(87) PCT Pub. No.: WO2023/201888
PCT Pub. Date: Oct. 26, 2023

(65) Prior Publication Data
US 2024/0276772 A1      Aug. 15, 2024

(30) Foreign Application Priority Data

Apr. 22, 2022     (CN) .......................... 202210423991.9

(51) Int. Cl.
H01L 29/08          (2006.01)
H10K 59/121        (2023.01)
(Continued)

(52) U.S. Cl.
CPC ....... H10K 59/122 (2023.02); H10K 59/1213 (2023.02); H10K 59/80517 (2023.02); H10K 59/873 (2023.02)

(58) Field of Classification Search
CPC ............. H10K 59/122; H10K 59/1213; H10K 59/873; H10K 59/80517
(Continued)

(56) References Cited

U.S. PATENT DOCUMENTS 8,816,579 B2       8/2014   Kim
10,475,866 B2     11/2019   Choi et al.
(Continued)

FOREIGN PATENT DOCUMENTS

CN          102956669 A      3/2013
CN          102969329 A      3/2013
(Continued)

OTHER PUBLICATIONS

Office Action issued by the Chinese Patent Office in the corresponding application No. 202210423991.9, which is dated on Jun. 6, 2022.
(Continued)

*Primary Examiner* — Phuc T Dang
(74) *Attorney, Agent, or Firm* — Dilworth & Barrese, LLP.; Michael J. Musella, Esq.

(57) ABSTRACT

A display substrate and a display device. The display substrate includes a driving substrate, an anode layer, a pixel definition layer, a light emitting functional layer, a cathode layer and an encapsulation layer; the driving circuit includes at least one transistor, the at least one transistor includes a semiconductor layer, the anode layer includes a plurality of anodes, the display substrate includes a plurality of pixel openings; the plurality of pixel openings are configured to at least overlap with the plurality of anodes; each of the anodes
(Continued)

includes a main body portion and a protrusion portion, the protrusion portion is connected with the main body portion; the light emitting functional layer includes a plurality of light emitting portions which are arranged in contact with the main body portions of the plurality of anodes.

22 Claims, 32 Drawing Sheets

(51) Int. Cl.
　　*H10K 59/122*　　　(2023.01)
　　*H10K 59/80*　　　　(2023.01)

(58) Field of Classification Search
　　USPC ......................................................... 257/40
　　See application file for complete search history.

(56) References Cited

U.S. PATENT DOCUMENTS

| | | | |
|---|---|---|---|
| 11,545,652 B2 | 1/2023 | Huang | |
| 11,698,694 B2 * | 7/2023 | Lee ...................... | G06F 3/0446 |
| | | | 345/173 |
| 2003/0160318 A1 | 8/2003 | Guenther et al. | |
| 2009/0302744 A1 | 12/2009 | Kim et al. | |
| 2012/0217518 A1 | 8/2012 | Abe et al. | |
| 2013/0049028 A1 | 2/2013 | Kim et al. | |
| 2013/0140536 A1 | 6/2013 | Yamazaki et al. | |
| 2015/0069375 A1 | 3/2015 | Yokoyama et al. | |
| 2015/0249119 A1 | 9/2015 | In et al. | |
| 2016/0126496 A1 | 5/2016 | Wang et al. | |
| 2016/0190217 A1 | 6/2016 | Park et al. | |
| 2017/0221974 A1 | 8/2017 | Kimura et al. | |
| 2017/0278914 A1 | 9/2017 | Cui et al. | |
| 2020/0365776 A1 | 11/2020 | Sim et al. | |
| 2021/0351266 A1 | 11/2021 | Kasahara et al. | |
| 2021/0408203 A1 | 12/2021 | Shi et al. | |
| 2021/0408435 A1 | 12/2021 | Wei et al. | |
| 2021/0408488 A1 | 12/2021 | Lu et al. | |
| 2022/0052136 A1 | 2/2022 | Wang et al. | |
| 2022/0328579 A1 | 10/2022 | Shang et al. | |
| 2022/0367581 A1 | 11/2022 | Wang et al. | |
| 2023/0109576 A1 | 4/2023 | Uchida et al. | |

FOREIGN PATENT DOCUMENTS

| | | | | |
|---|---|---|---|---|
| CN | 107887517 A | | 4/2018 | |
| CN | 111180603 A | | 5/2020 | |
| CN | 111564481 A | | 8/2020 | |
| CN | 111584568 A | | 8/2020 | |
| CN | 111599937 A | | 8/2020 | |
| CN | 111668382 A | | 9/2020 | |
| CN | 111816684 A | * | 10/2020 | .......... H01L 27/3211 |
| CN | 212695182 U | | 3/2021 | |
| CN | 112703605 A | | 4/2021 | |
| CN | 112714954 A | | 4/2021 | |
| CN | 112864344 A | | 5/2021 | |
| CN | 113745272 A | | 12/2021 | |
| CN | 113793908 A | | 12/2021 | |
| CN | 113948660 A | | 1/2022 | |
| CN | 114005865 A | | 2/2022 | |
| CN | 114551769 A | | 5/2022 | |
| JP | 2003017273 A | | 1/2003 | |
| JP | 2006054199 A | | 2/2006 | |
| KR | 1020130023782 A | | 3/2013 | |
| KR | 1020210064559 A | | 6/2021 | |
| KR | 1020220041036 A | | 3/2022 | |
| TW | 202143477 A | | 11/2021 | |
| WO | WO-2021016956 A1 | * | 2/2021 | ....... G02F 1/134309 |
| WO | WO-2021170006 A1 | * | 9/2021 | ......... H10K 59/1201 |

OTHER PUBLICATIONS

International Search report of PCT/CN2022/102336 issued on Jan. 18, 2023.

Office Action issued by the Intellectual Property Office of Taiwan Province of China (Taiwan Province Application No. 111142385) Date of Receipt: Oct. 13, 2023), and its English translation.

EESR issued from the European Patent Office in the application No. of 22790435.6, Mailing Date : Jan. 17, 2024.

Korea Office Action of Korean Application: 10-2022-7033452; Mailing Date: Feb. 12, 2026.

European Patent Office Action of Europe Application: 22790435.6; Mailing Date: Feb. 27, 2026.

Wu et al., Efficient multi-barrier thin film encapsulation of OLED using alternating Al2O3 and polymer layers, Scientific Journal, Feb. 2, 2018, pp. 5721-5727, RSC Advance.

* cited by examiner

500

500

811
(metal3)

820
(metal4)

830
(metal4')

840
(metal5)

812
(metal3)

V1     V2

C1

811
(metal3)

812
(metal3)

820
(metal4)

830
(metal4')

<u>103</u>

135

DISPLAY SUBSTRATE INCLUDING AN ANODE COMPRISING A MAIN BODY AND A PROTRUSION PORTION AND A DISPLAY DEVICE HAVING THE SAME

CROSS REFERENCES TO RELATED APPLICATIONS

The present application claims priority of Chinese Patent Application No. 202210423991.9 filed with CNIPA on Apr. 22, 2022, the present disclosures of which are incorporated herein by reference in their entirety as part of the present disclosure.

TECHNICAL FIELD

Embodiments of the present disclosure relate to a display substrate and a display device.

BACKGROUND

With the continuous development of display technology, Micro Organic Light emitting Diode (Micro-OLED) display device is a new type of OLED display device based on a silicon substrate, also known as a silicon-based organic light emitting diode (silicon-based OLED for short) display device. Silicon-based OLED display devices have the advantages of small size and high resolution, which are manufactured by CMOS integrated circuit technology, active addressing of pixels can be realized, and a variety of functional circuits including TCON (Timing Control) circuit and OCP (Operation Control) circuit can be manufactured on a silicon substrate, which can achieve light weight.

Micro OLED (Micro OLED) displays have excellent display characteristics, such as high resolution, high brightness, rich colors, low driving voltage, fast response speed, low power consumption, etc., and have broad development prospects.

SUMMARY

Embodiments of the present disclosure provide a display substrate and a display device. The display substrate includes a driving substrate, an anode layer, a pixel definition layer, a light emitting functional layer, a cathode layer and an encapsulation layer; the driving substrate includes a substrate and a driving circuit; the anode layer is located on the driving substrate; the pixel definition layer is located at a side of the anode layer away from the driving substrate; the light emitting functional layer is located at a side of the anode layer away from the driving substrate; the cathode layer is located at a side of the light emitting functional layer away from the driving substrate; the encapsulation layer is located at a side of the cathode layer away from the driving substrate; the driving circuit includes at least one transistor, the at least one transistor includes a semiconductor layer, the semiconductor layer is at least partially inside the substrate; the anode layer includes a plurality of anodes, the display substrate includes a plurality of pixel openings, and the plurality of pixel openings are located in the pixel defining layer, and located at a side of the plurality of anodes away from the driving substrate, the plurality of pixel openings are configured to be at least overlapped with the plurality of anodes. Each of the plurality of anodes includes a main body portion and a protrusion portion, the protrusion portion is arranged around the main body portion, a size of the protrusion portion in the first direction perpendicular to the driving substrate is larger than a size of the main body portion in the first direction perpendicular to the driving substrate, the light emitting function layer includes a plurality of light emitting portions, the plurality of light emitting portions are located in the plurality of pixel openings, and in contact with the main body portions of the plurality of anodes. In this way, the display substrate can effectively avoid the leakage and crosstalk between adjacent sub-pixels.

At least one embodiment of the present disclosure provides a display substrate, which includes: a driving substrate, including a substrate and a driving circuit; a first planarization layer, located on the driving circuit; an anode layer, located at a side of the first planarization layer away from the driving substrate; a pixel definition layer, located at a side of the anode layer away from the driving substrate; a light emitting functional layer, located at a side of the anode layer away from the driving substrate; a cathode layer, located at a side of the light emitting functional layer away from the driving substrate; and an encapsulation layer, located at a side of the cathode layer away from the driving substrate; the driving circuit includes at least one transistor, the at least one transistor includes a semiconductor layer, the semiconductor layer is at least partially located inside the substrate, the anode layer includes a plurality of anodes, the display substrate includes a plurality of pixel openings, and the plurality of pixel openings are located at a side of the plurality of anodes away from the driving substrate, the plurality of pixel openings are configured to at least overlap with the plurality of anodes; each of the anodes includes a main body portion and a protrusion portion, the protrusion portion is connected with the main body portion, a size of the protrusion portion in a first direction is larger than a size of the main body portion in the first direction, the light emitting functional layer includes a plurality of light emitting portions, and the plurality of light emitting portions are arranged in contact with main body portions of the plurality of anodes. A distance between a surface of the first planarization layer at the position of the main body portion away from the substrate and the substrate is equal to a distance between a surface of the first planarization layer at the position of the protrusion portion away from the substrate and the substrate, a distance between a surface of the main body portion away from the substrate and a surface of the first planarization layer away from the substrate is smaller than a distance between a surface of the protrusion portion away from the substrate and a surface of the first planarization layer away from the substrate.

For example, in the display substrate provided by an embodiment of the present disclosure, the protrusion portion is arranged on a periphery of the main body portion.

For example, in the display substrate provided by an embodiment of the present disclosure, an orthographic projection of the pixel definition layer on the driving substrate is overlapped with an orthographic projection of the protrusion portion on the driving substrate.

For example, in the display substrate provided by an embodiment of the present disclosure, the pixel definition layer includes a pixel definition portion, and the pixel definition portion includes: a pixel definition planarization portion, located between two adjacent anodes; and protruding structures, respectively located at a side of protrusion portions of the two adjacent anodes away from the driving substrate, the protruding structures are connected by the pixel definition planarization portion.

For example, in the display substrate provided by an embodiment of the present disclosure, the pixel definition portions are arranged symmetrically with respect to a center of an interval region between the two adjacent anodes.

For example, in the display substrate provided by an embodiment of the present disclosure, each of the protruding structures includes: a first side wall, located at a side of the protruding structure close to a center of the main body portion; and a second side wall, connected with the first side wall, the second side wall is further away from the driving substrate than the first side wall; and a slope angle of the first side wall is greater than a slope angle of the second side wall.

For example, in the display substrate provided by an embodiment of the present disclosure, a value range of the slope angle of the first side wall is from 75 degrees to 89 degrees, and a value range of the slope angle of the second side wall is from 15 degrees to 45 degrees.

For example, in the display substrate provided by an embodiment of the present disclosure, each of the protruding structures further includes: a third side wall, located at a side of the protruding structure close to the pixel definition planarization portion, a slope angle of the third side wall is greater than the slope angle of the second side wall, and is smaller than the slope angle of the first side wall.

For example, in the display substrate provided by an embodiment of the present disclosure, each of the protruding structures further includes: a third side wall, located at a side of the protruding structure close to the pixel definition planarization portion, the slope angle of the first side wall is α, the slope angle of the second side wall is β, the slope angle of the third side wall is γ, and α, β, and γ satisfy the following formula: β<γ<α.

For example, in the display substrate provided by an embodiment of the present disclosure, a difference between the slope angle of the first side wall and the slope angle of the second side wall is equal to i times the slope angle of the third side wall, and a value range of i is from 0.8 to 1.2.

For example, in the display substrate provided by an embodiment of the present disclosure, the slope angle α of the first side wall, the slope angle β of the second side wall, and the slope angle γ of the third side wall satisfy the following formula: (α−β)=i*γ, in which a value range of i is from 0.8 to 1.2.

For example, in the display substrate provided by an embodiment of the present disclosure, a difference between the slope angle of the first side wall and the slope angle of the second side wall is equal to j times a difference between the slope angle of the second side wall and the slope angle of the third side wall, and a value range of j is from 1.5 to 3.

For example, in the display substrate provided by an embodiment of the present disclosure, the slope angle α of the first side wall, the slope angle β of the second side wall, and the slope angle γ of the third side wall satisfy the following formula: (α−β)=j*(γ−β), in which a value range of j is from 1.5 to 3.

For example, in the display substrate provided by an embodiment of the present disclosure, a sum of the slope angle of the first side wall and the slope angle of the second side wall is equal to k times the slope angle of the third side wall, and a value range of k is from 2 to 3.

For example, in the display substrate provided by an embodiment of the present disclosure, a value range of the slope angle of the third side wall is from 45 degrees to 60 degrees.

For example, in the display substrate provided by an embodiment of the present disclosure, a size of an orthographic projection of the third side wall on the driving substrate in a second direction is larger than a size of an orthographic projection of the second side wall on the driving substrate in the second direction, the size of the orthographic projection of the second side wall on the driving substrate in the second direction is larger than a size of an orthographic projection of the first side wall on the driving substrate in the second direction, the second direction is a direction from the protrusion portion to the main body portion, or a direction from the main body portion to the protrusion portion, and the second direction is parallel to a surface of the driving substrate away from the anode layer.

For example, in the display substrate provided by an embodiment of the present disclosure, a size of the first side wall in the first direction is H1, a size of the second side wall in the first direction is H2, a size of the third side wall in the first direction is H3, and H1, H2 and H3 satisfy the following formula:

$$H3 * \cos\gamma > H2 * \cos\beta > H1 * \cos\alpha.$$

For example, in the display substrate provided by an embodiment of the present disclosure, the protrusion portion of each of the anodes includes a fourth side wall, located at a side of the protrusion portion close to a center of the main body portion, a slope angle of the fourth side wall is greater than the slope angle of the second side wall and is smaller than the slope angle of the first side wall.

For example, in the display substrate provided by an embodiment of the present disclosure, the protrusion portion of each of the anodes includes a fourth side wall, located at the side of the protrusion portion close to the center of the main body portion, a slope angle of the fourth side wall is δ, and α, β, and δ satisfy the following formula: β<δ<α.

For example, in the display substrate provided by an embodiment of the present disclosure, the protrusion portion of each of the anodes includes: a first sub-anode layer, located at a side of the driving circuit away from the substrate; a second sub-anode layer, located at a side of the first sub-anode layer away from the driving substrate; and a third sub-anode layer, located at a side of the second sub-anode layer away from the driving substrate.

For example, in the display substrate provided by an embodiment of the present disclosure, a size of the first sub-anode layer in a second direction is larger than a size of the third sub-anode layer in the second direction, the size of the third sub-anode layer in the second direction is larger than a size of the second sub-anode layer in the second direction. the second direction is a direction from the protrusion portion to the main body portion, or a direction from the main body portion to the protrusion portion, and the second direction is parallel to a surface of the driving substrate away from the anode layer.

For example, in the display substrate provided by an embodiment of the present disclosure, one end of the first sub-anode layer away from the main body portion includes a bulge portion, and a thickness of the bulge portion in the first direction is greater than an average thickness of the first sub-anode layer in the first direction.

For example, in the display substrate provided by an embodiment of the present disclosure, one end of the third sub-anode layer away from the main body portion is bent in a direction close to the first sub-anode layer.

For example, in the display substrate provided by an embodiment of the present disclosure, the protrusion portion of each of the anodes further includes: a fourth sub-anode layer, located between the second sub-anode layer and the third sub-anode layer, in which a size of the fourth sub-anode layer in the second direction is smaller than a size of the second sub-anode layer in the second direction.

For example, in the display substrate provided by an embodiment of the present disclosure, a size of a part of the third sub-anode layer going beyond the fourth sub-anode layer in the second direction is smaller than a size in the second direction of the overlapping region of the orthographic projection of the pixel definition layer on the driving substrate and the orthographic projection of the protrusion portion on the driving substrate.

For example, in the display substrate provided by an embodiment of the present disclosure, the second sub-anode layer includes a fifth side wall, located at a side of the second sub-anode layer away from the main body portion, and the fourth sub-anode layer includes a sixth side wall, located at a side of the fourth sub-anode layer away from the main body portion, a slope angle of the fifth side wall is greater than the slope angle of the fourth side wall, a slope angle of the sixth side wall is greater than the slope angle of the fourth side wall, and the slope angle of the fifth side wall is greater than the slope angle of the sixth side wall.

For example, in the display substrate provided by an embodiment of the present disclosure, a ratio of a thickness of the first sub-anode layer in the first direction perpendicular to the driving substrate to a thickness of the second sub-anode layer in the first direction perpendicular to the driving substrate is in a range from $\frac{1}{15}$ to $\frac{1}{5}$.

For example, in the display substrate provided by an embodiment of the present disclosure, a ratio of a thickness of the first sub-anode layer in the first direction perpendicular to the driving substrate to a thickness of the third sub-anode layer in the first direction perpendicular to the driving substrate is in a range from $\frac{1}{3}$ to $\frac{4}{5}$.

For example, in the display substrate provided by an embodiment of the present disclosure, a ratio of a thickness of the first sub-anode layer in the first direction perpendicular to the driving substrate to the thickness of the fourth sub-anode layer in the first direction perpendicular to the driving substrate is in the range from $\frac{1}{24}$ to $\frac{1}{8}$.

For example, in the display substrate provided by an embodiment of the present disclosure, a ratio of a distance between the two adjacent anodes to a length of the orthographic projection of the protrusion portion of the anode on the driving substrate ranges from 2 to 4.

For example, in the display substrate provided by an embodiment of the present disclosure, the ratio of the distance between the two adjacent anodes to the length of the orthographic projection of the protrusion portion of the anode on the driving substrate ranges from 2.5 to 3.5.

For example, in the display substrate provided by an embodiment of the present disclosure, the protrusion portion is arranged around the main body portion.

For example, in the display substrate provided by an embodiment of the present disclosure, a shape of an orthographic projection of each of the anodes on the driving substrate includes a hexagon.

For example, the display substrate provided by an embodiment of the present disclosure further includes: a reflective electrode layer, located at a side of the first planarization layer close to the anode layer; and a second planarization layer, located at a side of the reflective electrode layer close to the anode layer.

For example, in the display substrate provided by an embodiment of the present disclosure, the reflective electrode layer is continuously arranged in the pixel openings.

For example, in the display substrate provided by an embodiment of the present disclosure, a first pore is provided between the light emitting functional layer and the main body portion, at least one second pore is provided between the light emitting functional layer and the pixel definition layer, and a space occupied by the first pore is larger than a space occupied by the second pore.

For example, in the display substrate provided by an embodiment of the present disclosure, the encapsulation layer includes: an inorganic encapsulation layer, located at a side of the cathode layer away from the driving substrate, the inorganic encapsulation layer includes a plurality of sub-inorganic encapsulation layers.

For example, in the display substrate provided by an embodiment of the present disclosure, at least two adjacent sub-inorganic encapsulation layers made of different materials are provided in the plurality of sub-inorganic encapsulation layers, and at least two adjacent sub-inorganic encapsulation layers made of the same material are provided in the plurality of sub-inorganic encapsulation layers.

For example, in the display substrate provided by an embodiment of the present disclosure, in a direction away from the driving substrate, refractive indexes of the plurality of sub-inorganic encapsulation layers first increase and then decrease.

For example, in the display substrate provided by an embodiment of the present disclosure, in a direction away from the driving substrate, thicknesses of the plurality of sub-inorganic encapsulation layers in the first direction gradually decrease.

For example, in the display substrate provided by an embodiment of the present disclosure, each of the sub-inorganic encapsulation layers includes: alternately arranged flat regions and double arch interval regions, a first arch region located at a side of one flat region away from one double arch interval region, a second arch region between the flat region and the double arch interval region, and a third arch region located at a side of the flat region away from the second arch region, and the first arch region and the second arch region are symmetrically arranged with respect to a center of the flat region.

For example, in the display substrate provided by an embodiment of the present disclosure, a size of the flat region in the second direction is L, a distance between a center of the second arch region and a center of the third arch region in the second direction is a first distance D1, a distance between a center of the first arch region and the center of the second arch region in the second direction is a second distance D2, a radius of curvature of the first arch region, a radius of curvature of the second arch region and a radius of curvature of the third arch region are all R, and the first distance D1 satisfies the following formula:

$$D2 \leqslant (L + D1) < (L + R),$$

the second direction is a direction from the protrusion portion to the main body portion, or a direction from the main body portion to the protrusion portion, and the second direction is parallel to a surface of the driving substrate away from the anode layer.

For example, in the display substrate provided by an embodiment of the present disclosure, a size of the flat region in a second direction is L, a distance between a center of the second arch region and a center of the third arch region in the second direction is a first distance D1, a distance between a center of the first arch region and the center of the second arch region in the second direction is a second distance D2, a radius of curvature of the first arch region, a radius of curvature of the second arch region and a radius of curvature of the third arch region are all R, the first distance D1 satisfies the following formula:

$$(L + D1) \leq D2 < (L + R),$$

the second direction is a direction from the protrusion portion to the main body portion, or a direction from the main body portion to the protrusion portion, and the second direction is parallel to a surface of the driving substrate away from the anode layer.

For example, in the display substrate provided by an embodiment of the present disclosure, an orthographic projection of the first arch region, an orthographic projection of the second arch region or an orthographic projection of the third arch region on the driving substrate is overlapped with an orthographic projection of the protrusion portion on the driving substrate, an orthographic projection of the flat region on the driving substrate is overlapped with an orthographic projection of the main body portion on the driving substrate, and a distance between a surface of the first arch region, the second arch region or the third arch region away from the driving substrate and the driving substrate is greater than a distance between a surface of the flat region away from the driving substrate and the driving substrate.

For example, in the display substrate provided by an embodiment of the present disclosure, an orthographic projection of the double arch interval region on the driving substrate is overlapped with an orthographic projection of an interval region between two adjacent anodes on the driving substrate.

For example, in the display substrate provided by an embodiment of the present disclosure, the plurality of sub-inorganic encapsulation layers includes: a first sub-inorganic encapsulation layer, located at a side of the cathode layer away from the driving substrate; a second sub-inorganic encapsulation layer, located at a side of the first sub-inorganic encapsulation layer away from the driving substrate; a third sub-inorganic encapsulation layer, located at a side of the second sub-inorganic encapsulation layer away from the driving substrate; and a fourth sub-inorganic encapsulation layer, located at a side of the third sub-inorganic encapsulation layer away from the driving substrate.

For example, in the display substrate provided by an embodiment of the present disclosure, a refractive index of the first sub-inorganic encapsulation layer is smaller than a refractive index of the second sub-inorganic encapsulation layer, and a refractive index of the fourth sub-inorganic encapsulation layer is smaller than a refractive index of the third sub-inorganic encapsulation layer.

For example, in the display substrate provided by an embodiment of the present disclosure, the refractive index of the second sub-inorganic encapsulation layer is equal to the refractive index of the third sub-inorganic encapsulation layer.

For example, in the display substrate provided by an embodiment of the present disclosure, the flat region of the first sub-inorganic encapsulation layer has a first width in a second direction, the flat region of the second sub-inorganic encapsulation layer has a second width in the second direction, the flat region of the third sub-inorganic encapsulation layer has a third width in the second direction, the flat region of the fourth sub-inorganic encapsulation layer has a fourth width in the second direction, the first width is greater than the second width, the second width is greater than the third width, and the third width is greater than the fourth width.

For example, in the display substrate provided by an embodiment of the present disclosure, an included angle between a first connection line of an edge of the flat region of the first sub-inorganic encapsulation layer close to the second arch region, an edge of the flat region of the second sub-inorganic encapsulation layer close to the second arch region, an edge of the flat region of the third sub-inorganic encapsulation layer close to the second arch region and an edge of the flat region of the fourth sub-inorganic encapsulation layer close to the second arch region and a surface of the driving substrate away from the anode layer is a first included angle, an included angle between a second connection line of a vertex of the second arch region of the first sub-inorganic encapsulation layer, a vertex of the second arch region of the second sub-inorganic encapsulation layer, a vertex of the second arch region of the third sub-inorganic encapsulation layer and a vertex of the second arch region of the fourth sub-inorganic encapsulation layer and the surface of the driving substrate away from the anode layer is a second included angle, and the first included angle is smaller than the second included angle.

For example, in the display substrate provided by an embodiment of the present disclosure, a range of the first included angle is from 60 degrees to 85 degrees, and a range of the second included angle is from 85 degrees to 89 degrees.

For example, in the display substrate provided by an embodiment of the present disclosure, an intersection of the first connection line and the second connection line is located within the driving substrate.

For example, in the display substrate provided by an embodiment of the present disclosure, the driving circuit includes: a semiconductor layer, located in the substrate; a first conductive layer, located on the semiconductor layer; a second conductive layer, located at a side of the first conductive layer away from the substrate; a third conductive layer, located at a side of the second conductive layer away from the substrate; and a fourth conductive layer, located at a side of the third conductive layer away from the substrate.

For example, in the display substrate provided by an embodiment of the present disclosure, an intersection of the first connection line and the second connection line is located between an upper surface of the third conductive layer away from the substrate and the anode layer.

For example, in the display substrate provided by an embodiment of the present disclosure, a distance between an intersection of the first connection line and the second connection line and a vertex of the protruding structure of the pixel definition layer away from an upper surface of the substrate is greater than a thickness of the first sub-inorganic encapsulation layer in the first direction.

For example, in the display substrate provided by an embodiment of the present disclosure, a distance between an intersection of the first connection line and the second connection line and a vertex of the protruding structure of the pixel definition layer away from an upper surface of the substrate is less than a sum of a thickness of the first sub-inorganic encapsulation layer in the first direction and a thickness of the second sub-inorganic encapsulation layer in the first direction.

For example, in the display substrate provided by an embodiment of the present disclosure, an included angle between a third connection line of an edge of the second arch region of the first sub-inorganic encapsulation layer close to the double arch interval region, an edge of the second arch region of the second sub-inorganic encapsulation layer close to the double arch interval region, an edge of the second arch region of the third sub-inorganic encapsulation layer close to the double arch interval region and an edge of the second arch region of the fourth sub-inorganic encapsulation layer close to the double arch interval region and a surface of the driving substrate away from the anode layer is a third included angle, and the third included angle is smaller than the second included angle.

For example, in the display substrate provided by an embodiment of the present disclosure, an intersection of the first connection line and the third connection line is located between an upper surface of the second conductive layer away from the substrate and a lower surface of the third conductive layer close to the substrate.

For example, in the display substrate provided by an embodiment of the present disclosure, an intersection of the second connection line and the third connection line is located between a lower surface of the first conductive layer close to the substrate and a lower surface of the substrate away from the first conductive layer.

For example, in the display substrate provided by an embodiment of the present disclosure, an included angle between a fourth connection line of an edge of the third arch region of the first sub-inorganic encapsulation layer away from the double arch interval region, an edge of the third arch region of the second sub-inorganic encapsulation layer away from the double arch interval region, an edge of the third arch region of the third sub-inorganic encapsulation layer away from the double arch interval region and an edge of the third arch region of the fourth sub-inorganic encapsulation layer away from the double arch interval region and the surface of the driving substrate away from the anode layer is a fourth included angle, and the fourth included angle is smaller than the second included angle.

For example, in the display substrate provided by an embodiment of the present disclosure, an intersection of the first connection line and the fourth connection line is located at a side of the substrate away from the first conductive layer.

For example, in the display substrate provided by an embodiment of the present disclosure, an intersection of the third connection line and the fourth connection line is located at a side of the substrate away from the first conductive layer.

For example, in the display substrate provided by an embodiment of the present disclosure, an upper surface of the first arch region of the first sub-inorganic encapsulation layer away from the substrate has a first radius of curvature, an upper surface of the first arch region of the second sub-inorganic encapsulation layer away from the substrate has a second radius of curvature, an upper surface of the first arch region of the third sub-inorganic encapsulation layer away from the substrate has a third radius of curvature, an upper surface of the first arch region of the fourth sub-inorganic encapsulation layer away from the substrate has a fourth radius of curvature, the first radius of curvature is smaller than the second radius of curvature, the second radius of curvature is smaller than the third radius of curvature, and the third radius of curvature is smaller than the fourth radius of curvature.

For example, in the display substrate provided by an embodiment of the present disclosure, a dummy center of the first arch region of the fourth sub-inorganic encapsulation layer is located between an upper surface of the first sub-inorganic encapsulation layer away from the substrate and a lower surface of the fourth sub-inorganic encapsulation layer close to the substrate.

For example, in the display substrate provided by an embodiment of the present disclosure, the first sub-inorganic encapsulation layer has a first thickness in the first direction, the second sub-inorganic encapsulation layer has a second thickness in the first direction, the third sub-inorganic encapsulation layer has a third thickness in the first direction, the fourth sub-inorganic encapsulation layer has a fourth thickness in the first direction, the first thickness is greater than the second thickness, the second thickness is greater than the third thickness, and the third thickness is greater than the fourth thickness.

For example, in the display substrate provided by an embodiment of the present disclosure, a ratio of a difference between the first thickness and the second thickness and a difference between the third thickness and the fourth thickness ranges from 1.5 times to 2 times.

For example, in the display substrate provided by an embodiment of the present disclosure, a ratio of a sum of the second thickness and the third thickness to the first thickness ranges from 0.8 to 1.2.

For example, in the display substrate provided by an embodiment of the present disclosure, the first thickness is in a range from 1000 nanometers to 1200 nanometers, the second thickness is in a range from 500 nanometers to 660 nanometers, the third thickness is in a range from 480 nanometers to 560 nanometers, and the fourth thickness is in a range from 180 nanometers to 260 nanometers.

For example, in the display substrate provided by an embodiment of the present disclosure, a material of the first sub-inorganic encapsulation layer includes silicon oxide and silicon oxynitride, a material of the second sub-inorganic encapsulation layer includes silicon nitride, a material of the third sub-inorganic encapsulation layer includes silicon nitride, and a material of the fourth sub-inorganic encapsulation layer includes silicon oxide.

For example, in the display substrate provided by an embodiment of the present disclosure, the encapsulation layer further includes: an organic encapsulation layer, located at a side of the inorganic encapsulation layer away from the driving substrate, the organic encapsulation layer includes a first region, a second region and a third region, an average thickness of the first region is less than an average thickness of the second region, and the average thickness of the second region is smaller than an average thickness of the third region.

For example, the display substrate provided by an embodiment of the present disclosure further includes: a color filter layer, located at a side of the encapsulation layer away from the driving substrate, the color filter layer includes a first color filter, a second color filter and a third color filter.

For example, in the display substrate provided by an embodiment of the present disclosure, the first color filter and the second color filter have a first overlapping region, the second color filter and the third color filter have a second overlapping region, the third color filter and the first color filter have a third overlapping region.

For example, in the display substrate provided by an embodiment of the present disclosure, an orthographic projection of the first overlapping region, an orthographic projection of the second overlapping region and an orthographic projection of the third overlapping region on the driving substrate are overlapped with an orthographic projection of the protrusion portion on the driving substrate respectively.

For example, in the display substrate provided by an embodiment of the present disclosure, an orthographic projection of the first overlapping region, an orthographic projection of the second overlapping region and an orthographic projection of the third overlapping region on the driving substrate are overlapped with an orthographic projection of an interval region between two adjacent anodes on the driving substrate respectively.

For example, in the display substrate provided by an embodiment of the present disclosure, a size of the first overlapping region in a second direction is larger than a size of the second overlapping region in the second direction, and the size of the second overlapping region in the second direction is larger than a size of the third overlapping region in the second direction.

For example, in the display substrate provided by an embodiment of the present disclosure, a size of the first overlapping region in the second direction is in a range from 400 nanometers to 600 nanometers, a size of the second overlapping region in the second direction is in a range from 250 nanometers to 350 nanometers, and a size of the third overlapping region in the second direction is in a range from 100 nanometers to 200 nanometers.

For example, in the display substrate provided by an embodiment of the present disclosure, an average size of the first color filter in the first direction is greater than an average size of the second color filter in the first direction, and is smaller than an average size of the third color filter in the first direction.

For example, in the display substrate provided by an embodiment of the present disclosure, the average size of the first color filter in the first direction is in a range from 2.3 microns to 2.6 microns, the average size of the second color filter in the first direction is in a range from 1.7 microns to 1.95 microns, and the average size of the third color filter in the first direction is in a range from 2.3 microns to 2.7 microns.

For example, in the display substrate provided by an embodiment of the present disclosure, a ratio of a difference between the average size of the first color filter in the first direction and the average size of the second color filter in the first direction to a difference between the average size of the first color filter in the first direction and the average size of the third color filter in the first direction is in a range from 2 to 3.

For example, in the display substrate provided by an embodiment of the present disclosure, the first color filter includes a first edge portion, a second edge portion, and an intermediate portion between the first edge portion and the second edge portion, and an average size of the intermediate portion in the first direction is smaller than an average size of the first edge portion in the first direction and an average size of the second edge portion in the first direction.

For example, in the display substrate provided by an embodiment of the present disclosure, the first color filter includes a first contact surface in contact with the second color filter, the second color filter includes a second contact surface in contact with the third color filter, and the third color filter includes a third contact surface in contact with the first color filter, a size of the first contact surface in the first direction perpendicular to the driving substrate is equal to a size of the second contact surface in the first direction, and is smaller than a size of the third contact surface in the first direction.

For example, in the display substrate provided by an embodiment of the present disclosure, a distance between the first color filter and a surface of the driving substrate away from the anode layer is greater than a distance between the third color filter and the surface of the driving substrate away from the anode layer, and is smaller than a distance between the second color filter and the surface of the driving substrate away from the anode layer.

For example, in the display substrate provided by an embodiment of the present disclosure, the first color filter is a red filter, the second color filter is a green filter, and the third color filter is a blue filter.

For example, in the display substrate provided by an embodiment of the present disclosure, a material of the color filter layer includes a desiccant.

For example, in the display substrate provided by an embodiment of the present disclosure, the color filter layer includes aluminum element.

For example, the display substrate provided by an embodiment of the present disclosure, further includes: a protective layer, located at a side of the color filter layer away from the driving substrate.

For example, in the display substrate provided by an embodiment of the present disclosure, the color filter layer further includes: a black matrix, located between any two of the first color filter, the second color filter and the third color filter adjacent to each other.

For example, the display substrate provided by an embodiment of the present disclosure further includes: a glass cover plate, located at a side of the color filter layer away from the driving substrate.

At least one embodiment of the present disclosure further provides a display device, which includes any one of the abovementioned display substrates.

At least one embodiment of the present disclosure further provides a display device, which includes any one of the abovementioned display substrates.

For example, the display device provided by an embodiment of the present disclosure further includes: an opposite substrate, arranged opposite to the display substrate; the opposite substrate includes a glass cover plate and a color filter layer on the glass cover plate, and the color filter layer includes a first color filter, a second color filter and a third color filter.

For example, in the display device provided by an embodiment of the present disclosure, the first color filter and the second color filter have a first overlapping region, the second color filter and the third color filter have a second overlapping region, the third color filter and the first color filter have a third overlapping region.

For example, in the display device provided by an embodiment of the present disclosure, an orthographic projection of the first overlapping region, an orthographic projection of the second overlapping region and an orthographic projection of the third overlapping region on the driving substrate are overlapped with an orthographic projection of the protrusion portion on the driving substrate respectively.

For example, in the display device provided by an embodiment of the present disclosure, an orthographic projection of the first overlapping region, an orthographic projection of the second overlapping region and an orthographic projection of the third overlapping region on the driving substrate are overlapped with an orthographic projection of an interval region between two adjacent anodes on the driving substrate respectively.

For example, in the display device provided by an embodiment of the present disclosure, a size of the first overlapping region in a second direction is larger than a size of the second overlapping region in the second direction, and the size of the second overlapping region in the second direction is larger than a size of the third overlapping region in the second direction.

For example, in the display device provided by an embodiment of the present disclosure, a size of the first overlapping region in the second direction is in a range from 400 nanometers to 600 nanometers, a size of the second overlapping region in the second direction is in a range from 250 nanometers to 350 nanometers, and a size of the third overlapping region in the second direction is in a range from 100 nanometers to 200 nanometers.

For example, in the display device provided by an embodiment of the present disclosure, an average size of the first color filter in the first direction is greater than an average size of the second color filter in the first direction, and is smaller than an average size of the third color filter in the first direction.

For example, in the display device provided by an embodiment of the present disclosure, the average size of the first color filter in the first direction is in a range from 2.3 microns to 2.6 microns, the average size of the second color filter in the first direction is in a range from 1.7 microns to 1.95 microns, and the average size of the third color filter in the first direction is in a range from 2.3 microns to 2.7 microns.

For example, in the display device provided by an embodiment of the present disclosure, a ratio of a difference between the average size of the first color filter in the first direction and the average size of the second color filter in the first direction to a difference between the average size of the first color filter in the first direction and the average size of the third color filter in the first direction is in a range from 2 to 3.

For example, in the display device provided by an embodiment of the present disclosure, the first color filter includes a first edge portion, a second edge portion, and an intermediate portion between the first edge portion and the second edge portion, and an average size of the intermediate portion in the first direction is smaller than an average size of the first edge portion in the first direction and an average size of the second edge portion in the first direction.

For example, in the display device provided by an embodiment of the present disclosure, the first color filter includes a first contact surface in contact with the second color filter, the second color filter includes a second contact surface in contact with the third color filter, and the third color filter includes a third contact surface in contact with the first color filter, a size of the first contact surface in the first direction perpendicular to the driving substrate is equal to a size of the second contact surface in the first direction, and is smaller than a size of the third contact surface in the first direction.

For example, in the display device provided by an embodiment of the present disclosure, a distance between the first color filter and a surface of the driving substrate away from the anode layer is greater than a distance between the third color filter and the surface of the driving substrate away from the anode layer, and is smaller than a distance between the second color filter and the surface of the driving substrate away from the anode layer.

For example, in the display device provided by an embodiment of the present disclosure, the first color filter is a red filter, the second color filter is a green filter, and the third color filter is a blue filter.

For example, in the display device provided by an embodiment of the present disclosure, a material of the color filter layer includes a desiccant.

For example, in the display device provided by an embodiment of the present disclosure, the color filter layer includes aluminum element.

For example, in the display device provided by an embodiment of the present disclosure, the color filter layer further includes: a black matrix, located between any two of the first color filter, the second color filter and the third color filter adjacent to each other.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1:
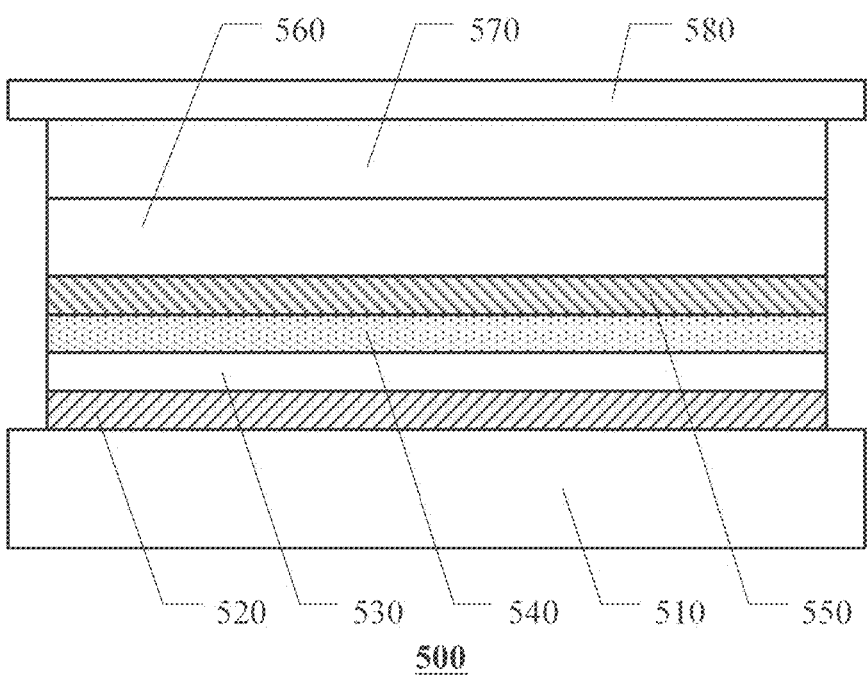
FIG. 1 is a planar schematic diagram of a display substrate provided by an embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect.

A typical large-size organic light emitting diode (OLED) display device reduces leakage and crosstalk by isolating anodes. However, in micro-organic light emitting diode (Micro-OLED) display devices, although the leakage and crosstalk can be reduced in the same way, a light emitting layer cannot be completely isolated by the same method due to a low thickness of a pixel definition layer and a high pixel density in the micro-organic light emitting diode display device, so that leakage and crosstalk still exist.

In this regard, embodiments of the present disclosure provide a display substrate and a display device. The display substrate includes a driving substrate, an anode layer, a pixel definition layer, a light emitting functional layer, a cathode layer and an encapsulation layer; the driving substrate includes a substrate and a driving circuit; the anode layer is located on the driving substrate; the pixel definition layer is located at a side of the anode layer away from the driving substrate; the light emitting functional layer is located at a side of the anode layer away from the driving substrate; the cathode layer is located at a side of the light emitting functional layer away from the driving substrate; the encapsulation layer is located at a side of the cathode layer away from the driving substrate; the driving circuit includes at least one transistor, the at least one transistor includes a semiconductor layer, the semiconductor layer is at least partially inside the substrate; the anode layer includes a plurality of anodes, the display substrate includes a plurality of pixel openings, and are located at a side of the plurality of anodes away from the driving substrate, the plurality of pixel openings are configured to be at least overlapped with the plurality of anodes; the light emitting functional layer includes a plurality of light emitting portions, the plurality of light emitting portions are arranged in contact with exposed parts of the plurality of anodes. Each of the plurality of anodes includes a main body portion and a protrusion portion, the protrusion portion is connected with the main body portion, a size of the protrusion portion in the first direction perpendicular to the driving substrate is larger than a size of the main body portion in the first direction perpendicular to the driving substrate. In this way, the display substrate can provide a miniature display substrate, a silicon-based circuit board can be used as a driving substrate to drive the light emitting functional layer to perform light emitting display, and crosstalk between adjacent sub-pixels can also be reduced or avoided.

Hereinafter, the display substrate and the display device provided by the embodiments of the present disclosure will be described in detail with reference to the accompanying drawings.

An embodiment of the present disclosure provides a display substrate. FIG. 1 is a planar schematic diagram of a display substrate provided by an embodiment of the present disclosure; and FIG. 2 is a partial structure schematic diagram of another display substrate provided by an embodiment of the present disclosure.

Figure 2:
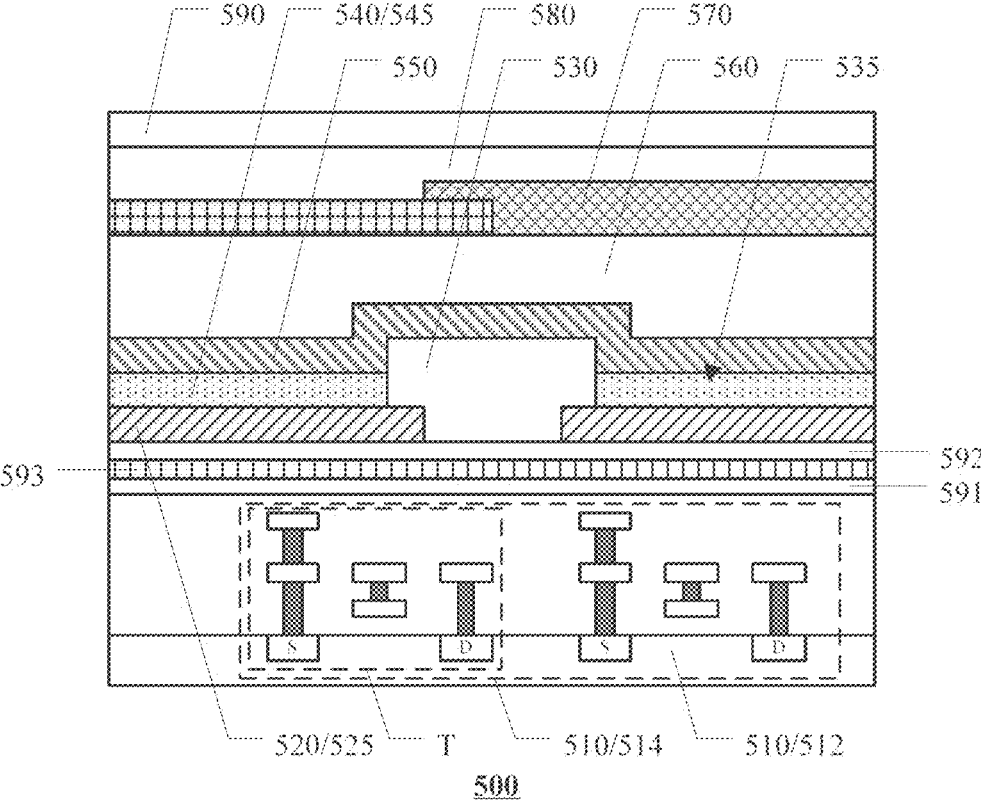
FIG. 2 is a partial structure schematic diagram of another display substrate provided by an embodiment of the present disclosure.

As illustrated in FIG. 1 and FIG. 2, the display substrate 500 includes a driving substrate 510, an anode layer 520, a pixel definition layer 530, a light emitting functional layer 540, a cathode layer 550 and an encapsulation layer 560; the driving substrate 510 includes a substrate 512 and a driving circuit 514; the anode layer 520 is located on the driving substrate 510; the pixel definition layer 530 is located at a side of the anode layer 520 away from the driving substrate 510; the light emitting functional layer 540 is located at a side of the anode layer 520 away from the driving substrate 510; the cathode layer 550 is located at a side of the light emitting functional layer 540 away from the driving substrate 510; the encapsulation layer 560 is located at a side of the cathode layer 550 away from the driving substrate 510; the driving circuit 514 includes at least one transistor T, the at least one transistor T includes a semiconductor layer 102, the semiconductor layer 102 is at least partially inside the substrate 512. That is, a part of the substrate 512 may function as a semiconductor layer. It should be noted that the entire structure of the driving circuit is not illustrated in FIG. 1 and FIG. 2, the driving circuit may include structures such as transistors, storage capacitors, current control resistors, and voltage divider resistors; specific circuit structure of the driving circuit can be set according to actual requirements, which is not limited by the embodiments of the present disclosure.

For example, the driving substrate 510 can be a silicon-based circuit board, since the semiconductor manufacturing process used in the silicon-based circuit board is mature, performance is stable, and size and precision are small, it is beneficial to manufacture a micro display device. Of course, the embodiments of the present disclosure include but are not limited to this, and other types of driving substrates may also be used as the driving substrate.

In some examples, as illustrated in FIG. 1 and FIG. 2, the anode layer 520 includes a plurality of anodes 525, the display substrate 500 includes a plurality of pixel openings 535, the plurality of pixel openings 535 are located in a film layer where the pixel definition layer 530 is located, and are surrounded by the pixel definition layer 530; the plurality of pixel openings 535 are located at a side of the plurality of anodes 525 away from the driving substrate 510, the plurality of pixel openings 535 are configured to be at least overlapped with the plurality of anodes 525; the light emitting functional layer 540 includes a plurality of light emitting portions 545, the plurality of light emitting portions 545 are at least partially located in the plurality of pixel openings 535, and are arranged in contact with exposed parts of the plurality of anodes 525. In this way, the plurality of anodes can drive the plurality of light emitting portions to perform light emitting display.

In the display substrate provided by the embodiment of the present disclosure, the driving substrate can be manufactured by a semiconductor manufacture process, so that a pixel driving circuit for driving each pixel to emit light and display can be integrated in the driving substrate. In this way, the display substrate can provide a miniature display substrate, and has the advantages of high resolution, high brightness, rich colors, low driving voltage, fast response speed and low power consumption.

In some examples, as illustrated in FIG. 1 and FIG. 2, the plurality of anodes 525 are arranged in a one-to-one correspondence with the plurality of pixel openings 535, the plurality of pixel openings 535 are arranged in a one-to-one correspondence with the plurality of light emitting portions 545. It should be noted that the above-mentioned "arranged in a one-to-one correspondence with" means that one pixel opening is arranged on one anode, and one light emitting part is arranged in one pixel opening, and an orthographic projection of the anode on the driving substrate is at least partially overlapped with an orthographic projection of the corresponding pixel opening on the driving substrate, and an orthographic projection of the pixel opening on the driving substrate is at least partially overlapped an orthographic projection of the light emitting part on the driving substrate. Of course, the embodiments of the present disclosure include but are not limited to this.

In some examples, as illustrated in FIG. 2, the display substrate 100 further includes: a first planarization layer 591, a second planarization layer 592 and a reflective electrode layer 593; the first planarization layer 591 is located between the driving circuit 514 and the anode layer 520; the reflective electrode layer 593 is located at a side of the first planarization layer 591 close to the anode layer 520; and the second planarization layer 592 is located at a side of the reflective electrode layer 593 close to the anode layer 520.

In some examples, as illustrated in FIG. 2, the reflective electrode layer 593 is continuously arranged in the pixel openings 535.

In some examples, as illustrated in FIG. 1 and FIG. 2, the display substrate further includes a color filter layer 570, which is located at a side of the encapsulation layer 560 away from the driving substrate 510. In a case that the light emitting functional layer is configured to emit white light, the color filter layer may include a plurality of color filters to realize color display. Of course, the embodiments of the present disclosure include but are not limited to this, the light emitting functional layer can also be configured to directly emit light of different colors.

In some examples, as illustrated in FIG. 1 and FIG. 2, the display substrate 500 further includes a protective layer 580 located at a side of the color filter layer 570 away from the driving substrate 510. The protective layer 580 can protect the color filter layer 570, so that filter performance of the color filter layer 570 remains stable during long-term use, thus the display quality of the display substrate can be improved.

In some examples, as illustrated in FIG. 1 and FIG. 2, the display substrate 500 further includes a glass cover plate 590, which is located at a side of the color filter layer 570 away from the driving substrate 510.

Figure 3:
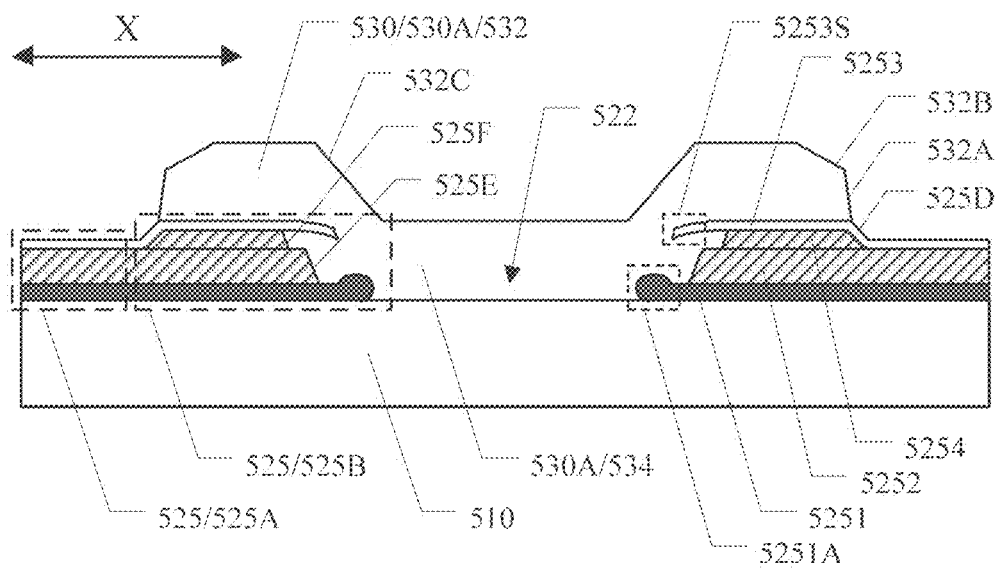
FIG. 3 is a partial structure schematic diagram of still another display substrate provided by an embodiment of the present disclosure.
Figure 4A:
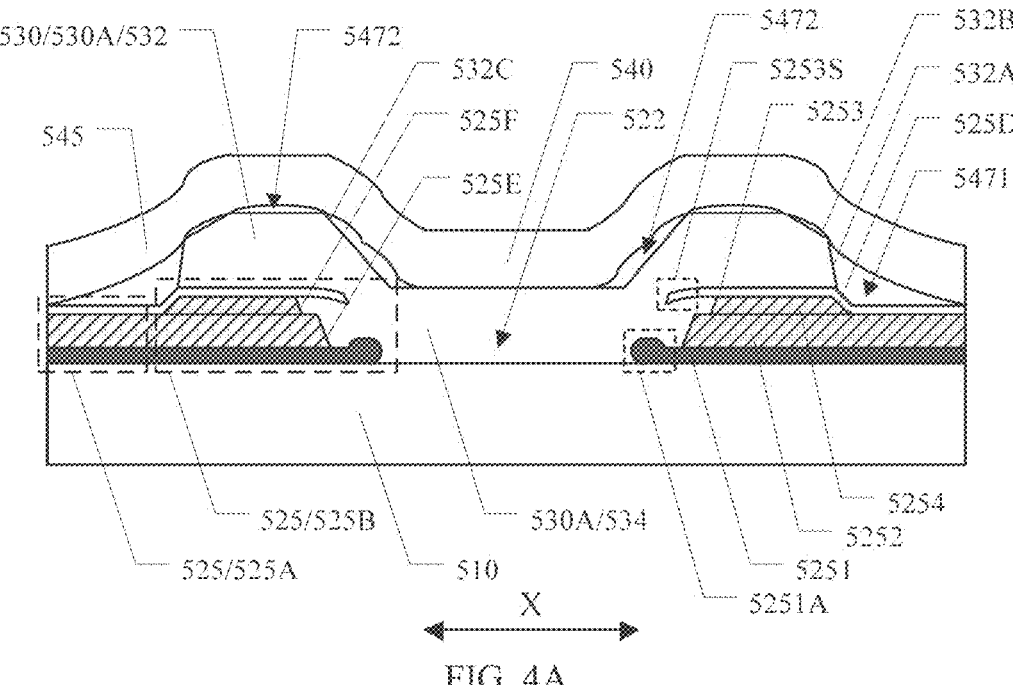
FIG. 4A is a partial structure schematic diagram of still another display substrate provided by an embodiment of the present disclosure.

FIG. 3 is a partial structure schematic diagram of still another display substrate provided by an embodiment of the present disclosure. FIG. 4A is a partial structure schematic diagram of still another display substrate provided by an embodiment of the present disclosure. As illustrated in FIG. 3 and FIG. 4A, the display substrate illustrated in FIG. 3 does not show the light emitting functional layer, the light emitting functional layer is shown in the display substrate illustrated in FIG. 4A.

As illustrated in FIGS. 3 and 4A, each of the anodes 525 includes a main body portion 525A and a protrusion portion 525B, the protrusion portion 525B is connected with the main body portion 525A, a size of the protrusion portion 525B in the first direction is larger than a size of the main body portion 525A in the first direction; that is, a thickness of the protrusion portion 525B is larger than a thickness of the main body portion 525A. A distance between a surface of the first planarization layer 591 at the position of the main body portion 525A away from the substrate 512 and the substrate 512 is equal to a distance between a surface of the first planarization layer 591 at the position of the protrusion portion 525B away from the substrate 512 and the substrate 512, a distance between a surface of the main body portion 525A away from the substrate 512 and a surface of the first planarization layer 591 away from the substrate 512 is smaller than a distance between a surface of the protrusion portion 525B away from the substrate 512 and a surface of the first planarization layer 591 away from the substrate 512. It should be noted that, the first direction may be a direction perpendicular to the driving substrate.

In the display substrate provided in the example, since the size of the protrusion portion 525B in the direction perpendicular to the driving substrate 510 is larger than the size of the main body portion 525A in the direction perpendicular to the driving substrate 510, the pixel definition layer 530 located between the two anodes 525 and overlapped with an edge portion of the anodes 525 may form a protruding structure 532 corresponding to the protrusion portion 525. In this way, in a case that the light emitting functional layer 540 is formed, at least part of the sub-functional layer (for example, the charge generation layer) in the light emitting functional layer 540 can be better disconnected at a position where the protruding structure 532 is located, that is, at least part of the sub-functional layer in the light emitting portions 545 corresponding to two adjacent anodes 525 are not connected, so that leakage and crosstalk between adjacent sub-pixels can be effectively avoided. On the other hand, a height of the protruding structure 532 of the pixel definition layer 530 is also higher at this time, so that a pixel definition function can be better performed, and the crosstalk between adjacent sub-pixels can be reduced and avoided optically.

In some examples, as illustrated in FIGS. 3 and 4A, each of the anodes 525 includes a main body portion 525A and a protrusion portion 525B, the protrusion portion 525B is arranged on periphery of the main body portion 525A, so that at least part of the functional layer in the light emitting functional layer 540 can be better disconnected at the edge of the main body portion 525A.

In some examples, as illustrated in FIGS. 3 and 4A, an orthographic projection of the pixel definition layer 530 on the driving substrate 510 is overlapped with an orthographic projection of the protrusion portion 525B on the driving substrate 510. In this way, the pixel definition layer 530 can form the protruding structure 532 corresponding to the protrusion portion 525 and located at a side of the protrusion portion 525 away from the driving substrate 510.

In some examples, as illustrated in FIGS. 3 and 4A, the pixel definition layer 530 includes a pixel definition portion 530A, the pixel definition portion 530A includes a pixel definition planarization portion 534 and two protruding structures 532 on two sides of the pixel definition planarization portion 534; the pixel definition planarization portion 534 is located between two adjacent anodes 525, the two protruding structures 532 are respectively located at a side of the two protrusion portions 525B of the two adjacent anodes 525 away from the driving substrate 510, the pixel definition planarization portion 534 connects the two protruding structures 532. That is, the pixel definition portion 530A includes a part located between two adjacent anodes 525 and parts overlapped with the two anodes 525; since a space between two adjacent anodes 525 is relatively flat, and an edge portion of the anode 525 is arranged with the above-mentioned protrusion portion 525B, thus the part located between the two adjacent anodes 525 is formed as the above-mentioned pixel definition planarization portion 534, the parts overlapped with the two anodes 525 are formed as the above-mentioned protruding structures 532.

In the display substrate provided in the example, in a case that the light emitting functional layer 540 is formed, due to the existence of the pixel definition portion 530A, at least part of the sub-functional layer (for example, the charge generation layer) in the light emitting functional layer 540 can be better disconnected at a position where the protruding structure 532 is located, that is, at least part of the sub-functional layers in the light emitting portions 545 corresponding to two adjacent anodes 525 are not connected, so that leakage and crosstalk between adjacent sub-pixels can be effectively avoided. On the other hand, the height of the protruding structure 532 at this time is also higher, so that the pixel definition function can be better performed, and the crosstalk between adjacent sub-pixels can be reduced and avoided optically.

In some examples, as illustrated in FIGS. 3 and 4A, the pixel definition portions 530A are symmetrically arranged with respect to a center of the interval region 522 between two adjacent anodes 525. It should be noted that due to existence of process errors, differences may be exited between two parts of the actual pixel definition portion on two sides of the center of the interval region, thus the above-mentioned case where the pixel definition portions are symmetrically arranged with respect to the center of the interval region between two adjacent anodes includes a case where the overlapping ratio of two parts of the pixel definition portion on two sides of the center of the spacer reaches 80%.

In some examples, as illustrated in FIGS. 3 and 4A, each of the protruding structures 532 includes a first side wall 532A and a second side wall 532B; the first side wall 532A is located at a side of the protruding structure 532 close to a center of the main body portion 525A of the anode 525, the second side wall 532B is connected with the first side wall 532A and is located at a side of the first side wall 532A away from the driving substrate 510, that is, the second side wall 532B is further away from the driving substrate 510 than the first side wall 532A; a slope angle of the first side wall 532A is greater than a slope angle of the second side wall 532B. It should be noted that, since the first side wall or the second side wall may not be a standard plane in the actual process, the above-mentioned slope angle may be a slope angle of a connecting line between the two end points of the first side wall or the second side wall.

In the display substrate provided in the example, in a process of forming the light emitting functional layer, since the slope angle of the first side wall is greater than that of the second side wall, the first side wall has a larger slope angle, thus the first side wall is steeper, so that at least part of a sub-functional layer (for example, the charge generation layer) in the light emitting functional layer can be better disconnected at a position where the first side wall is located. On the other hand, since the slope angle of the second side wall is smaller than the slope angle of the first side wall, a gentle platform can be formed, and the second side wall can guide the material of the light emitting functional layer, so that the light emitting functional layer forms a poor contact region at a position that a part of the anode exposed by the pixel opening adjacent to the protruding structure, thus light emitting luminance of the light emitting functional layer at the position that the part the anode exposed by the pixel opening adjacent to the protruding structure can be reduced. In this way, the display substrate provided in the example can further reduce crosstalk between adjacent sub-pixels.

In some examples, as illustrated in FIG. 4A, a first pore 5471 is existed between the light emitting functional layer 540 and the main body portion 525A, at least one second pore 5472 is existed between the light emitting functional layer 540 and the pixel definition layer 530, and a space occupied by the first pore 5471 is larger than a space occupied by the second pore 5472. In this way, the first pore 5471 and the second pore 5472 form a weak conduction region for transferring carriers laterally together, which is beneficial to reduce the lateral crosstalk of light. Of course, the embodiments of the present disclosure include but are not limited to this, the light emitting functional layer and the pixel definition layer may not form the above-mentioned second pore.

Figures 4B, 5:
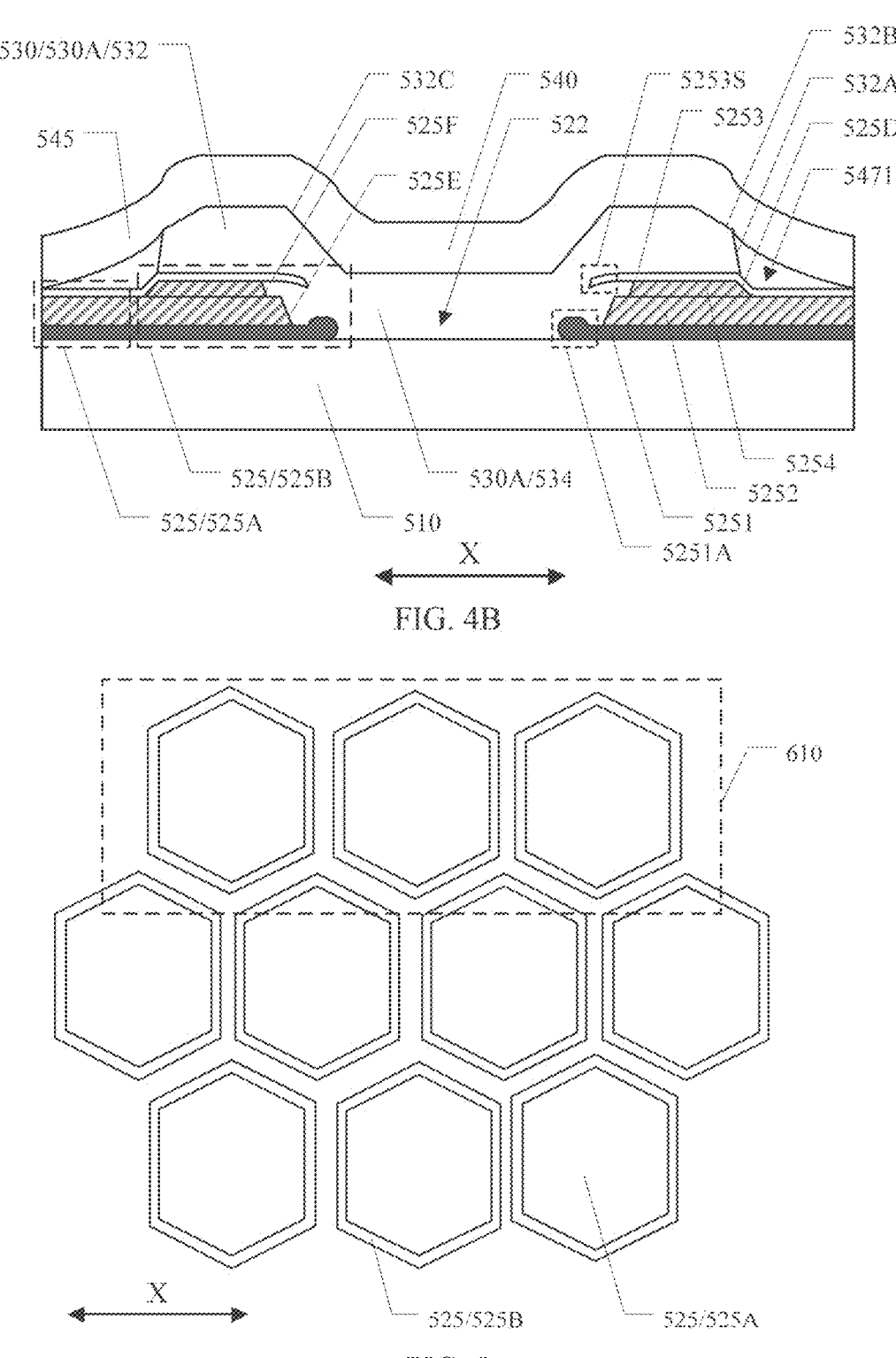
FIG. 4B is a partial structure schematic diagram of still another display substrate provided by an embodiment of the present disclosure.
FIG. 5 is a planar schematic diagram of a display substrate provided by an embodiment of the present disclosure.

FIG. 4B is a partial structure schematic diagram of still another display substrate provided by an embodiment of the present disclosure. As illustrated in FIG. 4B, the light emitting functional layer 540 and the pixel definition layer 530 are closely attached.

In some examples, as illustrated in FIGS. 3 and 4A, the protruding structure 532 further includes a third side wall 532C, which is located at a side of the protruding structure 532 away from the main body 525A, the slope angle of the third side wall 532C is greater than the slope angle of the second side wall 532B, and is smaller than the slope angle of the first side wall 532A. In this way, the slope angle of the third side wall is relatively gentle, so that formation of pore in the light emitting functional layer formed on the third side wall can be reduced or even avoided, and formation of channel for water and oxygen intrusion is avoided. On the other hand, since the slope angle of the third side wall is relatively gentle, it is also convenient for the pixel definition portion to form a complete integrated structure, and a peeling phenomenon on the third side wall is avoided.

In some examples, as illustrated in FIGS. 3 and 4A, each of the protruding structures 532 further includes a third side wall 532C, the third side wall 532C is located at a side of the protruding structure 532 away from the main body portion 525A. At this time, the slope angle of the first side wall 532A is $\alpha$, the slope angle of the second side wall 532B is $\beta$, the slope angle of the third side wall 532C is $\gamma$, and $\alpha$, $\beta$, and $\gamma$ satisfy the following formula:

$$\beta < \gamma < \alpha.$$

In the display substrate provided in the example, the slope angle $\gamma$ of the third side wall 532C is gentler than the slope angle $\alpha$ of the first side wall 532A, so that the formation of pores in the light emitting functional layer formed on the third side wall 532C can be reduced or even avoided, and the formation of channels for water and oxygen intrusion is avoided. On the other hand, since the slope angle $\gamma$ of the third side wall 532C is relatively gentle, it is also convenient for the pixel definition portion to form a complete integrated structure, and the peeling phenomenon on the third side wall is avoided. On the other hand, since the slope angle $\gamma$ of the third side wall 532C is larger than the slope angle $\beta$ of the second side wall 532B, so that the protruding structure can be prevented from occupying a large region, and the aperture ratio can be prevented from being affected.

In some examples, as illustrated in FIGS. 3 and 4A, a difference between the slope angle of the first side wall 532A and the slope angle of the second side wall 532B is equal to i times the slope angle of the third side wall, a value range of i is from 0.8 to 1.2. In this way, the protruding structure can better achieve the above-mentioned effects of preventing crosstalk between adjacent sub-pixels, preventing the formation of water and oxygen intrusion, and preventing the pixel definition portion from falling off.

In some examples, as illustrated in FIGS. 3 and 4A, the slope angle $\alpha$ of the first side wall, the slope angle $\beta$ of the second side wall, and the slope angle $\gamma$ of the third side wall satisfy the following formulas:

$$(\alpha - \beta) - i * \gamma,$$

wherein the value range of i is from 0.8 to 1.2.

In the display substrate provided in the example, since the slope angle $\alpha$ of the first side wall, the slope angle $\beta$ of the second side wall, and the slope angle $\gamma$ of the third side wall satisfy the magnitude relationship defined by the above formula, and the protruding structure can better achieve the above-mentioned effects of preventing crosstalk between adjacent sub-pixels, preventing the formation of water and oxygen intrusion, and preventing the pixel definition portion from falling off.

In some examples, as illustrated in FIGS. 3 and 4A, the difference between the slope angle of the first side wall 532A and the slope angle of the second side wall 532B is equal to j times a difference between the slope angle of the second side wall 532B and the slope angle of the third side wall 532C, the value range of j is from 1.5 to 3. In this way, the protruding structure can better achieve the above-mentioned effects of preventing crosstalk between adjacent sub-pixels, preventing the formation of water and oxygen intrusion, and preventing the pixel definition portion from falling off.

In some examples, as illustrated in FIGS. 3 and 4A, the slope angle $\alpha$ of the first side wall, the slope angle $\beta$ of the second side wall, and the slope angle $\gamma$ of the third side wall satisfy the following formulas:

$$(\alpha - \beta) = j * (\gamma - \beta),$$

wherein a value range of j is from 1.5 to 3.

In the display substrate provided in the example, since the slope angle $\alpha$ of the first side wall, the slope angle $\beta$ of the second side wall, and the slope angle $\gamma$ of the third side wall satisfy a magnitude relationship defined by the above formula, the protruding structure can better achieve the above-mentioned effects of preventing crosstalk between adjacent sub-pixels, preventing the formation of water and oxygen intrusion, and preventing the pixel definition portion from falling off.

In some examples, as illustrated in FIGS. 3 and 4A, a sum of the slope angle of the first side wall 532A and the slope angle of the second side wall 532B is equal to k times the slope angle of the third side wall 532C, and a value range of k is from 2 to 3. In this way, the protruding structure can better achieve the above-mentioned effects of preventing crosstalk between adjacent sub-pixels, preventing the formation of water and oxygen intrusion, and preventing the pixel definition portion from falling off.

In some examples, as illustrated in FIGS. 3 and 4A, the slope angle α of the first side wall, the slope angle β of the second side wall, and the slope angle γ of the third side wall satisfy the following formulas:

$$(\alpha + \beta) = k * \gamma - \beta,$$

wherein the value range of k is from 2 to 3.

In the display substrate provided in the example, since the slope angle α of the first side wall, the slope angle β of the second side wall, and the slope angle γ of the third side wall satisfy a magnitude relationship defined by the above formula, and the protruding structure can better achieve the above-mentioned effects of preventing crosstalk between adjacent sub-pixels, preventing the formation of water and oxygen intrusion, and preventing the pixel definition portion from falling off.

In some examples, as illustrated in FIGS. 3 and 4A, a value range of the slope angle of the first side wall 532A may be from 75 degrees to 89 degrees; a value range of the slope angle of the second side wall 532B may be from 15 degrees to 45 degrees; and a value range of the slope angle of the third side wall 532C may be from 45 degrees to 60 degrees.

In some examples, as illustrated in FIGS. 3 and 4A, the value range of the slope angle of the first side wall 532A may be from 75 degrees to 89 degrees; the value range of the slope angle of the second side wall 532B may be from 25 degrees to 35 degrees; and the value range of the slope angle of the third side wall 532C may be from 45 degrees to 55 degrees.

In some examples, as illustrated in FIGS. 3 and 4A, a size of an orthographic projection of the second side wall 532B on the driving substrate 510 in the second direction is larger than a size of an orthographic projection of the first side wall 532A on the driving substrate 510 in the second direction. In this way, the protruding structure can better disconnect the charge generating layer in the light emitting functional layer at the position where the first side wall is located.

In some examples, as illustrated in FIGS. 3 and 4A, a size of an orthographic projection of the third side wall 532C on the driving substrate 510 in the second direction is larger than the size of the orthographic projection of the second side wall 532B on the driving substrate 510 in the second direction. In this way, the protruding structure can reduce or even avoid subsequent formation of pore in the light emitting functional layer formed on the third side wall 532C, and the formation of channel for water and oxygen intrusion is avoided. On the other hand, since the slope angle γ of the third side wall 532C is relatively gentle, it is also convenient for the pixel definition portion to form a complete integrated structure, and the peeling phenomenon on the third side wall is avoided.

In some examples, as illustrated in FIGS. 3 and 4A, the size of the first side wall 532A in the first direction is H1, the size of the second side wall 532B in the first direction is H2, the size of the third side wall 532C in the first direction is H3, H1, H2 and H3 satisfy the following formulas:

$$H3 * \cos \gamma > H2 * \cos \beta > H1 * \cos \alpha.$$

In this way, the protruding structure can better disconnect the charge generation layer in the light emitting functional layer at the position where the first side wall is located; at the same time, the protruding structure can reduce or even avoid the formation of pore in the light emitting functional layer formed on the third side wall subsequently, and the formation of channel for water and oxygen intrusion is avoided.

In some examples, as illustrated in FIGS. 3 and 4A, the protrusion portion 525B of each of the anodes 525 further includes a fourth side wall 525D, which is located at a side of the protrusion portion 525B close to the center of the main body portion 525A, and a slope angle of the fourth side wall 525D is greater than the slope angle of the second side wall 532B, and is smaller than the slope angle of the first side wall 532A.

In some examples, as illustrated in FIGS. 3 and 4A, the protrusion portion 525B of the anode 525 includes a fourth side wall 525D, which is located at a side of the protrusion portion 525B close to the center of the main body portion 525A, a slope angle of the fourth side wall is δ, and α, β, and δ satisfy the following formula:

$$\beta < \delta < \alpha.$$

In some examples, as illustrated in FIGS. 3 and 4A, the protrusion portion 525B of each of the anodes 525 includes: a first sub-anode layer 5251, a second sub-anode layer 5252 and a third sub-anode layer 5253; the first sub-anode layer 5251 is located at a side of the driving circuit 514 away from the substrate 512; the second sub-anode layer 5252 is located at a side of the first sub-anode layer 5251 away from the driving substrate 510; and the third sub-anode layer 5253 is located at a side of the second sub-anode layer 5252 away from the driving substrate 510.

In some examples, as illustrated in FIGS. 3 and 4A, a size of the first sub-anode layer 5251 in the second direction is larger than a size of the third sub-anode layer 5253 in the second direction, and the size of the third sub-anode layer 5253 in the second direction is larger than a size of the second sub-anode layer 5252 in the second direction. In this way, since the size of the third sub-anode layer in the second direction is larger than the size of the second sub-anode layer in the second direction, an edge of the third sub-anode layer lacks support, thus the third sub-anode layer 5253 can be formed into a curved structure 5253S bent toward the driving substrate 510, which can effectively prevent the peeling phenomenon of the pixel definition portion in a case that the pixel definition portion is subsequently formed. It should be noted that, since the pixel definition portion is usually made of inorganic materials, if the edge of the protrusion portion is too steep, the phenomenon of falling off is easy to occur.

On the other hand, the third sub-anode layer can be made of materials with poor electrical conductivity, such as indium tin oxide; at this time, since the size of the third sub-anode layer in the second direction is larger than the size of the second sub-anode layer in the second direction, an edge of the third sub-anode layer lacks support, thus the third sub-anode layer can be formed into a curved structure bent toward the driving substrate, so that, the edge of the protrusion portion can be wrapped to a certain extent, and in a case that a defect occurs in the pixel definition portion, the edge of the protrusion portion can be prevented from contacting the light emitting functional layer, and the phenomenon such as tip discharge can be avoided.

For example, the above-mentioned second direction is a direction from the protrusion portion 525B to the main body portion 525A, or the direction from the main body portion 525A to the protrusion portion 525B, and the second direction is parallel to a direction in which the driving substrate 510 is away from a surface of the anode layer 520.

For example, conductivity of the third sub-anode layer is smaller than conductivity of the first sub-anode layer and conductivity of the second sub-anode layer, so that it is better matched with a work function of the light emitting functional layer. In some examples, as illustrated in FIGS. 3 and 4A, a size of a part of the third sub-anode layer 5253 going beyond the second sub-anode layer 5252 in the second direction is smaller than a size in the second direction of an overlapping region of the orthographic projection of the pixel definition layer 530 on the driving substrate 510 and the orthographic projection of the protrusion portion 525B on the driving substrate 510.

In some examples, as illustrated in FIGS. 3 and 4A, the size of the part of the third sub-anode layer 5253 going beyond the second sub-anode layer 5252 in the second direction is smaller than ¼ of the size in the second direction of the overlapping region of the orthographic projection of the pixel definition layer 530 on the driving substrate 510 and the orthographic projection of the protrusion portion 525B on the driving substrate 510.

In some examples, as illustrated in FIGS. 3 and 4A, one end of the third sub-anode layer 5253 away from the main body portion 525A is bent in a direction close to the first sub-anode layer 5251, so that the third sub-anode layer can wrap the edge of the protrusion portion to a certain extent, and in a case that a defect occurs in the pixel definition portion, the edge of the protrusion portion can be prevented from contacting the light emitting functional layer, and the phenomenon such as tip discharge can also be avoided.

In some examples, as illustrated in FIGS. 3 and 4A, the protrusion portion 525B of each of the anodes 525 further includes a fourth sub-anode layer 5254, which is located between the second sub-anode layer 5252 and the third sub-anode layer 5253. In this way, the fourth sub-anode layer located in the main body portion of the anode may be etched away by leaving the fourth sub-anode layer located in the protrusion portion of the anode, so that the above-mentioned main body portion and protrusion portion with different heights can be formed.

In some examples, as illustrated in FIGS. 3 and 4A, a size of the fourth sub-anode layer 5254 in the second direction is smaller than the size of the second sub-anode layer 5252 in the second direction. In this way, the third sub-anode layer 5253 formed on the fourth sub-anode layer 5254 can better form the curved structure 5253S, so that in a case that the pixel definition portion is subsequently formed, the peeling phenomenon of the pixel definition portion can be effectively avoided.

In some examples, as illustrated in FIGS. 3 and 4A, a size of a part of the third sub-anode layer 5253 going beyond the fourth sub-anode layer 5254 in the second direction is smaller than the size in the second direction of the overlapping region of the orthographic projection of the pixel definition layer 530 on the driving substrate 510 and orthographic projection of the protrusion portion 525B on the driving substrate 510.

In some examples, as illustrated in FIGS. 3 and 4A, the second sub-anode layer 5252 includes a fifth side wall 525E, which is located at a side of the second sub-anode layer 525E away from the main body portion 525A, the fourth sub-anode layer 5254 includes a sixth side wall 525F, which is located at a side of the fourth sub-anode layer 5254 away from the main body portion 525A; a slope angle of the fifth side wall 525E is greater than the slope angle of the fourth side wall 525D, a slope angle of the sixth side wall 525F is greater than the slope angle of the fourth side wall 525D, the slope angle of the fifth side wall 525E is greater than the slope angle of the sixth side wall 525F, so that the second sub-anode layer and the third sub-anode layer are prevented from forming a tip structure. In this way, the tip discharge phenomenon can be suppressed to a certain extent, so that yield and service life of the product can be improved.

In some examples, as illustrated in FIGS. 3 and 4A, one end of the first sub-anode layer 5251 away from the main body portion 525A includes a bulge portion 5251A, a thickness of the bulge portion 5251A in the direction perpendicular to the driving substrate 510 is greater than an average thickness of the first sub-anode layer 5251 in the direction perpendicular to the driving substrate 510. In this way, the bulge portion 5251A can also wrap the edge of the protrusion portion to a certain extent, and when a defect occurs in the pixel definition portion, the edge of the protrusion portion can be prevented from contacting the light emitting functional layer, and the phenomenon such as tip discharge can also be avoided.

In some examples, as illustrated in FIGS. 3 and 4A, in a case that the bulge portion 5251A of the first sub-anode layer 5251 and the curved structure 5253S of the third sub-anode layer 5253 coexist, the bulge portion 5251A and the curved structure 5253S can wrap the edge of the protrusion portion from the upper and lower directions, and it can better prevent the edge of the protrusion portion from contacting the light emitting functional layer in a case that a defect occurs in the pixel definition portion, and the phenomenon such as tip discharge can also be avoided. It should be noted that the embodiments of the present disclosure include but are not limited to this, in a case that the bulge portion 5251A of the first sub-anode layer 5251 or the curved structure 5253S of the third sub-anode layer 5253 exists alone, the edge of the protrusion portion can also be wrapped to a certain extent.

In some examples, a ratio of a thickness of the first sub-anode layer 5251 in the direction perpendicular to the driving substrate 510 to a thickness of the second sub-anode layer 5252 in the direction perpendicular to the driving substrate 510 ranges from ¹⁄₁₅ to ⅕.

In some examples, the ratio of the thickness of the first sub-anode layer 5251 in the direction perpendicular to the driving substrate 510 to a thickness of the third sub-anode layer 5253 in the direction perpendicular to the driving substrate 510 ranges from ⅓ to ⅘.

In some examples, the ratio of the thickness of the first sub-anode layer 5251 in the direction perpendicular to the driving substrate 510 to a thickness of the fourth sub-anode layer 5254 in the direction perpendicular to the driving substrate 510 ranges from ¹⁄₂₄ to ⅛.

In some examples, the thickness of the first sub-anode layer 5251 in the direction perpendicular to the driving substrate 510 is in the range from 1 nanometers to 4 nanometers; the thickness of the second sub-anode layer 5252 in the direction perpendicular to the driving substrate 510 is in the range from 15 nanometers to 22 nanometers; the thickness of the fourth sub-anode layer 5254 in the direction perpendicular to the driving substrate 510 is in the range from 24 nanometers to 32 nanometers; and the thickness of the third sub-anode layer 5253 in the direction perpendicular to the driving substrate 510 is in the range from 3 nanometers to 5 nanometers.

In some examples, the thickness of the first sub-anode layer 5251 in a direction perpendicular to the driving substrate 510 is in the range from 2 nanometers to 3 nanometers;

the thickness of the second sub-anode layer 5252 in the direction perpendicular to the driving substrate 510 is in the range from 17 nanometers to 20 nanometers; the thickness of the fourth sub-anode layer 5254 in the direction perpendicular to the driving substrate 510 is in the range from 26 nanometers to 30 nanometers; and the thickness of the third sub-anode layer 5253 in the direction perpendicular to the driving substrate 510 is in 4 nanometers.

In some examples, a ratio of a distance between two adjacent anodes 525 to a length of the orthographic projection of the protrusion portion 525B of the anodes 525 on the driving substrate 510 ranges from 2 to 4. That is, the ratio of the distance between two adjacent anodes 525 to the length of the anodes 525 in the second direction ranges from 2 to 4. In this way, the display substrate can better avoid crosstalk between adjacent sub-pixels.

In some examples, the ratio of the distance between two adjacent anodes 525 to the length of the orthographic projection of the protrusion portion 525B of the anodes 525 on the driving substrate 510 ranges from 2.5 to 3.5. That is, the ratio of the distance between two adjacent anodes 525 to the length of the anodes 525 in the second direction ranges from 2.5 to 3.5. In this way, the display substrate can better avoid crosstalk between adjacent sub-pixels.

In some examples, the distance between two adjacent anodes 525 is in the range from 0.6 microns to 1 micron. That is, the width of the interval region 522 may be in the range from 0.6 microns to 1 micron. Of course, the embodiments of the present disclosure include but are not limited to this, and a width range of the interval region can be set according to actual conditions.

In some examples, the distance between adjacent two anodes 525 is in the range from 0.7 microns to 0.9 microns. Of course, the embodiments of the present disclosure include but are not limited to this, and the width range of the interval region can be set according to actual conditions.

FIG. 5 is a planar schematic diagram of a display substrate provided by an embodiment of the present disclosure. As illustrated in FIG. 5, the protrusion portion 525B is arranged around the main body portion 525A. In this way, the display substrate can effectively avoid crosstalk between adjacent sub-pixels in any direction, so that the display substrate can be adapted to different pixel arrangement structures.

In some examples, as illustrated in FIG. 5, a shape of the orthographic projection of each of the anodes 525 on the driving substrate 510 includes a hexagon. Of course, the embodiments of the present disclosure include but are not limited to this, the shape of the orthographic projection of the anode 525 on the driving substrate 510 may also be other suitable shapes. It should be noted that the pixel opening is arranged corresponding to the anode, thus the shape of the orthographic projection of the pixel opening on the driving substrate is similar to the shape of the orthographic projection of the anode on the driving substrate.

In some examples, as illustrated in FIG. 5, a plurality of anodes 525 are arranged in an array on the driving substrate 510 to form anode rows 610; in each of the anode rows 610, a plurality of anodes 525 are sequentially arranged in the direction.

In some examples, as illustrated in FIG. 5, the above-mentioned second direction can be a row direction. At this time, the ratio of the size of the orthographic projection of each of the anodes 525 on the driving substrate 510 in the second direction to the distance between two adjacent anodes 525 ranges from 4 to 6. In this way, the display substrate can achieve a larger opening ratio, and effectively avoid crosstalk between adjacent sub-pixels.

In some examples, as illustrated in FIG. 5, the size of the orthographic projection of each of the anodes 525 on the driving substrate 510 in the second direction may be from 4 microns to 5 microns.

Figures 6, 7:
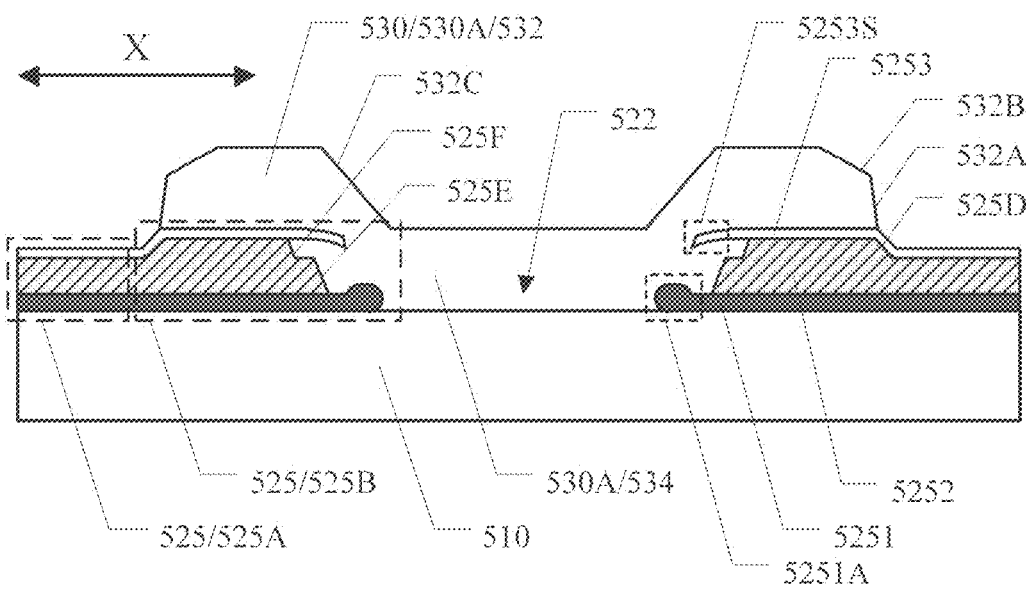
FIG. 6 is a partial structure schematic diagram of still another display substrate provided by an embodiment of the present disclosure.
FIG. 7 is a partial structure schematic diagram of still another display substrate provided by an embodiment of the present disclosure.

FIG. 6 is a partial structure schematic diagram of still another display substrate provided by an embodiment of the present disclosure. As illustrated in FIG. 6, the protrusion portion 525B of each of the anodes 525 includes a first sub-anode layer 5251, a second sub-anode layer 5252 and a third sub-anode layer 5253; the first sub-anode layer 5251 is located at a side of the driving circuit 514 away from the substrate 512; the second sub-anode layer 5252 is located at a side of the first sub-anode layer 5251 away from the driving substrate 510; and the third sub-anode layer 5253 is located at a side of the second sub-anode layer 5252 away from the driving substrate 510. Different from the display substrates illustrated in FIGS. 3 and 4A, the display substrate illustrated in FIG. 6 does not include a fourth sub-anode layer.

In some examples, as illustrated in FIG. 6, the main body portion 525A and the protrusion portion 525B of the anode 525 may have a same layer structure, that is, the main body portion 525A and the protrusion portion 525B include a same number of multiple film layers and a same lamination relationship, but the thickness of each of the film layers is not limited to be the same. At this time, the second sub-anode layer of the protrusion portion of the anode is retained by partially etching the second sub-anode layer located on the main body portion of the anode, so that the main body portion and the protrusion portion having the height difference are formed.

In some examples, as illustrated in FIG. 6, a size of the first sub-anode layer 5251 in the second direction is larger than a size of the third sub-anode layer 5253 in the second direction, the size of the third sub-anode layer 5253 in the second direction is larger than a size of the second sub-anode layer 5252 in the second direction; the above-mentioned second direction is the direction from the protrusion portion 525B to the main body portion 525A or the direction from the main body portion 525A to the protrusion portion 525B, the second direction is parallel to the direction in which the driving substrate 510 is away from the surface of the anode layer 520. In this way, since the size of the third sub-anode layer in the second direction is larger than the size of the second sub-anode layer in the second direction, an edge of the third sub-anode layer lacks support, thus the third sub-anode layer 5253 can be formed into a curved structure 5253S that is curved toward the driving substrate 510, in the subsequent formation of the pixel definition portion, the peeling phenomenon of the pixel definition portion can be effectively avoided. It should be noted that, since the pixel definition portion is usually made of inorganic materials, if the edge of the protrusion portion is too steep, the phenomenon of falling off is easy to occur.

On the other hand, the third sub-anode layer can be made of materials with poor electrical conductivity, such as indium tin oxide; at this time, since the size of the third sub-anode layer in the second direction is larger than the size of the second sub-anode layer in the second direction, the edge of the third sub-anode layer lacks support, thus the third sub-anode layer can be formed into a curved structure bent toward the driving substrate, so that the edge of the protrusion portion can be wrapped to a certain extent, and in a case that a defect occurs in the pixel definition portion, the edge of the protrusion portion can be prevented from contacting the light emitting functional layer, and the phenomenon such as tip discharge can also be avoided.

For example, conductivity of the third sub-anode layer is smaller than conductivity of the first sub-anode layer and conductivity of the second sub-anode layer.

In some examples, as illustrated in FIG. 6, one end of the third sub-anode layer 5253 away from the main body portion 525A is bent in a direction close to the first sub-anode layer 5251, so that the third sub-anode layer can wrap the edge of the protrusion portion to a certain extent, and in a case that a defect occurs in the pixel definition portion, the edge of the protrusion portion can be prevented from contacting the light emitting functional layer, and the phenomenon such as tip discharge can also be avoided.

In some examples, as illustrated in FIG. 6, the second sub-anode layer 5252 includes a fifth side wall 525E and a sixth side wall 525F, the sixth side wall 525F is located at a side of the fifth side wall 525E away from the driving substrate 510, that is, the sixth side wall 525F is further away from the driving substrate 510 than the fifth side wall 525E. A slope angle of the fifth side wall 525E is greater than a slope angle of the fourth side wall 525D, a slope angle of the sixth side wall 525F is greater than the slope angle of the fourth side wall 525D, the slope angle of the fifth side wall 525E is greater than the slope angle of the sixth side wall 525F, so that the second sub-anode layer is prevented from forming a tip structure. In this way, the phenomenon of tip discharge can be suppressed to a certain extent, so that the yield and service life of the product can be improved. In addition, the third sub-anode layer on the second sub-anode layer can form a smoother curved structure by forming a stepped structure including the fifth side wall and the sixth side wall on the edge of the second sub-anode layer 5252, so that the phenomenon of falling off of the pixel definition portion can be better prevented.

In some examples, as illustrated in FIG. 6, one end of the first sub-anode layer 5251 away from the main body portion 525A includes a bulge portion 5251A, a thickness of the bulge portion 5251A in the direction perpendicular to the driving substrate 510 is greater than an average thickness of the first sub-anode layer 5251 in the direction perpendicular to the driving substrate 510. In this way, the bulge portion 5251A can also wrap the edge of the protrusion portion to a certain extent, and in a case that a defect occurs in the pixel definition portion, the edge of the protrusion portion can be prevented from contacting the light emitting functional layer, and the phenomenon such as tip discharge can also be avoided.

In some examples, as illustrated in FIG. 6, in a case that the bulge portion 5251A of the first sub-anode layer 5251 and the curved structure 5253S of the third sub-anode layer 5253 coexist, the bulge portion 5251A and the curved structure 5253S can wrap the edges of the protrusion portion from the upper and lower directions, and it is better to prevent the edge of the protrusion portion from contacting the light emitting functional layer when a defect occurs in the pixel definition portion, and the phenomenon such as tip discharge can also be avoided. It should be noted that the embodiments of the present disclosure include but are not limited to this, in a case that the bulge portion 5251A of the first sub-anode layer 5251 or the curved structure 5253S of the third sub-anode layer 5253 exists alone, the edge of the protrusion portion can be wrapped to a certain extent.

FIG. 7 is a partial structure schematic diagram of still another display substrate provided by an embodiment of the present disclosure. As illustrated in FIG. 7, the protrusion portion 525B of each of the anodes 525 includes a first sub-anode layer 5251, a second sub-anode layer 5252, a third sub-anode layer 5253 and a fourth sub-anode layer

5254; the first sub-anode layer 5251 is located at a side of the driving circuit 514 away from the substrate 512; the second sub-anode layer 5252 is located at a side of the first sub-anode layer 5251 away from the driving substrate 510; the third sub-anode layer 5253 is located at a side of the second sub-anode layer 5252 away from the driving substrate 510; and the fourth sub-anode layer 5254 is located between the second sub-anode layer 5252 and the third sub-anode layer 5253.

In some examples, as illustrated in FIG. 7, the main body portion 525A and the protrusion portion 525B of the anode 525 may have a same layer structure, that is, the main body portion 525A and the protrusion portion 525B include a same number of multiple film layers and a same lamination relationship, but a thickness of each of the film layers is not limited to be the same. At this time, the main body portion 525A of the anode 525 further includes a first sub-anode layer 5251, a second sub-anode layer 5252, a third sub-anode layer 5253 and a fourth sub-anode layer 5254; the first sub-anode layer 5251 is located at a side of the driving circuit 514 away from the substrate 512; the second sub-anode layer 5252 is located at a side of the first sub-anode layer 5251 away from the driving substrate 510; the third sub-anode layer 5253 is located at a side of the second sub-anode layer 5252 away from the driving substrate 510; and the fourth sub-anode layer 5254 is located between the second sub-anode layer 5252 and the third sub-anode layer 5253. At this time, the second sub-anode layer of the convex part of the anode is retained by partially etching the second sub-anode layer located on the main body portion of the anode, so that the main body portion and the protrusion portion having the height difference are formed.

For example, as illustrated in FIG. 7, a thickness of the first sub-anode layer 5251 located in the main body portion 525A of the anode 525 in the direction perpendicular to the driving substrate 510 is the same as a thickness of the first sub-anode layer 5251 located at the protrusion portion 525B of the anode 525 in the direction perpendicular to the driving substrate 510.

For example, as illustrated in FIG. 7, a thickness of the third sub-anode layer 5253 located in the main body portion 525A of the anode 525 in the direction perpendicular to the driving substrate 510 is the same as the thickness of the third sub-anode layer 5253 located at the protrusion portion 525B of the anode 525 in the direction perpendicular to the driving substrate 510.

For example, as illustrated in FIG. 7, a thickness of the fourth sub-anode layer 5254 located in the main body portion 525A of the anode 525 in the direction perpendicular to the driving substrate 510 is the same as the thickness of the fourth sub-anode layer 5254 located at the protrusion portion 525B of the anode 525 in the direction perpendicular to the driving substrate 510.

In some examples, as illustrated in FIG. 7, a size of the first sub-anode layer 5251 in the second direction is larger than a size of the third sub-anode layer 5253 in the second direction, the size of the third sub-anode layer 5253 in the second direction is larger than a size of the second sub-anode layer 5252 in the second direction; and a size of the fourth sub-anode layer 5254 in the second direction is smaller than the size of the second sub-anode layer 5252 in the second direction. The above-mentioned second direction is the direction from the protrusion portion 525B to the main body portion 525A or the direction from the main body portion 525A to the protrusion portion 525B, and the second direction is parallel to the direction in which the driving substrate 510 is away from the surface of the anode layer 520. In this way, the third sub-anode layer 5253 formed on the fourth sub-anode layer 5254 can better form the curved structure 5253S, so that in a case that the pixel definition portion is subsequently formed, the peeling phenomenon of the pixel definition portion can be effectively avoided.

On the other hand, the third sub-anode layer can be made of materials with poor electrical conductivity, such as indium tin oxide; at this time, since the size of the third sub-anode layer in the second direction is larger than the size of the second sub-anode layer in the second direction, the edge of the third sub-anode layer lacks support, thus the third sub-anode layer can be formed into a curved structure bent toward the driving substrate, so that the edge of the protrusion portion can be wrapped to a certain extent, and in a case that a defect occurs in the pixel definition portion, the edge of the protrusion portion can be prevented from contacting the light emitting functional layer, and the phenomenon such as tip discharge can also be avoided.

For example, the conductivity of the third sub-anode layer is smaller than the conductivity of the first sub-anode layer and the conductivity of the second sub-anode layer.

In some examples, as illustrated in FIG. 7, the end of the third sub-anode layer 5253 far away from the main body portion 525A is bent towards the direction close to the first sub-anode layer 5251, so that the edge of the protrusion portion can be wrapped by the third sub-anode layer to a certain extent, and in a case that a defect occurs in the pixel definition portion, the edge of the protrusion portion can be prevented from contacting the light emitting functional layer, and the phenomenon such as tip discharge can also be avoided.

In some examples, as illustrated in FIG. 7, the second sub-anode layer 5252 includes a fifth side wall 525E, which is located at a side of the second sub-anode layer 525E away from the main body portion 525A, the fourth sub-anode layer 5254 includes a sixth side wall 525F, which is located at a side of the fourth sub-anode layer 5254 away from the main body portion 525A; a slope angle of the fifth side wall 525E is greater than a slope angle of the fourth side wall 525D, a slope angle of the sixth side wall 525F is greater than the slope angle of the fourth side wall 525D, the slope angle of the fifth side wall 525E is greater than the slope angle of the sixth side wall 525F, so that the second sub-anode layer and the third sub-anode layer are prevented from forming a tip structure. In this way, the phenomenon of tip discharge can be suppressed to a certain extent, so that the yield and service life of the product can be improved.

In some examples, as illustrated in FIG. 7, one end of the first sub-anode layer 5251 away from the main body portion 525A includes a bulge portion 5251A, a thickness of the bulge portion 5251A in the direction perpendicular to the driving substrate 510 is greater than an average thickness of the first sub-anode layer 5251 in the direction perpendicular to the driving substrate 510. In this way, the bulge portion 5251A can also wrap the edge of the protrusion portion to a certain extent, and in a case that a defect occurs in the pixel definition portion, the edge of the protrusion portion can be prevented from contacting the light emitting functional layer, and the phenomenon such as tip discharge can also be avoided.

In some examples, as illustrated in FIG. 7, in a case that the bulge portion 5251A of the first sub-anode layer 5251 and the curved structure 5253S of the third sub-anode layer 5253 coexist, the bulge portion 5251A and the curved structure 5253S can wrap the edges of the protrusion portion from the upper and lower directions, and it can better prevent the edge of the protrusion portion from contacting the light emitting functional layer in a case that a defect occurs in the pixel definition portion, and the phenomenon such as tip discharge can also be avoided. It should be noted that the embodiments of the present disclosure include but are not limited to this, in a case that the bulge portion 5251A of the first sub-anode layer 5251 or the curved structure 5253S of the third sub-anode layer 5253 exists alone, the edge of the protrusion portion can also be wrapped to a certain extent.

Figure 8:
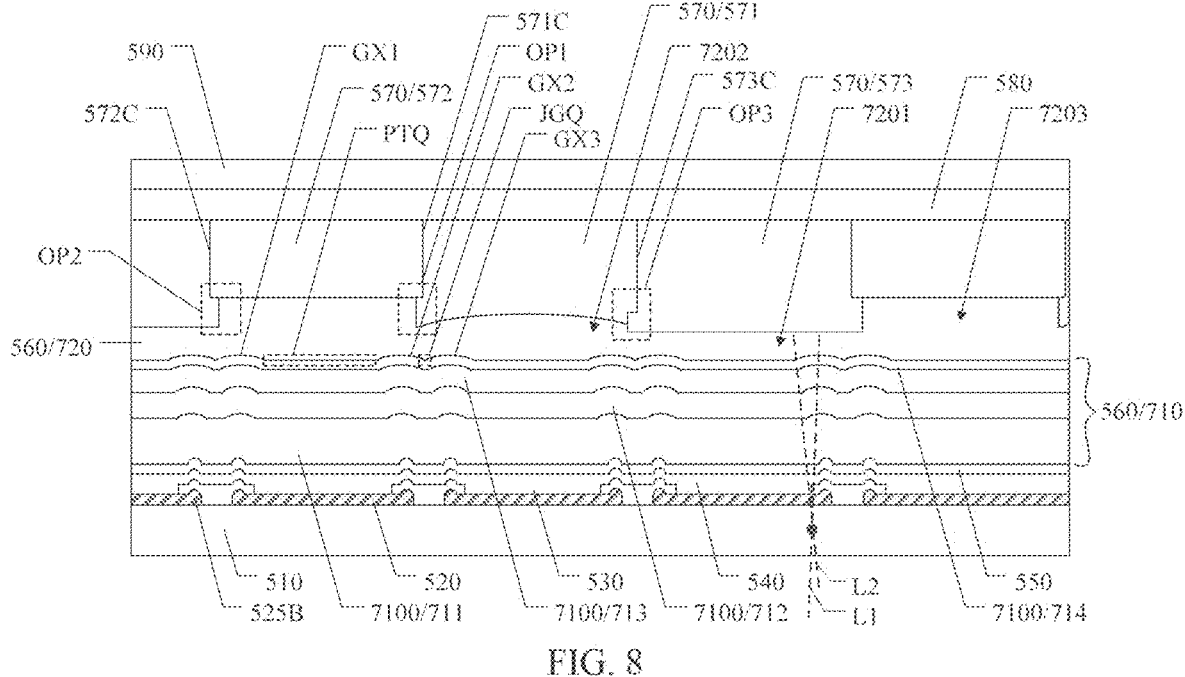
FIG. 8 is a partial structure schematic diagram of still another display substrate provided by an embodiment of the present disclosure.

FIG. 8 is a partial structure schematic diagram of still another display substrate provided by an embodiment of the present disclosure. As illustrated in FIG. 8, the encapsulation layer 560 includes an inorganic encapsulation layer 710; and the inorganic encapsulation layer 710 is located at a side of the cathode layer 550 away from the driving substrate 510.

In some examples, as illustrated in FIG. 8, the inorganic encapsulation layer 710 includes a plurality of sub-inorganic encapsulation layers 7100, in the plurality of sub-inorganic encapsulation layers 7100, at least two adjacent sub-inorganic encapsulation layers 7100 are made of different materials, in the plurality of sub-inorganic encapsulation layers 7100, at least two adjacent sub-inorganic encapsulation layers 7100 are made of a same material. By arranging at least two adjacent sub-inorganic encapsulation layers 7100 made of different materials and at least two adjacent sub-inorganic encapsulation layers 7100 made of the same material in the plurality of sub-inorganic encapsulation layers 7100, the inorganic encapsulation layer can form a denser film layer, so that invasion of water and oxygen can be better prevented, and the service life of the display device can be improved.

For example, a material of each of the sub-inorganic encapsulation layers 7100 may be selected from at least one of silicon nitride, silicon oxide, and silicon oxynitride.

In some examples, as illustrated in FIG. 8, in a direction away from the driving substrate 510, refractive indexes of the plurality of sub-inorganic encapsulation layers 7100 first increase and then decrease. In a case that the outgoing light emitted by the light emitting functional layer 540 enters the sub-inorganic encapsulation layer with a large refractive index from the sub-inorganic encapsulation layer with a relatively smaller refractive index, the outgoing light is refracted at an interface between them, so that a diffusion angle of the outgoing light can be reduced, and crosstalk between adjacent sub-pixels can be reduced or avoided inside the display substrate; then the outgoing light enters the sub-inorganic encapsulation layer with a smaller refractive index from the sub-inorganic encapsulation layer with a larger refractive index, and the outgoing light is refracted at the interface between them, at this time, the diffusion angle of the outgoing light increases, but since the outgoing light is already close to the light outgoing surface of the display substrate, no crosstalk is caused to adjacent sub-pixels.

In some examples, as illustrated in FIG. 8, each of the sub-inorganic encapsulation layers 7100 includes a flat region PTQ and a double arch interval region JGQ that are alternately arranged, a first arch region GX1 located at a side of the flat region PTQ away from the double arch interval region JGQ, a second arch region GX2 located between the flat region PTQ and the double arch interval region JGQ, and a third arch region GX3 located in the flat region PTQ far from the second arch region GX2, and the first arch region GX1 and the second arch region GX2 are symmetrically arranged with respect to a center of the flat region PTQ.

In some examples, as illustrated in FIG. 8, an orthographic projection of the first arch region GX1, an orthographic projection of the second arch region GX2 or an orthographic projection of the third arch region GX3 on the driving substrate 510 is overlapped with an orthographic projection of the protrusion portion 525B on the driving substrate 510, and an orthographic projection of the flat region PTQ on the driving substrate 510 is overlapped with an orthographic projection of the main body portion 525A on the driving substrate 510. That is, the orthographic projection of the first arch region GX1, the orthographic projection of the second arch region GX2 or the orthographic projection of the third arch region GX3 of each of the sub-inorganic encapsulation layers 7100 on the driving substrate 510 is overlapped with the orthographic projection of the protrusion portion 525B on the driving substrate 510, the orthographic projection of the flat region PTQ of each of the sub-inorganic encapsulation layers 7100 on the driving substrate 510 is overlapped with the orthographic projection of the main body portion 525A on the driving substrate 510; and the first arch region GX1, the second arch region GX2 and the third arch region GX3 of each of the sub-inorganic encapsulation layers 7100 are overlapped with the protrusion portions 525B of different anodes 525. In this way, light at an edge of each of the sub-pixels can be refracted by the first arch region, the second arch region or the third arch region to converge on the black matrix, so that crosstalk between adjacent sub-pixels can be avoided. It should be noted that the above-mentioned black matrix can be a common black matrix or a structure with low light transmittance and functioning as a black matrix formed by overlapping at least two color filters.

In some examples, as illustrated in FIG. 8, a size of the flat region PTQ in the second direction is L, a distance between a center of the second arch region GX2 and a center of the third arch region GX3 in the second direction is a first distance D1, a distance between the center of the first arch region GX1 and a center of the second arch region GX2 in the second direction is a second distance D2, a radius of curvature of the first arch region GX1, a radius of curvature of the second arch region GX2 and a radius of curvature of the third arch region GX3 are all R, the first distance D1 satisfies the following formula:

$$D2 \leqslant (L + D1) < (L + R).$$

In the display substrate provided in the example, by making the first distance D1 satisfy the above formula, the crosstalk between adjacent sub-pixels can be reduced while the pixel density or aperture ratio can be improved, so that a better display effect can be obtained. It should be noted that the above curvature radius is an average curvature radius, that is, an inverse of the average curvature of the corresponding arc. For example, the above-mentioned second direction is the direction from the protrusion portion to the main body portion or the direction from the main body portion to the protrusion portion, and the second direction is parallel to the surface of the drive substrate away from the anode layer.

In some examples, as illustrated in FIG. 8, the size of the flat region PTQ in the second direction is L, the distance between the center of the second arch region GX2 and the center of the third arch region GX3 in the second direction is the first distance D1, the distance between the center of the first arch region GX1 and the center of the second arch region GX2 in the second direction is the second distance D2, the radius of curvature of the first arch region GX1, the radius of curvature of the second arch region GX2 and the radius of curvature of the third arch region GX3 are all R, and the first distance D1 satisfies the following formula:

$$(L + D1) \leqslant D2 < (L + R).$$

In the display substrate provided in the example, by making that the first distance D1 satisfies the above formula, the crosstalk between adjacent sub-pixels can be reduced while the pixel density or aperture ratio is improved, so that a better display effect can be obtained.

For example, the above-mentioned second direction is the direction from the protrusion portion to the main body portion or the direction from the main body portion to the protrusion portion, and the second direction is parallel to the surface of the drive substrate away from the anode layer.

In some examples, as illustrated in FIG. 8, in each of the sub-inorganic encapsulation layers 7100, a distance between a surface of the first arch region GX1, the second arch region GX2 or the third arch region GX3 away from the driving substrate 510 and the driving substrate 510 is greater than a distance between a surface of the flat region PTQ away from the driving substrate 510 and the driving substrate 510. In this way, the first arch region GX1, the second arch region GX2 or the third arch region GX3 are upwardly arched structures.

In some examples, as illustrated in FIG. 8, an orthographic projection of the double arch interval region JGQ on the driving substrate 510 is overlapped with the orthographic projection of the interval region 522 between two adjacent anodes 525 on the driving substrate 510.

In some examples, as illustrated in FIG. 8, the plurality of sub-inorganic encapsulation layers 7100 include: a first sub-inorganic encapsulation layer 711, a second sub-inorganic encapsulation layer 712, a third sub-inorganic encapsulation layer 713, and a fourth sub-inorganic encapsulation layer 714; the first sub-inorganic encapsulation layer 711 is located at a side of the cathode layer 550 away from the driving substrate 510; the second sub-inorganic encapsulation layer 712 is located at a side of the first sub-inorganic encapsulation layer 711 away from the driving substrate 510; the third sub-inorganic encapsulation layer 713 is located at a side of the second sub-inorganic encapsulation layer 711 away from the driving substrate 510; and the fourth sub-inorganic encapsulation layer 714 is located at a side of the third sub-inorganic encapsulation layer 713 away from the driving substrate 510.

In some examples, as illustrated in FIG. 8, a refractive index of the first sub-inorganic encapsulation layer 711 is smaller than a refractive index of the second sub-inorganic encapsulation layer 712, and a refractive index of the fourth sub-inorganic encapsulation layer 714 is smaller than a refractive index of the third sub-inorganic encapsulation layer 713. In this way, in a case that the outgoing light emitted by the light emitting functional layer 540 enters the second sub-inorganic encapsulation layer 712 with a larger refractive index from the first sub-inorganic encapsulation layer 711 with a smaller refractive index, the outgoing light will be refracted at the interface between the first sub-inorganic encapsulation layer 711 and the second sub-inorganic encapsulation layer 712, so that a diffusion angle of the outgoing light can be reduced, thus the crosstalk between adjacent sub-pixels can be reduced or avoided inside the display substrate; then the outgoing light enters the fourth sub-inorganic encapsulation layer 714 with a smaller refractive index from the third sub-inorganic encapsulation layer 713 with a larger refractive index, and the outgoing light is refracted at the interface between them, at this time, the diffusion angle of the outgoing light increases, however, since the outgoing light is already close to the light outgoing surface of the display substrate, no crosstalk is caused to adjacent sub-pixels.

In some examples, as illustrated in FIG. 8, the refractive index of the second sub-inorganic encapsulation layer 712 is equal to the refractive index of the third sub-inorganic encapsulation layer 713. At this time, the second sub-inorganic encapsulation layer 712 and the third sub-inorganic encapsulation layer 713 can be made of a same material. Of course, the embodiments of the present disclosure include but are not limited to this, the refractive index of the second sub-inorganic encapsulation layer and the refractive index of the third sub-inorganic encapsulation layer may also be different.

In some examples, as illustrated in FIG. 8, the first sub-inorganic encapsulation layer 711 and the second sub-inorganic encapsulation layer 712 are made of different materials; and the fourth sub-inorganic encapsulation layer 714 and the third sub-inorganic encapsulation layer 713 may be made of different materials.

For example, the first sub-inorganic encapsulation layer 711 is made of silicon oxide or silicon oxynitride material, the second sub-inorganic encapsulation layer 712 is made of silicon nitride material; the fourth sub-inorganic encapsulation layer 714 is made of silicon oxide material, and the third sub-inorganic encapsulation layer 713 is made of silicon nitride material.

In some examples, as illustrated in FIG. 8, the first sub-inorganic encapsulation layer 711 and the fourth sub-inorganic encapsulation layer 714 may be made of the same material, or may be made of different materials.

For example, the first sub-inorganic encapsulation layer 711 and the fourth sub-inorganic encapsulation layer 714 are both made of silicon oxide material; or the first sub-inorganic encapsulation layer 711 is made of silicon oxynitride material, and the fourth sub-inorganic encapsulation layer 714 is made of silicon oxide material.

In some examples, as illustrated in FIG. 8, an upper surface of the first arch region GX1 of the first sub-inorganic encapsulation layer 711 away from the substrate 512 has a first radius of curvature, an upper surface of the first arch region GX1 of the second sub-inorganic encapsulation layer 712 away from the substrate 512 has a second radius of curvature, an upper surface of the first arch region GX1 of the third sub-inorganic encapsulation layer 713 away from the substrate 512 has a third radius of curvature, an upper surface of the first arch region GX1 of the fourth sub-inorganic encapsulation layer 714 away from the substrate 512 has a fourth radius of curvature, the first radius of curvature is smaller than the second radius of curvature, the second radius of curvature is smaller than the third radius of curvature, and the third radius of curvature is smaller than the fourth radius of curvature. That is, in a direction away from the driving substrate 510, the radii of curvature of the first arch regions of the various sub-inorganic encapsulation layers gradually increase.

In some examples, as illustrated in FIG. 8, similar to a relationship satisfied by the radius of curvature of the first arch region of each of the sub-inorganic encapsulation layers away from the upper surface of the substrate, the radii of curvature of the second arch regions of the various sub-inorganic encapsulation layers away from the upper surface of the substrate also increase gradually in the direction away from the driving substrate.

In some examples, as illustrated in FIG. 8, similar to the relationship satisfied by the radius of curvature of the first arch region of each of the sub-inorganic encapsulation layers away from the upper surface of the substrate, the radii of curvature of the third arch regions of the various sub-inorganic encapsulation layers away from the upper surface of the substrate also increase gradually in the direction away from the driving substrate.

In some examples, as illustrated in FIG. 8, shapes of the first arch region GX1, the second arch region GX2 and the third arch region GX3 of the first sub-inorganic encapsulation layer 711 are the same; shapes of the first arch region GX1, the second arch region GX2 and the third arch region GX3 of the second sub-inorganic encapsulation layer 712 are the same; shapes of the first arch region GX1, the second arch region GX2 and the third arch region GX3 of the third sub-inorganic encapsulation layer 713 are the same; and shapes of the first arch region GX1, the second arch region GX2 and the third arch region GX3 of the fourth sub-inorganic encapsulation layer 714 are the same.

In some examples, as illustrated in FIG. 8, a dummy center of the first arch region of the fourth sub-inorganic encapsulation layer 714 is located between the upper surface of the first sub-inorganic encapsulation layer 711 away from the substrate 512 and the lower surface of the fourth sub-inorganic encapsulation layer 714 close to the substrate 512. It should be noted that, the above-mentioned dummy center refers to a center of a virtual circle with an arc of the first arch region away from the upper surface of the substrate.

In some examples, as illustrated in FIG. 8, the first sub-inorganic encapsulation layer 711 has a first thickness TH1 in a direction perpendicular to the driving substrate 510, the second sub-inorganic encapsulation layer 712 has a second thickness TH2 in the direction perpendicular to the driving substrate 510, the third sub-inorganic encapsulation layer 713 has a third thickness TH3 in the direction perpendicular to the driving substrate 510, the fourth sub-inorganic encapsulation layer 714 has a fourth thickness TH4 in the direction perpendicular to the driving substrate 510, the first thickness TH1 is greater than the second thickness TH2, the second thickness TH2 is greater than the third thickness TH3, and the third thickness TH3 is greater than the fourth thickness TH4. That is, in the direction away from the driving substrate 510, the thicknesses of the various sub-inorganic encapsulation layers are gradually reduced.

In some examples, as illustrated in FIG. 8, a ratio of a difference between the first thickness TH1 and the second thickness TH2 to a difference between the third thickness TH3 and the fourth thickness TH4 ranges from 1.5 times to 2 times; that is, the first thickness TH1, the second thickness TH2, the third thickness TH3 and the fourth thickness TH4 satisfy the following formula: $TH1-TH2=m*(TH3-TH4)$, and a value range of m is from 1.2 to 2. In this way, the display substrate can better avoid crosstalk between adjacent sub-pixels.

In some examples, as illustrated in FIG. 8, a ratio of a sum of the second thickness TH2 and the third thickness TH3 to the first thickness TH1 ranges from 0.8 to 1.2; that is, the first thickness TH1, the second thickness TH2 and the third thickness TH3 satisfy the following formula: $(TH2+TH3)=n*TH1$, and a value range of n is from 0.8 to 1.2. In this way, the display substrate can better avoid crosstalk between adjacent sub-pixels.

In some examples, as illustrated in FIG. 8, the first thickness is in the range from 1000 nanometers to 1200 nanometers, the second thickness is in the range from 500 nanometers to 660 nanometers, the third thickness is in the range from 480 nanometers to 560 nanometers, and the fourth thickness is in the range from 180 nanometers to 260 nanometers.

In some examples, a material of the first sub-inorganic encapsulation layer includes silicon oxide or silicon oxynitride, a material of the second sub-inorganic encapsulation layer includes silicon nitride, a material of the third sub-inorganic encapsulation layer includes silicon nitride, and a material of the fourth sub-inorganic encapsulation layer includes silicon oxide. Of course, the embodiments of the present disclosure include but are not limited to this, and the material of each of the sub-inorganic encapsulation layers may also be other suitable materials.

In some examples, the first thickness is 1100 nanometers, the second thickness is in the range from 580 nanometers, the third thickness is in the range from 520 nanometers, and the fourth thickness is in the range from 220 nanometers. Of course, the embodiments of the present disclosure include but are not limited to this, the thickness of each of the sub-inorganic encapsulation layers may also be other values.

In some examples, as illustrated in FIG. 8, the encapsulation layer 560 further includes an organic encapsulation layer 720, the organic encapsulation layer 720 is located at a side of the inorganic encapsulation layer 710 away from the driving substrate 510. The organic encapsulation layer 720 includes a first region 7201, a second region 7202 and a third region 7203, an average thickness of the first region 7201 is smaller than an average thickness of the second region 7202, and the average thickness of the second region 7202 is smaller than an average thickness of the third region 7203. In this way, the organic encapsulation layer can better match with the subsequently formed color filters with different thicknesses.

In some examples, as illustrated in FIG. 8, the display substrate 500 further includes a color filter layer 570, the color filter layer 570 is located at a side of the encapsulation layer 560 away from the driving substrate 510; the color filter layer 570 includes a first color filter 571, a second color filter 572 and a third color filter 573.

For example, the first color filter 571, the second color filter 572, and the third color filter 573 may be color filters of different colors.

For example, the first color filter 571, the second color filter 572, and the third color filter 573 may have different thicknesses, respectively. Of course, the embodiments of the present disclosure include but are not limited to this.

In some examples, as illustrated in FIG. 8, a first overlapping region OP1 is existed between the first color filter 571 and the second color filter 572, a second overlapping region OP2 is existed between the second color filter 572 and the third color filter 573, and a third overlapping region OP3 is existed between the third color filter 573 and the first color filter 571. In a case that two filters of different colors are overlapped, light transmittance in the overlapping region is low, thus the overlapping region can be used as a black matrix. In this way, the first overlapping region, the second overlapping region and the third overlapping region of the display substrate can all be used as a black matrix, which has an effect of shielding light. Of course, the embodiments of the present disclosure include but are not limited to this, adjacent color filters may be not overlapped, and a black matrix is additionally formed between adjacent color filters.

In some examples, as illustrated in FIG. 8, an orthographic projection of the first overlapping region OP1, an orthographic projection of the second overlapping region OP2 and an orthographic projection of the third overlapping region OP3 on the driving substrate 510 are overlapped with the orthographic projection of the interval region 522 between two adjacent anodes 525 on the driving substrate 510, so that the first overlapping region OP1, the second overlapping region OP2 and the third overlapping region OP3 can be used as black matrices, and have the effect of shielding light. It should be noted that, the display substrate illustrated in FIG. 8 only adopts a method of overlapping two color filters to form an overlapping region equivalent to a black matrix. However, in the display substrate provided by the embodiment of the present disclosure, the overlapping region corresponding to the black matrix can also be formed by overlapping three color filters.

In some examples, as illustrated in FIG. 8, orthographic projections of the first overlapping region OP1, the second overlapping region OP2 and the third overlapping region OP3 on the driving substrate 510 are overlapped with the orthographic projection of the protrusion portion 525B on the driving substrate 510.

In some examples, as illustrated in FIG. 8, a size of the first overlapping region OP1 in the second direction is larger than a size of the second overlapping region OP2 in the second direction, and the size of the second overlapping region OP2 in the second direction is larger than a size of the third overlapping region OP3 in the second direction.

In some examples, as illustrated in FIG. 8, the size of the first overlapping region OP1 in the second direction is in the range from 400 nanometers to 600 nanometers, the size of the second overlapping region OP2 in the second direction is in the range from 250 nanometers to 350 nanometers, and the size of the third overlapping region OP3 in the second direction is in the range from 100 nanometers to 200 nanometers.

In some examples, as illustrated in FIG. 8, an average size of the first color filter 571 in the direction perpendicular to the driving substrate 510 is larger than an average size of the second color filter 572 in the direction perpendicular to the driving substrate 510, and is smaller than an average size of the third color filter 573 in the direction perpendicular to the driving substrate 510. It should be noted that, the above-mentioned average size refers to an arithmetic mean value of sizes of various parts on the color filter in the direction perpendicular to the driving substrate.

In some examples, as illustrated in FIG. 8, the average size of the first color filter 571 in the direction perpendicular to the driving substrate 510 is in the range from 2.3 micrometers to 2.6 micrometers, the average size of the second color filter 572 in the direction perpendicular to the driving substrate 510 is in the range from 1.7 micrometers to 1.95 micrometers, and the average size of the third color filter 573 in the direction perpendicular to the driving substrate 510 is in the range from 2.3 micrometers to 2.7 micrometers.

In some examples, as illustrated in FIG. 8, a ratio of a difference between the average size of the first color filter 571 in the direction perpendicular to the driving substrate 510 and the average size of the second color filter 572 in the direction perpendicular to the driving substrate 510 to a difference between the average size of the first color filter 571 in the direction perpendicular to the driving substrate 510 and the average size of the third color filter 573 in the direction perpendicular to the driving substrate 510 ranges from 2 to 3.

Figure 9:
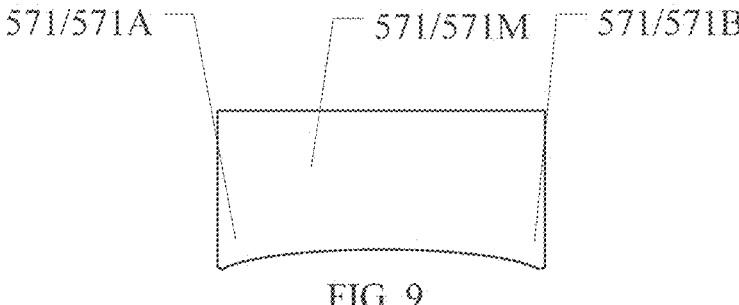
FIG. 9 is a schematic diagram of a first color filter in a display substrate provided by an embodiment of the present disclosure.

FIG. 9 is a schematic diagram of a first color filter in a display substrate provided by an embodiment of the present disclosure. As illustrated in FIGS. 8 and 9, the first color filter 571 includes a first edge portion 571A, a second edge portion 571B, and an intermediate portion 571C between the first edge portion 571A and the second edge portion 571B, an average size of the intermediate portion 571C in the direction perpendicular to the driving substrate 510 is smaller than an average size of the first edge portion 571A in the direction perpendicular to the driving substrate 510 and an average size of the second edge portion 571B in the direction perpendicular to the driving substrate 510.

In some examples, as illustrated in FIG. 8, the first color filter 571 includes a first contact surface 571C in contact with the second color filter 572, the second color filter 572 includes a second contact surface 572C in contact with the third color filter 573, the third color filter 573 includes a third contact surface 573C in contact with the first color filter 571, and a size of the first contact surface 571C in the first direction perpendicular to the driving substrate 510 is equal to a size of the second contact surface 572C in the first direction, and is smaller than a size of the third contact surface 573C in the first direction.

In some examples, as illustrated in FIG. 8, a distance between the first color filter 571 and the surface of the driving substrate 510 far away from the anode layer 520 is greater than a distance between the third color filter 573 and the surface of the driving substrate 510 far away from the anode layer 520, and less than a distance between the second color filter 572 and the surface of the driving substrate 510 far away from the anode layer 520.

In some examples, as illustrated in FIG. 8, the first color filter is a red filter, the second color filter is a green filter, and the third color filter is a blue filter. Of course, the embodiments of the present disclosure include but are not limited to this, the first color filter, the second color filter and the third color filter may also be color filters of other colors.

In some examples, material of the color filter layer 570 includes a desiccant, so that an effect of preventing external water and oxygen from entering the film layer below the color filter layer can be achieved.

In some examples, the color filter layer 570 includes aluminum.

In some examples, as illustrated in FIG. 8, the display substrate 500 further includes a protective layer 580 located at a side of the color filter layer 570 away from the driving substrate 510. The protective layer 580 can protect the color filter layer 570, thus filter performance of the color filter layer 570 remains stable during long-term use, so that the display quality of the display substrate can be improved.

In some examples, as illustrated in FIG. 8, the display substrate 500 further includes a glass cover plate 590, which is located at a side of the color filter layer 570 away from the driving substrate 510.

In some examples, as illustrated in FIG. 8, the flat region PTQ of the first sub-inorganic encapsulation layer 711 has a first width in the second direction, the flat region PTQ of the second sub-inorganic encapsulation layer 712 has a second width in the second direction, the flat region PTQ of the third sub-inorganic encapsulation layer 713 has a third width in the second direction, the flat region PTQ of the fourth sub-inorganic encapsulation layer 714 has a fourth width in the second direction, the first width is greater than the second width, the second width is greater than the third width, and the third width is greater than the fourth width. That is, the first width, the second width, the third width and the fourth width gradually decrease.

Figure 10:
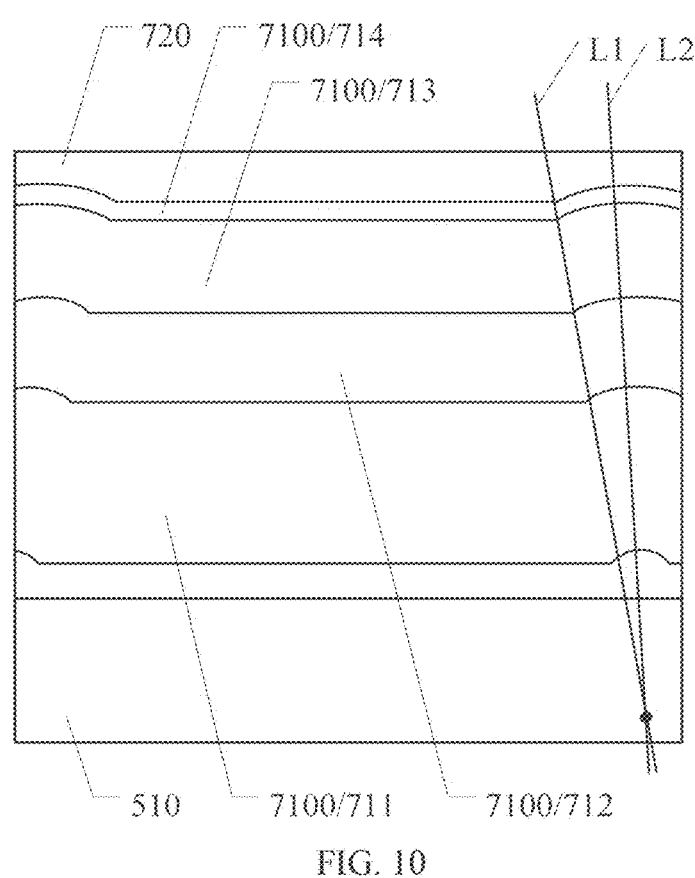
FIG. 10 is a partial structure schematic diagram of still another display substrate provided by an embodiment of the present disclosure.

FIG. 10 is a partial structure schematic diagram of still another display substrate provided by an embodiment of the present disclosure. As illustrated in FIG. 8 and FIG. 10, an included angle between a first connection line L1 of an edge of the flat region PTQ2 of the first sub-inorganic encapsulation layer 711 close to the second arch region GX2, an edge of the flat region PTQ of the second sub-inorganic encapsulation layer 712 close to the second arch region GX2, an edge of the flat region PTQ of the third sub-inorganic encapsulation layer 713 close to the second arch region GX2, and an edge of the flat region PTQ of the fourth sub-inorganic encapsulation layer 714 close to the second arch region GX2 and a surface of the driving substrate 510 away from the anode layer 520 is a first included angle; an included angle between a second connection line L2 of a vertex of the second arch region GX2 of the first sub-inorganic encapsulation layer 711, a vertex of the first arch region GX1 of the second sub-inorganic encapsulation layer 712, and a vertex of the second arch region GX2 of the third sub-inorganic encapsulation layer 713 and a vertex of the second arch region GX2 of the fourth sub-inorganic encapsulation layer 714 and the surface of the driving substrate 510 away from the anode layer 520 is the second included angle, and the first included angle is smaller than the second included angle.

In some examples, as illustrated in FIGS. 8 and 10, a range of the first included angle is from 60 degrees to 85 degrees, and a range of the second included angle is from 85 degrees to 89 degrees.

In some examples, as illustrated in FIGS. 8 and 10, an intersection of the first connection line L1 and the second connection line L2 is located within the driving substrate 510.

Figure 11:
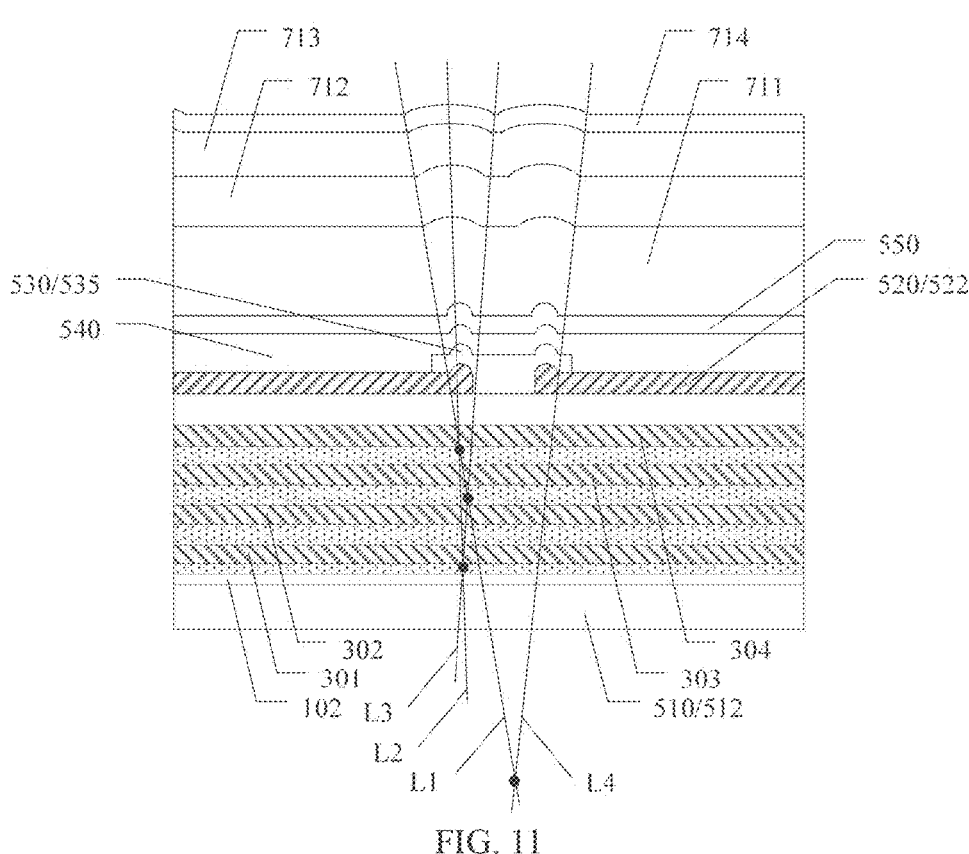
FIG. 11 is a schematic structure diagram of a driving substrate provided by an embodiment of the present disclosure.

FIG. 11 is a schematic structure diagram of a driving substrate provided by an embodiment of the present disclosure. As illustrated in FIG. 11, the driving circuit 514 includes a semiconductor layer 102, a first conductive layer 301, a second conductive layer 302, a third conductive layer 303 and a fourth conductive layer 304; the semiconductor layer 102 is located in the substrate 512; the first conductive layer 301 is located on the semiconductor layer 102; the second conductive layer 302 is located at the side of the first conductive layer 301 away from the substrate 512; the third conductive layer 303 is located at the side of the second conductive layer 302 away from the substrate 512; and the fourth conductive layer 304 is on the side of the third conductive layer 303 away from the substrate 512.

In some examples, as illustrated in FIG. 11, an intersection of the first connection line L1 and the second connection line L2 is located between an upper surface of the third conductive layer 303 away from the substrate 512 and the anode layer 520.

In some examples, as illustrated in FIG. 11, a distance between the intersection of the first connection line L1 and the second connection line L2 and a vertex of the protruding structure 535 of the pixel definition layer 530 away from the upper surface of the substrate 512 is greater than a thickness of the first sub inorganic encapsulation layer 711 in the first direction.

In some examples, as illustrated in FIG. 11, a distance between the intersection of the first connection line L1 and the second connection line L2 and a vertex of the protruding structure 535 of the pixel definition layer 530 away from the upper surface of the substrate 512 is smaller than a sum of the thickness of the first sub inorganic encapsulation layer 711 in the first direction and the thickness of the second sub inorganic encapsulation layer 712 in the first direction.

In some examples, as illustrated in FIG. 11, the distance between the intersection of the first connection line L1 and the second connection line L2 and the vertex of the protruding structure 535 of the pixel definition layer 530 away from the upper surface of the substrate 512 is smaller than a sum of the thickness of the first sub-inorganic encapsulation layer 711 in the first direction and a thickness of the second sub-inorganic encapsulation layer 712 in the first direction.

In some examples, as illustrated in FIG. 11, an included angle between a third connection line L3 of an edge of the second arch region GX2 of the first sub-inorganic encapsulation layer 711 close to the double arch interval region JGQ, an edge of the second arch region GX2 of the second sub-inorganic encapsulation layer 712 close to the double arch interval region JGQ, an edge of the second arch region GX2 of the third sub-inorganic encapsulation layer 713 close to the double arch interval region JGQ and an edge of the second arch region GX2 of the fourth sub-inorganic encapsulation layer 714 close to the double arch interval region JGQ and the surface of the driving substrate 510 away from the anode layer 520 is a third included angle, and the third included angle is smaller than the second included angle.

In some examples, as illustrated in FIG. 11, the intersection of the first connection line L1 and the third connection line L3 is located between an upper surface of the second conductive layer 302 away from the substrate 512 and a lower surface of the third conductive layer 303 close to the substrate 512.

In some examples, as illustrated in FIG. 11, an included angle between a fourth connecting line L4 of an edge of the third arch region GX3 of the first sub-inorganic encapsulation layer 711 away from the double arch interval region JGQ, an edge of the third arch region GX3 of the second sub-inorganic encapsulation layer 712 away from the double arch interval region JGQ, an edge of the third arch region GX3 of the third sub-inorganic encapsulation layer 713 away from the double arch interval region JGQ and an edge of the third arch region GX3 of the fourth sub-inorganic encapsulation layer 714 away from the double arch interval region JGQ and the surface of the driving substrate 510 far away from the anode layer 520 is the fourth included angle, and the fourth included angle is smaller than the second included angle.

In some examples, as illustrated in FIG. 11, an intersection of the first connection line L1 and the fourth connection line L4 is located at a side of the substrate 512 away from the first conductive layer 301.

In some examples, as illustrated in FIG. 11, an intersection of the third connection line L3 and the fourth connection line L4 is located between an upper surface of the second conductive layer 302 away from the substrate 512 and a lower surface of the third conductive layer 303 close to the substrate 512.

Figure 12:
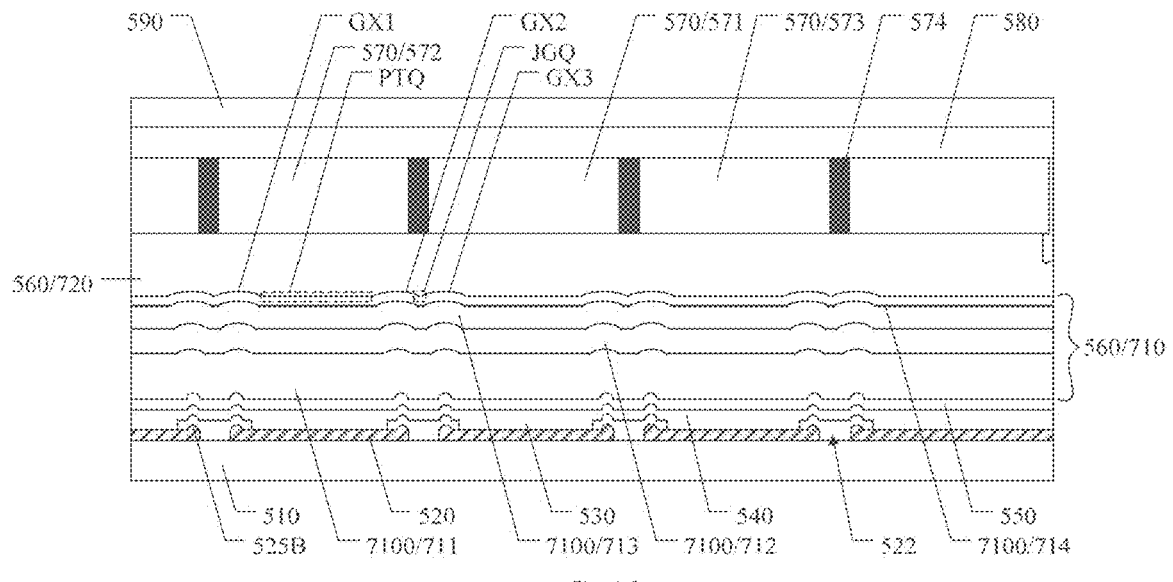
FIG. 12 is a partial structure schematic diagram of still another display substrate provided by an embodiment of the present disclosure.

FIG. 12 is a partial structure schematic diagram of still another display substrate provided by an embodiment of the present disclosure. As illustrated in FIG. 12, the color filter layer 570 further includes a black matrix 574, which is located between any two of the first color filter 571, the second color filter 572 and the third color filter 573 adjacent to each other.

In some examples, as illustrated in FIG. 12, an orthographic projection of the black matrix 574 on the driving substrate 510 is overlapped with an orthographic projection of an interval region 522 between two adjacent anodes 525 on the driving substrate 510.

In some examples, as illustrated in FIG. 12, the display substrate 500 further includes a protective layer 580, which is located at a side of the color filter layer 570 away from the driving substrate 510. The protective layer 580 can protect the color filter layer 570, thus the filter performance of the color filter layer 570 remains stable during long-term use, so that the display quality of the display substrate can be improved.

In some examples, as illustrated in FIG. 12, the display substrate 500 further includes a glass cover plate 590, which is located at a side of the color filter layer 570 away from the driving substrate 510.

Figure 13:
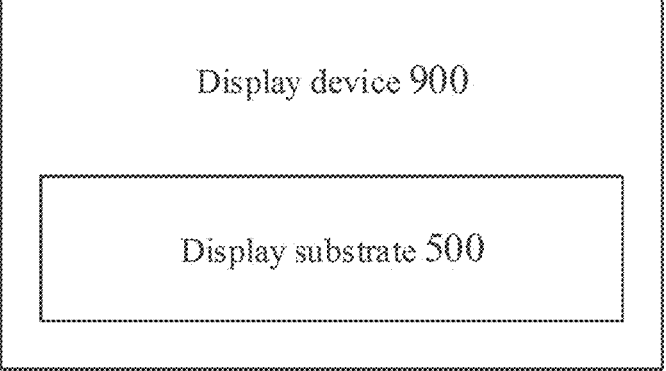
FIG. 13 is a schematic diagram of a display device provided by an embodiment of the present disclosure.

An embodiment of the present disclosure further provides a display device, and the display device comprises any one of the above display substrates. FIG. 13 is a schematic diagram of a display device provided by an embodiment of the present disclosure. As illustrated in FIG. 13, the display device 900 includes the above-mentioned display substrate 500. In this way, the display device has technical effects corresponding to the beneficial technical effects of the display substrate.

For example, in the display substrate, since the anode includes a main body portion and a protrusion portion, and a size of the protrusion portion in the direction perpendicular to the driving substrate is larger than a size of the main body portion in the direction perpendicular to the driving substrate, the pixel definition layer located between two anodes and overlapped with edge portions of the anodes may form a protruding structure corresponding to the protrusion portion. In a case that the light emitting functional layer is formed, at least part of the sub-functional layer (for example, a charge generating layer) in the light emitting functional layer can be better disconnected at a position where the protruding structure is located, that is, at least part of the sub-functional layer in the light emitting portions corresponding to two adjacent anodes are not connected, so that leakage and crosstalk between adjacent sub-pixels can be effectively avoided. On the other hand, at this time, a height of the protruding structure of the pixel definition layer is also higher, so that a function of pixel definition can be better performed, and the crosstalk between adjacent sub-pixels can be reduced and avoided optically. In this way, the display substrate can also reduce or even avoid crosstalk between adjacent sub-pixels, and thus has a better display quality.

For another example, since the driving substrate in the display substrate can be manufactured by a semiconductor fabrication process, so that a pixel driving circuit for driving each pixel to emit light and display can be integrated in the driving substrate. In this way, the display device can provide a micro display device, and has the advantages of high resolution, high brightness, rich colors, low driving voltage, fast response speed and low power consumption.

For example, the display device 900 can be a wearable display device, such as a smart watch, and a smart glass. Of course, the embodiments of the present disclosure include but are not limited to this, the display device can also be other electronic products with display functions, such as a mobile phone, a television, a navigator, an electronic album, an electronic picture frame and a computer monitor.

Figure 14:
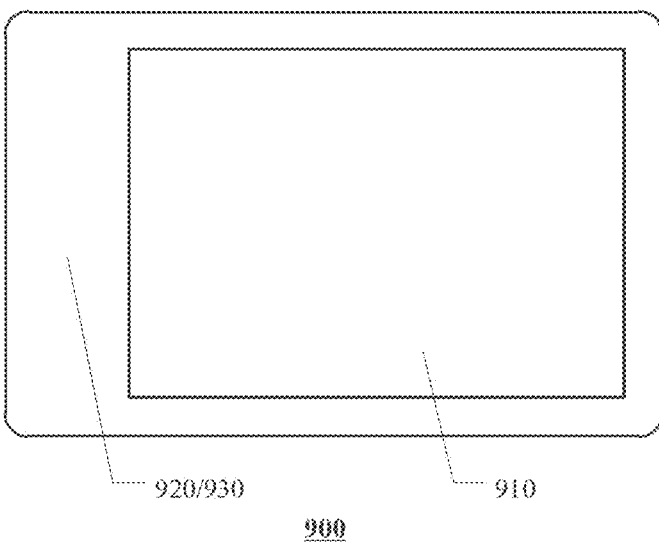
FIG. 14 is a planar schematic diagram of a display device provided by an embodiment of the present disclosure.

FIG. 14 is a planar schematic diagram of a display device provided by an embodiment of the present disclosure. As illustrated in FIG. 14, the display device 900 includes a display region 910 and a peripheral region 920 located around the display region 910; the peripheral region 920 of the display device 900 includes a wiring region 930. The display region 910 can be used for light emitting display, and the wiring region 930 can be used to lead out various driving lines or signal lines from the display region 910.

Figure 15:
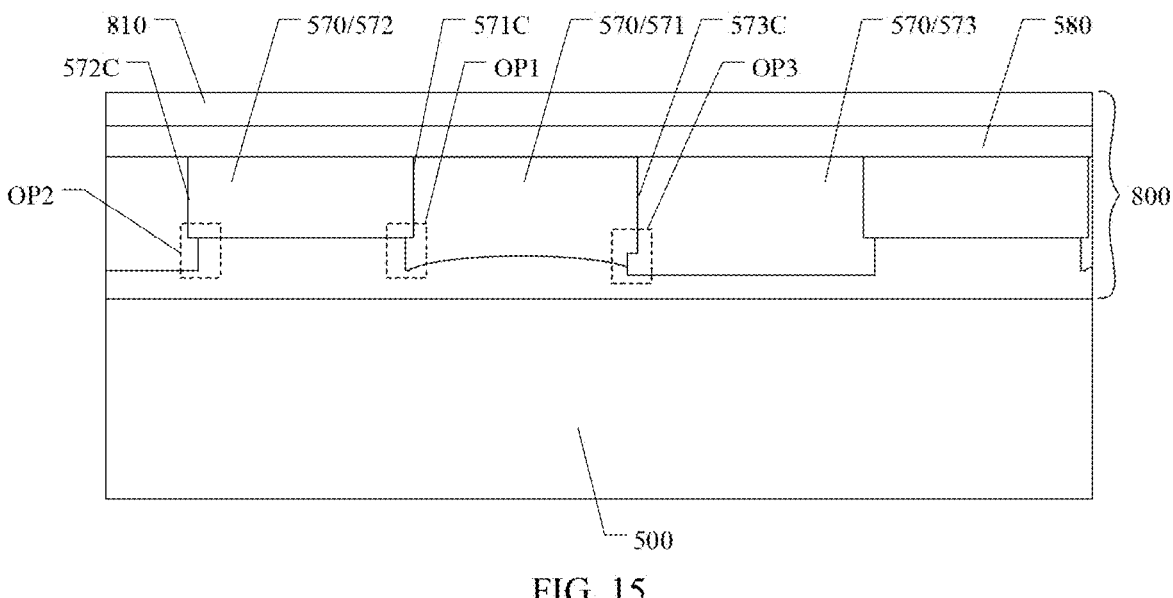
FIG. 15 is a schematic diagram of another display device provided by an embodiment of the present disclosure.

FIG. 15 is a schematic diagram of another display device provided by an embodiment of the present disclosure. As illustrated in FIG. 15, the display substrate 500 included in the display device 900 does not include the color filter layer. At this time, the display device 900 further includes an opposite substrate 800, and the opposite substrate 800 is arranged opposite to the display substrate 500; the opposite substrate 800 includes a glass cover plate 810 and a color filter layer 570 on the glass cover plate 810, and the color filter layer 570 includes a first color filter 571, a second color filter 572 and a third color filter 573. In this way, the display substrate and the opposite substrate can be manufactured separately, and then the display substrate and the opposite substrate can be aligned, so that the above-mentioned display device is formed. In addition, the display device has technical effects corresponding to the beneficial technical effects of the display substrate.

For example, in the display substrate, since the anode includes a main body portion and a protrusion portion, and a size of the protrusion portion in the direction perpendicular to the driving substrate is larger than a size of the main body portion in the direction perpendicular to the driving substrate, so that the pixel definition layer located between the two anodes and overlapped with edge portions of the anodes may form a protruding structure corresponding to the protrusion portion. In a case that the light emitting functional layer is formed, at least part of a sub-functional layer (such as the charge generation layer) in the light emitting functional layer can be better disconnected at a position where the protruding structure is located, that is, at least part of the sub-functional layers in the light emitting portions corresponding to two adjacent anodes are not connected, so that leakage and crosstalk between adjacent sub-pixels can be effectively avoided. On the other hand, at this time, a height of the protruding structure of the pixel definition layer is also higher, so that the function of pixel definition can be better performed, and the crosstalk between adjacent sub-pixels can be reduced and avoided optically. In this way, the display substrate can also reduce or even avoid crosstalk between adjacent sub-pixels, and thus has better display quality.

For another example, since the driving substrate in the display substrate can be manufactured by a semiconductor fabrication process, so that a pixel driving circuit for driving each pixel to emit light and display can be integrated in the driving substrate. In this way, the display device can provide a micro display device, and has the advantages of high resolution, high brightness, rich colors, low driving voltage, fast response speed, and low power consumption.

For example, the display device 900 may be a wearable display device, such as a smart watch, and a smart glass. Of course, the embodiments of the present disclosure include but are not limited to this, the display device can also be other electronic products with display functions, such as a mobile phone, a television, a navigator, an electronic album, an electronic picture frame, and a computer monitor.

In some examples, as illustrated in FIG. 15, a first overlapping region OP1 is existed between the first color filter 571 and the second color filter 572, a second overlapping region OP2 is existed between the second color filter 572 and the third color filter 573, and a third overlapping region OP3 is existed between the third color filter 573 and the first color filter 571. In a case that two filters of different colors are overlapped, light transmittance in the overlapping region is low, thus the overlapping region can be used as a black matrix. In this way, the first overlapping region, the second overlapping region and the third overlapping region of the display substrate can all be used as a black matrix, which has an effect of shielding light. Of course, the embodiments of the present disclosure include but are not limited to this, adjacent color filters may not overlap with each other, and a black matrix is additionally formed between adjacent color filters.

In some examples, as illustrated in FIG. 15, orthographic projections of the first overlapping region OP1, the second overlapping region OP2 and the third overlapping region OP3 on the driving substrate 510 is overlapped with an orthographic projection of an interval region 522 between two adjacent anodes 525 on the driving substrate 510. It should be noted that, the display substrate illustrated in FIG. 14 only adopts the method of overlapping two color filters to form an overlapping region equivalent to a black matrix, but in the display substrate provided by the embodiment of the present disclosure, an overlapping region equivalent to a black matrix can also be formed by overlapping three color filters.

In some examples, as illustrated in FIG. 15, a size of the first overlapping region OP1 in the second direction is larger than a size of the second overlapping region OP2 in the second direction, and the size of the second overlapping region OP2 in the second direction is larger than a size of the third overlapping region OP3 in the second direction.

In some examples, as illustrated in FIG. 15, the size of the first overlapping region OP1 in the second direction is in the range from 400 nanometers to 600 nanometers, the size of the second overlapping region OP2 in the second direction is in the range from 250 nanometers to 350 nanometers, and the size of the third overlapping region OP3 in the second direction is in the range from 100 nanometers to 200 nanometers.

In some examples, as illustrated in FIG. 15, an average size of the first color filter 571 in the direction perpendicular to the driving substrate 510 is larger than an average size of the second color filter 572 in the direction perpendicular to the driving substrate 510, and is smaller than an average size of the third color filter 573 in the direction perpendicular to the driving substrate 510.

In some examples, as illustrated in FIG. 15, the average size of the first color filter 571 in the direction perpendicular to the driving substrate 510 is in the range from 2.3 micrometers to 2.6 micrometers, the average size of the second color filter 572 in the direction perpendicular to the driving substrate 510 is in the range from 1.7 micrometers to 1.95 micrometers, and the average size of the third color filter 573 in the direction perpendicular to the driving substrate 510 is in the range from 2.3 micrometers to 2.7 micrometers.

In some examples, as illustrated in FIG. 15, a ratio of a difference between the average size of the first color filter 571 in the direction perpendicular to the driving substrate 510 and the average size of the second color filter 572 in the direction perpendicular to the driving substrate 510 to a difference between the average size of the first color filter 571 in the direction perpendicular to the driving substrate 510 and the average size of the third color filter 573 in the direction perpendicular to the driving substrate 510 ranges from 2 to 3.

In some examples, as illustrated in FIGS. 10 and 15, the first color filter 571 includes a first edge portion 571A, a second edge portion 571B, and an intermediate portion 571M between the first edge portion 571A and the second edge portion 571B, an average size of the intermediate portion 571M in the direction perpendicular to the driving substrate 510 is smaller than an average size of the first edge portion 571A in the direction perpendicular to the driving substrate 510 and an average size of the second edge portion 571B in the direction perpendicular to the driving substrate 510.

In some examples, as illustrated in FIG. 15, the first color filter 571 includes a first contact surface 571C in contact with the second color filter 572, the second color filter 572 includes a second contact surface 572C in contact with the third color filter 573, the third color filter 573 includes a third contact surface 573C in contact with the first color filter 571, a size of the first contact surface in the first direction perpendicular to the driving substrate 510 is equal to a size of the second contact surface in the first direction, and is smaller than a size of the third contact surface in the first direction.

In some examples, as illustrated in FIG. 15, a distance between the first color filter 571 and the surface of the driving substrate 510 away from the anode layer 520 is greater than a distance between the third color filter 573 and the surface of the driving substrate 510 away from the anode layer 520, and is smaller than a distance between the second color filter 572 and the surface of the driving substrate 510 away from the anode layer 520.

In some examples, as illustrated in FIG. 15, the first color filter is a red filter, the second color filter is a green filter, and the third color filter is a blue filter. Of course, the embodiments of the present disclosure include but are not limited to this, the first color filter, the second color filter and the third color filter may also be color filters of other colors.

In some examples, the material of the color filter layer 570 includes a desiccant, so that the effect of preventing external water and oxygen from entering the film layer below the color filter layer can be achieved.

In some examples, the color filter layer 570 includes aluminum.

Figure 16:
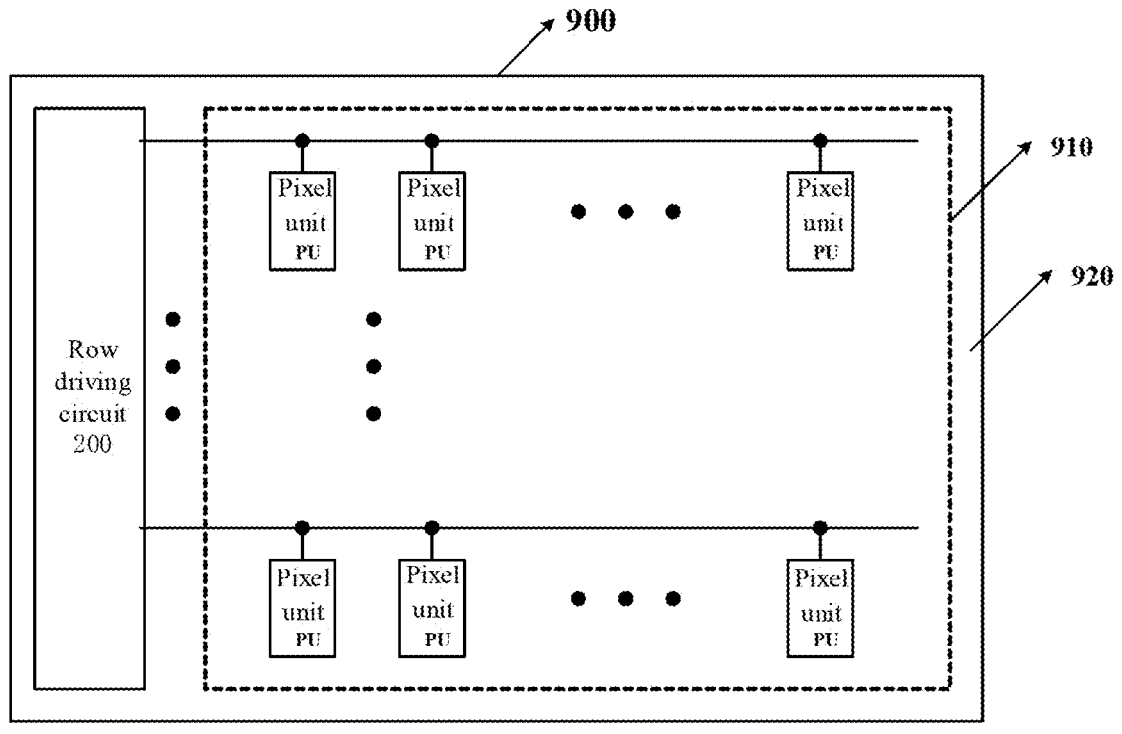
FIG. 16 is a planar schematic diagram of a display substrate provided by an embodiment of the present disclosure.

At least one embodiment of the present disclosure further provides a display substrate. FIG. 16 is a planar schematic diagram of a display substrate provided by an embodiment of the present disclosure. As illustrated in FIG. 16, the display device 900 includes a plurality of pixel units PU arranged in an array in the display region 910, for example, at least one of the plurality of pixel units PU may include one of the above-mentioned driving circuits and one of the above-mentioned anodes.

For example, as illustrated in FIG. 16, the display device 900 further includes a row driving circuit 200 manufactured in the substrate, the row driving circuit 200 is configured to provide a first scan signal SCAN1, a second scan signal SCAN2 and a light emitting control signal EN to the driving circuits in the plurality of pixel units PU in the display device 900. For example, the row driving circuit 200 is arranged in the peripheral region 920 surrounding the display region 910.

Figure 17:
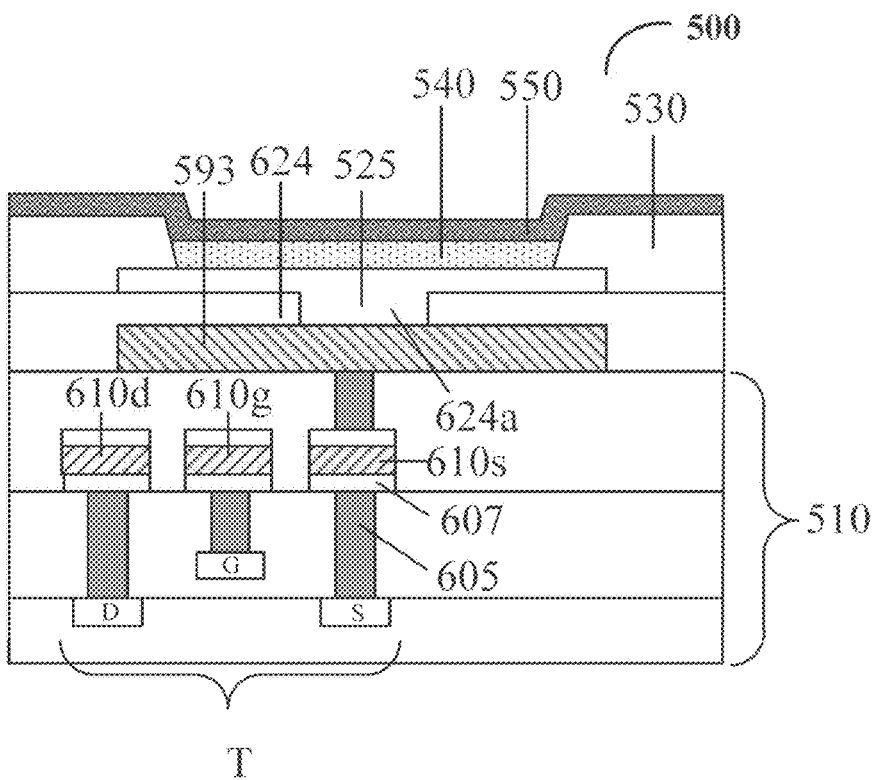
FIG. 17 is a partial cross-sectional schematic diagram of a display substrate provided by an embodiment of the present disclosure.

At least one embodiment of the present disclosure further provides a display substrate. FIG. 17 is a partial cross-sectional schematic diagram of a display substrate provided by an embodiment of the present disclosure. As illustrated in FIG. 17, the display substrate 500 includes a driving substrate 510, the driving substrate 510 includes a driving circuit 514, the driving circuit 514 is electrically connected with an anode 525, to emit light with the light emitting functional layer 540 in contact with the anode 525. It should be noted that the structures of the anode, the light emitting functional layer and the encapsulation layer in the display substrate illustrated in FIG. 17 may adopt relevant designs in the display substrate provided in the above-mentioned embodiments.

For example, as illustrated in FIG. 17, the driving substrate 510 includes a transistor T, and the transistor T includes a gate electrode G, a source electrode S and a drain electrode D. The three electrodes correspond to three electrode connection parts respectively. For example, the gate electrode G is electrically connected to a gate electrode connection part 610g, the source electrode S is electrically connected to a source electrode connecting part 610s, and the drain electrode D is electrically connected to a drain electrode connecting part 610d. For example, all the three electrodes are electrically connected with the three electrode connecting parts correspondingly through tungsten via holes 605.

For example, as illustrated in FIG. 17, the source electrode connection part 610s is electrically connected with the anode 525 through the tungsten via hole. For example, the source electrode connection part 610s is electrically connected with the metal reflection layer 593 through the tungsten via hole, at the same time, the anode 525 is electrically connected with the metal reflective layer 593 through a via hole 624a in the inorganic insulating layer 624. In a case that the transistor T is in a conducting state, an electrical signal provided by the power line can be transmitted to the anode 525 through the source electrode S of the transistor T, the source electrode connection part 610s, and the metal reflective layer 593. Due to a voltage difference formed between the anode 525 and the cathode 550, an electric field is formed between the anode 525 and the cathode 550, holes and electrons are injected into the light emitting functional layer 540, and the light emitting functional layer 540 emits light under the action of the electric field. It can be understood that in the transistor T, positions of the source electrode S and the drain electrode D can be interchanged (correspondingly, positions of the source electrode connection part 610s and the drain electrode connection part 610d may also be interchanged).

For example, materials of the gate electrode connection part 610g, the source electrode connection part 610s, and the drain electrode connection part 610d may include a metal material. For example, as illustrated in FIG. 17, an anti-oxidation layer 607 may be arranged on at least one side (for example, an upper side and/or a lower side) of each of the gate electrode connection part 610g, the source electrode connection part 610s and the drain electrode connection part 610d, in this way, these electrode connection parts can be effectively prevented from being oxidized, and the electrical conductivity of these electrode connection parts can be improved.

For example, as illustrated in FIG. 17, the display substrate 500 further includes a pixel definition layer 530 for definition the light emitting functional layer 540, the pixel definition layer 530 defines the organic light emitting functional layer 540 in the pixel opening 535 of the organic light emitting functional layer 540, and crosstalk between sub-pixels adjacent to each other is avoided.

It should be noted that, in the display substrate 500 shown in FIG. 17, the via hole 624a in the inorganic insulating layer 624 may be arranged between the anode 525 and an edge region of the metal reflective layer 593. For example, in some examples, an orthographic projection of the light emitting functional layer 540 on the driving substrate 510 and an orthographic projection of the via hole 624a on the driving substrate 510 are both located within an orthographic projection of the metal reflective layer 593 on the driving substrate 510, at the same time, the orthographic projection of the light emitting functional layer 540 on the driving substrate 510 is not overlap with the orthographic projection of the via hole 624a on the driving substrate 510, so that in a case that the metal reflective layer reflects the light emitted by the light emitting functional layer 540, the via hole 624a has little influence on the reflection process.

Figure 18:
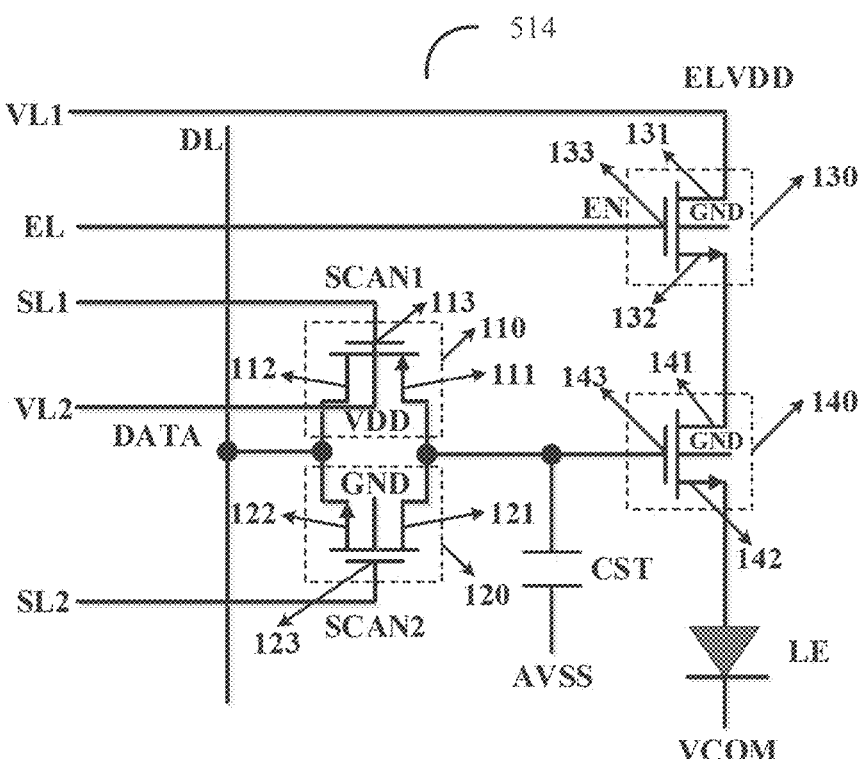
FIG. 18 is an equivalent schematic diagram of a driving circuit in a display substrate provided by an embodiment of the present disclosure.
Figure 19:
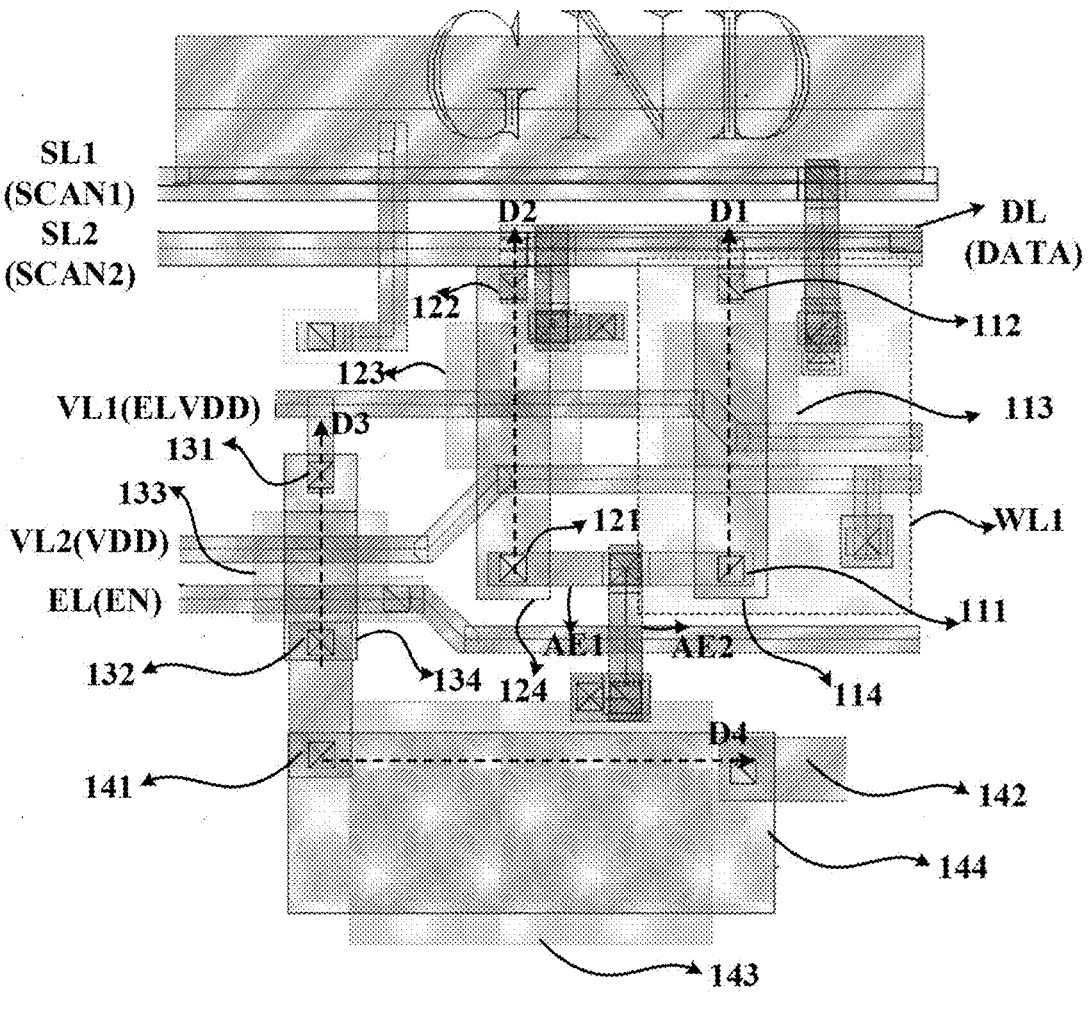
FIG. 19 is a planar schematic diagram of a driving circuit in a display substrate provided by an embodiment of the present disclosure.

FIG. 18 is an equivalent schematic diagram of a driving circuit in a display substrate provided by an embodiment of the present disclosure; and FIG. 19 is a planar schematic diagram of a driving circuit in a display substrate provided by an embodiment of the present disclosure. As illustrated in FIG. 18 and FIG. 19, the driving circuit 514 includes a driving transistor 140, a first transistor 110, a second transistor 120 and a third transistor 130. It should be noted that, in some embodiments, the driving circuit may also not include a third transistor 130, which is not limited in the embodiment of the present disclosure.

For example, the driving transistor 140 includes a control electrode 143, a first electrode 141 and a second electrode 142, the driving transistor 140 is configured to control a driving current flowing through the first electrode 141 of the driving transistor 140 and the second electrode 142 of the driving transistor 140 for driving the light emitting element LE to emit light according to a voltage of the control electrode 143 of the driving transistor 140. The light emitting element LE can emit light of different intensities according to a magnitude of the driving current.

It should be noted that, the source electrode and the drain electrode of the transistor used in the embodiments of the present disclosure may be symmetrical in structure, thus the source electrode and the drain electrode can be indistinguishable in structure. In the embodiments of the present disclosure, in order to distinguish the two electrodes of the transistor except the gate electrode, one electrode is a first electrode and the other electrode is a second electrode, thus in the embodiments of the present disclosure, the first electrodes and the second electrodes of all or part of the transistors can be interchanged as required. For example, the first electrode of the transistor described in the embodiments of the present disclosure may be the source electrode, and the second electrode may be the drain electrode; or the first electrode of the transistor is the drain electrode and the second electrode is the source electrode. The following embodiments are described by taking the first electrode of the transistor as the drain electrode and the second electrode as the source electrode as examples, which are omitted herein.

For example, the first transistor 110 is connected with the control electrode 143 of the driving transistor 140, and is configured to write a data signal DATA to the control electrode 143 of the driving transistor 140 in response to the first scan signal SCAN1.

For example, the second transistor 120 is connected with the control electrode 143 of the driving transistor 140, and is configured to write a data signal DATA into the control electrode 143 of the driving transistor 140 in response to the second scan signal SCAN2.

For example, the third transistor 130 is connected with the first electrode 141 of the driving transistor 140, and is configured to apply a first power supply voltage ELVDD to the first electrode 141 of the driving transistor 140 in response to the light emitting control signal EN. For example, the first power supply voltage ELVDD in the embodiment of the present disclosure is a high-level voltage, for example, the first power supply voltage ELVDD is 5V.

As illustrated in FIG. 18, in some embodiments, the first electrode 111 (for example, the drain electrode) of the first transistor 110 and the first electrode 121 (for example, the drain electrode) of the second transistor 120 are connected to obtain a common electrode, and are connected with the control electrode 143 of the driving transistor 140 through the common electrode.

In the above embodiments, the first scan signal line SL1, the second scan signal line SL2, the data line DL, the first power supply voltage line VL1, and the light emitting control line EL are also provided to provide corresponding electrical signals. The control electrode 113 of the first transistor 110 is configured to receive a first scan signal SCAN1 from the first scan signal line SL1, and the second electrode 112 (for example, the source electrode) of the first transistor 110 is configured to receive a data signal DATA from the data line DL. The control electrode 123 of the second transistor 120 is configured to receive a second scan signal SCAN2 from the second scan signal line SL2, and the second electrode 122 (for example, the source electrode) of the second transistor 120 is configured to receive a data signal DATA from the data line DL. The control electrode 133 of the third transistor 130 is configured to receive a light emitting control signal EN from the light emitting control line EL, the first electrode 131 (for example, the drain electrode) of the third transistor 130 is configured to receive a first power supply voltage ELVDD from the first power supply voltage line VL1, and the second electrode 132 (for example, the source electrode) of the third transistor 130 is connected with the first electrode 141 (for example, the drain electrode) of the driving transistor 140.

The second electrode 142 (for example, the source electrode) of the driving transistor 140 is configured to be connected with the first electrode of the light emitting element LE. For example, in a case that the light emitting element LE is an OLED, the second electrode 142 of the driving transistor 140 may be connected with the anode of the OLED. For example, the second electrode of the light emitting element LE is configured to receive a fourth supply voltage VCOM. For example, the fourth power supply voltage VCOM in the embodiment of the present disclosure is a low-level voltage.

For example, in an embodiment of the present disclosure, the light emitting element LE can use OLED, in a case that a plurality of pixel units constitute a pixel array in a display panel, the second electrodes (for example, the cathodes) of the plurality of light emitting elements OLED in the plurality of pixel units may be electrically connected together, such as connected to a same electrode separately or integrally formed, to receive the fourth power supply voltage VCOM, that is, the plurality of light emitting elements OLEDs in the plurality of pixel units are connected by a common cathode.

For example, the light emitting element OLED may be of various types, such as top emission and bottom emission, and may emit red light, green light and blue light, or white light, which are not limited in the embodiments of the present disclosure.

For example, as illustrated in FIG. 18, the driving circuit further includes a storage capacitor CST, which is used to store a data signal DATA written to the control electrode 143 of the driving transistor 140, so that the driving transistor 140 can control a magnitude of the driving current for driving the light emitting element LE according to the voltage of the stored data signal DATA. The first electrode of the storage capacitor CST is connected with the control electrode 143 of the driving transistor 140, and the second electrode of the storage capacitor CST is configured to receive a third power supply voltage AVSS. For example, the third power supply voltage AVSS in the embodiment of the present disclosure is a low-level voltage. It should be noted that, in the embodiments of the present disclosure, the third power supply voltage AVSS may be the same as the fourth power supply voltage VCOM, for example, both the third power supply voltage AVSS and the fourth power supply voltage VCOM may be grounded, the embodiments of the present disclosure include but are not limited to this.

As illustrated in FIG. 18, in some embodiments of the present disclosure, the first transistor 110 can be a P-type MOS transistor, the second transistor 120, the third transistor 130 and the driving transistor 140 can be N-type MOS transistors, for example, the first transistor 110, the second transistor 120, the third transistor 130, and the driving transistor 140 are formed in the substrate.

For example, as illustrated in FIG. 18, the third electrode of the first transistor 110 is configured to receive the second supply voltage VDD, for example, the third electrode of the first transistor 110 is connected with a second power supply voltage line VL2 to receive a second power supply voltage VDD.

For example, the third electrode of the second transistor 120, the third electrode of the third transistor 130, and the third electrode of the driving transistor 140 are configured to be grounded (GND). It should be noted that, in the embodiments of the present disclosure, the third electrode of a transistor is an electrode opposite to the control electrode (the gate electrode) 113 of the transistor, the following embodiments are the same, which are omitted herein.

In the embodiments of the present disclosure, since the first transistor 110 and the second transistor 120 use MOS transistors having opposite semiconductor types, the first transistor 110 and the second transistor 120 may constitute a transmission gate switch having complementary characteristics. In this case, for example, the first scan signal SCAN1 supplied to the first transistor 110 and the second scan signal SCAN2 supplied to the second transistor 120 may be inverted signals from each other, in this way, it can be ensured that one of the first transistor 110 and the second transistor 120 is always turned on at the same time, so that the data signal DATA can be transmitted to the storage capacitor CST without voltage loss, and the reliability and stability of the driving circuit can be improved.

As illustrated in FIG. 19, in the embodiment of the present disclosure, a direction along the first electrode 111 of the first transistor 110 to the second electrode 112 of the first transistor 110 is referred to as the first direction D1, a direction along the first electrode 121 of the second transistor 120 to the second electrode 122 of the second transistor 120 is referred to as the second direction D2, a direction along the first electrode 131 of the third transistor 130 to the second electrode 132 of the third transistor 130 is referred to as the third direction D3, and a direction along the first electrode 141 of the driving transistor 140 to the second electrode 142 of the driving transistor 140 is referred to as the fourth direction D4. It should be noted that the first direction in FIG. 1 to FIG. 15 is different from the first direction provided in the present embodiment, and the second direction in FIG. 1 to FIG. 15 may be the same as or different from the second direction provided in the present embodiment.

For example, at least one of the first direction D1 and second direction D2 intersects the fourth direction D4. For example, in a case where the driving circuit includes the third transistor 130, at least one of the first direction D1, the second direction D2, and the third direction D3 intersects the fourth direction D4. For example, the fourth direction D4 is a lateral direction from left to right in FIG. 19.

In the driving circuit, since a size of the driving transistor 140 is generally larger than sizes of other switching transistors (for example, the first transistor 110, the second transistor 120 and the third transistor 130), in a case that positions of the transistors are arranged, the driving transistors 140 may be arranged along the fourth direction D4, at the same time, at least one of the first direction D1, the second direction D2 and the third direction D3 intersects the fourth direction D4, in this way, the layout of the four transistors can be made more compact, so that a layout area occupied by the display substrate 500 can be reduced, and thus the display substrate 500 can be more easily to achieve high PPI.

In some embodiments of the present disclosure, both the first direction D1 and the second direction D2 can be made to intersect with the fourth direction D4; for another example, the first direction D1, the second direction D2, and the third direction D3 may all intersect the fourth direction D4. For example, as illustrated in FIG. 19, the fourth direction D4 is the lateral direction, the first direction D1, the second direction D2 and the third direction D3 are all longitudinal directions perpendicular to the lateral direction in FIG. 3.

For example, in some embodiments of the present disclosure, the first direction D1 and the second direction D2 are both perpendicular to the fourth direction D4; for another example, the first direction D1, the second direction D2, and the third direction D3 are all perpendicular to the fourth direction D4. For a case where a plurality of pixel units in the display region of the display device are arranged in multiple rows and multiple columns, in this way, the layout of the display substrate 500 can be made more compact, so that the layout area occupied by the display substrate 500 can be further reduced, and thus the display substrate 500 can be more easily to achieve high PPI.

For example, as illustrated in FIG. 19, the first transistor 110 includes a first active region 114 extending along the first direction D1, and the first active region 114 includes a first electrode 111 of the first transistor 110 and a second electrode 112 of the first transistor 110, and a channel region formed between the first electrode 111 of the first transistor 110 and the second electrode 112 of the first transistor 110.

The second transistor 120 includes a second active region 124 extending along the second direction D2, and the second active region 124 includes a first electrode 121 of the second transistor 120, a second electrode 122 of the second transistor 120, and a channel region formed between the first electrode 121 of the second transistor 120 and the second electrode 122 of the second transistor 120.

The third transistor 130 includes a third active region 134 extending along the third direction D3, the third active region 134 includes a first electrode 131 of the third transistor 130, a second electrode 132 of the third transistor 130, and a channel region formed between the first electrode 131 of the third transistor 130 and the second electrode 132 of the third transistor 130.

The driving transistor 140 includes a fourth active region 144 extending along the fourth direction D4, and the fourth active region 144 includes a first electrode 141 of the fourth transistor 140, a second electrode 142 of the fourth transistor 140, and a channel region formed between the first electrode 141 of the fourth transistor 140 and the second electrode 142 of the fourth transistor 140.

For example, the substrate in the display substrate 500 provided by the embodiment of the present disclosure is a silicon-based substrate, the first active region 114, the second active region 124, the third active region 134 and the fourth active region 144 mentioned above are all doped regions in the silicon-based substrate, these doped regions are obtained, for example, by an ion implantation process or an ion diffusion process, and for amorphous silicon, P-type doping can be achieved by doping boron (B), N-type doping can be achieved by doping phosphorus (P) or arsenic (As), which are not limited by the embodiments of the present disclosure.

For example, in some embodiments of the present disclosure, doping types of the first active region 114 and the second active region 124 are opposite. For example, the doping type of the first active region 114 is P-type, and the doping type of the second active region 124 is N-type.

As illustrated in FIG. 19, two ends of the first active region 114 and two ends of the second active region 124 are aligned with each other in the fourth direction D4, and for example, the two ends of the first active region 114 and the two ends of the second active region 124 are arranged adjacent to each other. In this way, the layout design of the display substrate 500 can be simplified.

A line connecting an edge of the first active region 114 along the first direction D1 and an edge of the second active region 124 along the second direction D2 is parallel to the fourth direction D4; and a line connecting the other edge of the first active region 114 along the first direction D1 and the other edge of the second active region 124 along the second direction D2 is parallel to the fourth direction D4. In this way, the layout design of the display substrate 500 can be simplified.

Compared with a silicon-based analog CMOS circuit for non-display applications, a driving current for the light emitting element LE in the display substrate 500 provided by the embodiment of the present disclosure is 1 to 2 orders of magnitude smaller. A current characteristic of the driving transistor 140 in the saturated state is:

$$I_D = \frac{1}{2}\frac{W}{L}K(V_{GS4} - V_{th})^2$$

in which, $I_D$ is the driving current provided by the driving transistor 140, W/L is a width to length ratio of the driving transistor 140, K is a constant value, $V_{GS4}$ is a voltage difference between the gate electrode and source electrode of the drive transistor 140, Vth is a threshold voltage of the driving transistor 140.

It can be seen from the above formula that to achieve a lower driving current, the L value of the driving transistor 140 should be increased in the size design, which is not conducive to reducing the layout area of the display substrate 500 using the driving transistor 140.

The driving circuit 514 provided by some embodiments of the present disclosure can improve or avoid the above problems by adjusting a relative relationship between the doping concentrations of the first active region 114, the second active region 124, the third active region 134 and the fourth active region 144.

For example, the doping concentration of the fourth active region 144 is smaller than the doping concentration of the third active region 134. For example, the doping concentration of the third active region 134 is about $10^{17}$ cm$^{-3}$, the doping concentration of the fourth active region 144 is about $10^{13}$ cm$^{-3}$, and the doping concentration of the fourth active region 144 is 4 orders of magnitude smaller than the doping concentration of the third active region 134. In the embodiment of the present disclosure, by reducing the doping concentration of the fourth active region 144, without changing the size of the driving transistor 140 (for example, the width to length ratio W/L remains unchanged), the driving transistor 140 can be made to output a smaller driving current, the output driving current changes more gently, so that a gray scale value in a case that the driving circuit of the driving transistor 140 is used to drive the light emitting element LE (eg, OLED) to emit light can obtain better uniformity.

For example, in the display substrate 500 provided by some embodiments of the present disclosure, the doping concentration of at least one of the first active region 114 and the second active region 124 is greater than the doping concentration of the third active region 134.

For example, both the doping concentration of the first active region 114 and the doping concentration of the second active region 124 are greater than the doping concentration of the third active region. For example, the doping concentration of the first active region 114 and the second active region 124 is about $10^{20}$ cm$^{-3}$, in this case, both the doping concentration of the first active region 114 and the doping concentration of the second active region 124 are three orders of magnitude greater than the doping concentration of the third active region 134.

As illustrated in FIG. 18, the first transistor 110 and the second transistor 120 are used as switching transistors in the driving circuit, thus good switching characteristics are required. In a case that the doping concentration of the first active region 114 or/and the doping concentration of the second active region 124 is relatively large, a larger driving current can be obtained and change of the driving current is faster, so that at least one of the first transistor 110 and the second transistor 120 has a better switching characteristics.

For example, in the embodiment of the present disclosure, the first transistor 110 is a first semiconductor type MOS transistor, the second transistor, the third transistor and the driving transistor are all second semiconductor type MOS transistors, the first semiconductor type and the second semiconductor type are opposite. For example, the first semiconductor type is P-type, and the second semiconductor type is N-type, and the embodiments of the present disclosure include but are not limited to this.

As illustrated in FIG. 19, the display substrate 500 provided by some embodiments of the present disclosure further includes a first scan signal line SL1 for transmitting the first scan signal SCAN1 and a second scan signal line SL2 for transmitting the second scan signal SCAN2, and the first scan signal line SL1 and the second scan signal line SL2 are arranged in parallel.

For example, the first scan signal line SL1 is connected with the control electrode 113 of the first transistor 110 to provide the first scan signal SCAN1, and the second scan signal line SL2 is connected with the control electrode 123 of the second transistor 120 to provide the second scan signal SCAN2.

For example, both the extending direction of the first scanning signal line SL1 and the extending direction the second scanning signal line SL2 are parallel to the fourth direction D4. An orthographic projection of the first scan signal line SL1 on the substrate is parallel to an orthographic projection of the second scan signal line SL2 on the substrate, for example, both the orthographic projection of the first scan signal line SL1 on the substrate and the orthographic projection of the second scan signal line SL2 on the substrate are all parallel to the fourth direction D4.

For example, a region where the orthographic projection of the driving circuit 514 on the substrate 512 is located is a pixel region, and the first scan signal line SL1 and the second scan signal line SL2 are juxtaposed on one side of the pixel region.

As illustrated in FIG. 19, the display substrate 500 provided by some embodiments of the present disclosure further includes a data line DL for transmitting a data signal DATA, and the orthographic projection of the second scan signal line SL2 on the substrate is at least partially overlapped with an orthographic projection of the data line DL on the substrate. For example, the second scan signal line SL2 is overlapped with the data line DL in a direction perpendicular to the substrate. For example, as illustrated in FIG. 19, the plane on which FIG. 19 is located can be regarded as a plane on which the substrate is located, so that perpendicular to the substrate is perpendicular to the plane where FIG. 19 is located. In the embodiment of the present disclosure, by making the second scan signal line SL2 and the data line DT overlap in the direction perpendicular to the substrate, the data line DL may not occupy additional layout area, so that the layout area occupied by the display substrate 500 can be further reduced, which is more conducive to realizing high PPI.

As illustrated in FIG. 19, the display substrate 500 provided by some embodiments of the present disclosure further includes a first power supply voltage line VL1 for transmitting the first power supply voltage ELVDD and a light emitting control line EL for transmitting the light emitting control signal EN.

For example, partial extending directions of the first power supply voltage line VL1 and the light emitting control line EL are parallel to the fourth direction D4, the orthographic projection of the first scan signal line SL1, the orthographic projection of the second scan signal line SL2, the orthographic projection of the first power supply voltage line VL1 and the orthographic projection of the light emitting control line EL on the substrate are sequentially arranged along a direction perpendicular to the fourth direction D4.

It should be noted that, in the display substrate 500 provided by some embodiments of the present disclosure, as illustrated in FIG. 19, so that the orthographic projection of the first power supply voltage line VL1 on the substrate is located between the orthographic projection of the second scanning signal line SL2 on the substrate and the orthographic projection of the light emitting control line EL on the substrate, since the first power supply voltage ELVDD transmitted by the first power supply voltage line VL1 is a DC signal, and the second scan signal SCAN2 transmitted by the second scan signal line SL2 and the light emitting control signal EN transmitted by the light emitting control line EL are both jump signals, the above arrangement can effectively shield mutual interference between the second scan signal SCAN2 and the light emitting control signal EN.

As illustrated in FIG. 19, the display substrate 500 provided by some embodiments of the present disclosure further includes a second power supply voltage line VL2 for transmitting the second power supply voltage VDD, the third electrode of the first transistor 110 is electrically connected with the second power supply voltage line VL2 to receive the second power supply voltage VDD. For example, the second power supply voltage VDD in the embodiment of the present disclosure is a high-level voltage, for example, the second power supply voltage is 5V.

For example, the first transistor 110 is a P-type MOS transistor, and a channel region of the first transistor 110 is P-type doped. As illustrated in FIG. 19, the third electrode opposite to the control electrode (the gate electrode) 113 of the first transistor 110 receives a second power supply voltage VDD. For example, the second transistor 120, the third transistor 130 and the driving transistor 140 are all N-type MOS transistors, channel regions of the second transistor 120, the third transistor 130 and the driving transistor 140 are N-type doped, and the third electrode of the second transistor 120, the third electrode of the third transistor 130 and the third electrode of the driving transistor 140 are all configured to be grounded (GND).

For example, an orthographic projection of the second power supply voltage line VL2 on the substrate is located between the orthographic projection of the first power supply voltage line VL1 on the substrate and the orthographic projection of the light emitting control line EL on the substrate, and a partial extending direction of the second power supply voltage line VL2 is parallel to the fourth direction D4.

As illustrated in FIG. 19, in a case that the second power supply voltage line VL2 extends along the fourth direction D4, a bending region is provided; in addition, in a case that the light emitting control line EL extends along the fourth direction D4, a bending region is also provided, and bending directions of the second power supply voltage line VL2 and the light emitting control line EL are different. By adopting this wiring manner, for example, a layout space can be reserved for a first transfer electrode AE1 described below.

For example, as illustrated in FIG. 19, both the first transistor 110 and the second transistor 120 are arranged between the second scan signal line SL2 and the light emitting control line EL, the first transistor 110 is intersected with the first power supply voltage line VL1 and the second power supply voltage line VL2, and the second transistor 120 is intersected with the first power supply voltage line VL1 and the second power supply voltage line VL2.

For example, both the orthographic projection of the first active region 114 of the first transistor 110 on the substrate and the orthographic projection of the second active region 124 of the second transistor 120 on the substrate are located between the orthographic projection of the second scan signal line SL2 on the substrate and the orthographic projection of the light emitting control line EL on the substrate.

The orthographic projection of the first active region 114 of the first transistor 110 on the substrate is intersected with the orthographic projection of the first power supply voltage line VL1 on the substrate, and the orthographic projection of the first active region 114 of the first transistor 110 on the substrate is intersected with the orthographic projection of the second power supply voltage line VL2 on the substrate.

The orthographic projection of the second active region 124 of the second transistor 120 on the substrate is intersected with the orthographic projection of the first power supply voltage line VL1 on the substrate, and the orthographic projection of the second active region 124 of the second transistor 120 on the substrate is intersected with the orthographic projection of the second power supply voltage line VL2 on the substrate.

As illustrated in FIG. 19, the display substrate 500 provided by some embodiments of the present disclosure further includes a first transfer electrode AE1 arranged on a first side of the light emitting control line EL, and a second transfer electrode AE2 extending from the first side of the light emitting control line EL to a second side of the light emitting control line EL.

For example, an orthographic projection of the second transfer electrode AE2 on the substrate is intersected with the orthographic projection of the light emitting control line EL on the substrate. Two ends of the first transfer electrode AE1 are respectively electrically connected with the first electrode 111 of the first transistor 110 and the first electrode 121 of the second transistor 120, the first transfer electrode AE1 and the second transfer electrode AE2 are electrically connected, and the second transfer electrode AE2 is electrically connected with the control electrode 143 of the driving transistor 140.

For example, an extending direction of the second transfer electrode AE2 is perpendicular to an extending direction of the first transfer electrode AE1, and is perpendicular to the fourth direction D4.

Since the second transfer electrode AE2 is connected with the storage capacitor CST, during the operation of the driving circuit, the level on the second transfer electrode AE2 may fluctuate greatly, and the fluctuation may cause crosstalk to the first power supply voltage line VL1, to generate noise. In the display substrate 500 provided by the embodiment of the present disclosure, the first power supply voltage line VL1 and the second transfer electrode AE2 are spaced apart by the second power supply voltage line VL2, so that the crosstalk caused by the level fluctuation on the second transfer electrode AE2 to the first power supply voltage line VL1 can be reduced, and the noise can be isolated.

In addition, in the display substrate 500 provided by some embodiments of the present disclosure, by extending the first active region 114 of the first transistor 110 and extending the second active region 124 of the second transistor 120, a wiring channel is reserved for the second power supply voltage line VL2.

For example, a layout size of the driving circuit (a rectangular shape) provided by the embodiments of the present disclosure is approximately 4.5 um×2.9 um.

FIGS. 20A to 20E are planar schematic diagrams showing layout of various layers of the display substrate illustrated in FIG. 19, respectively.

Figure 20A:
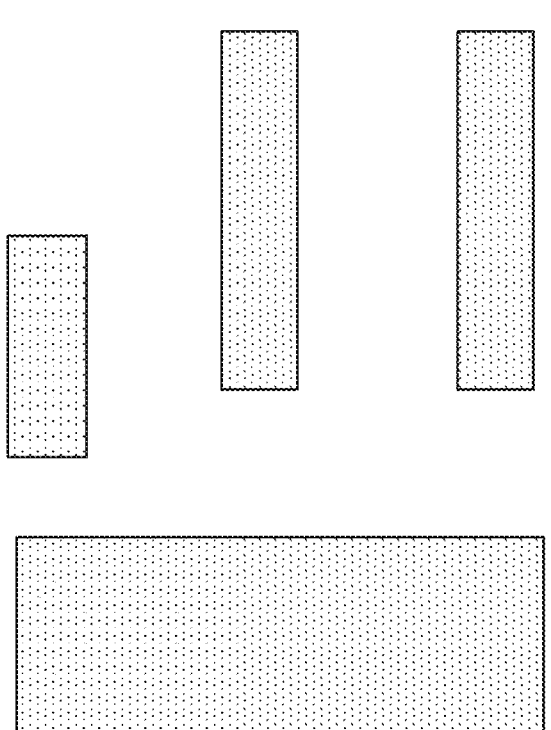
FIGS. 20A to 20E are planar schematic diagrams showing layout of various layers of the display substrate illustrated in FIG. 19, respectively.

FIG. 20A shows the first active region 114 of the first transistor 110, the second active region 124 of the second transistor 120, the third active region 134 of the third transistor 130, and the fourth active region 144 of the driving transistor 140, and the layers illustrated in FIG. 4A may be referred to as active display (AA) layers.

Figure 20B:
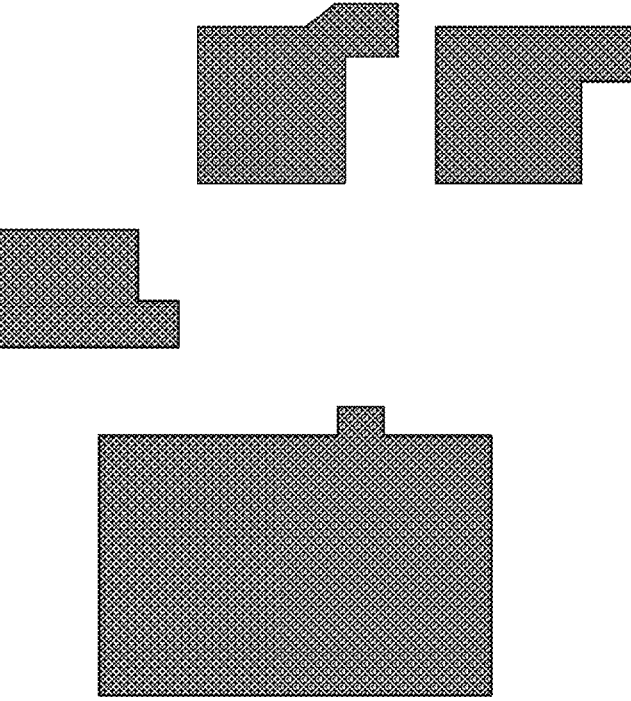

FIG. 20B shows the control electrode 113 of the first transistor 110, the control electrode 123 of the second transistor 120, the control electrode 133 of the third transistor 130, and the control electrode 143 of the driving transistor 140. The layer illustrated in FIG. 4B may be referred to as a first conductive layer, which will be further described below. For example, material of the first conductive layer can be polysilicon.

Figure 20C:
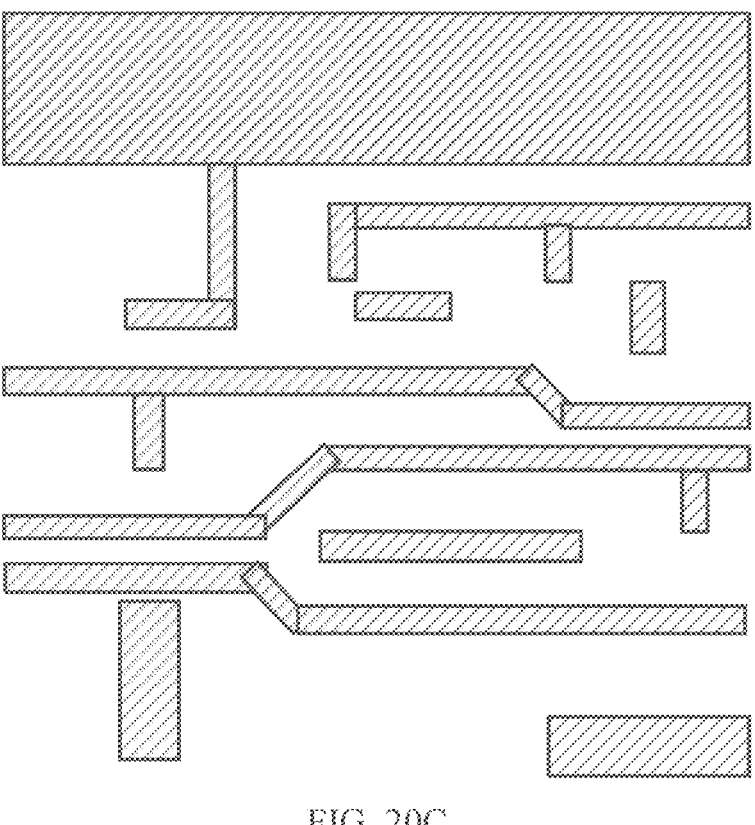

FIG. 20C shows the first power supply voltage line VL1, the second power supply voltage line VL2, the light emitting control line EL, the data line DL, a ground line GND and the first transfer electrode AE1. The layer illustrated in FIG. 20C may be referred to as a first metal layer (metal1).

Figure 20D:
Figure 20D:

FIG. 20D shows the second transfer electrode AE2, an electrode connecting the first scan signal line SL1 and the first transistor 110, and an electrode connecting the second scan signal line SL2 and the second transistor 120. The layer illustrated in FIG. 20D may be referred to as a second metal layer (metal2).

Figure 20E:
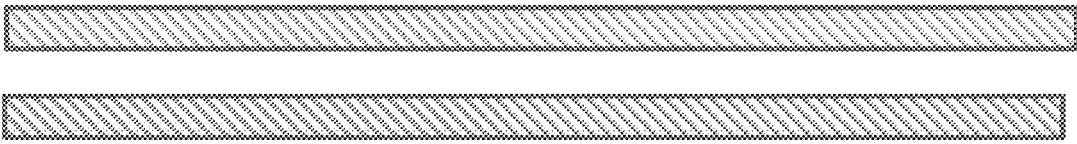

FIG. 20E shows the first scan signal line SL1 and the second scan signal line SL2, and the layer illustrated in FIG. 20E may be referred to as a third metal layer (metal3).

It should be noted that, in the embodiments of the present disclosure, for the sake of clarity, the storage capacitor CST is not shown in FIG. 19. The storage capacitor CST shown in FIG. 18 will be further described below with reference to FIGS. 21 to 23E.

Figure 21:
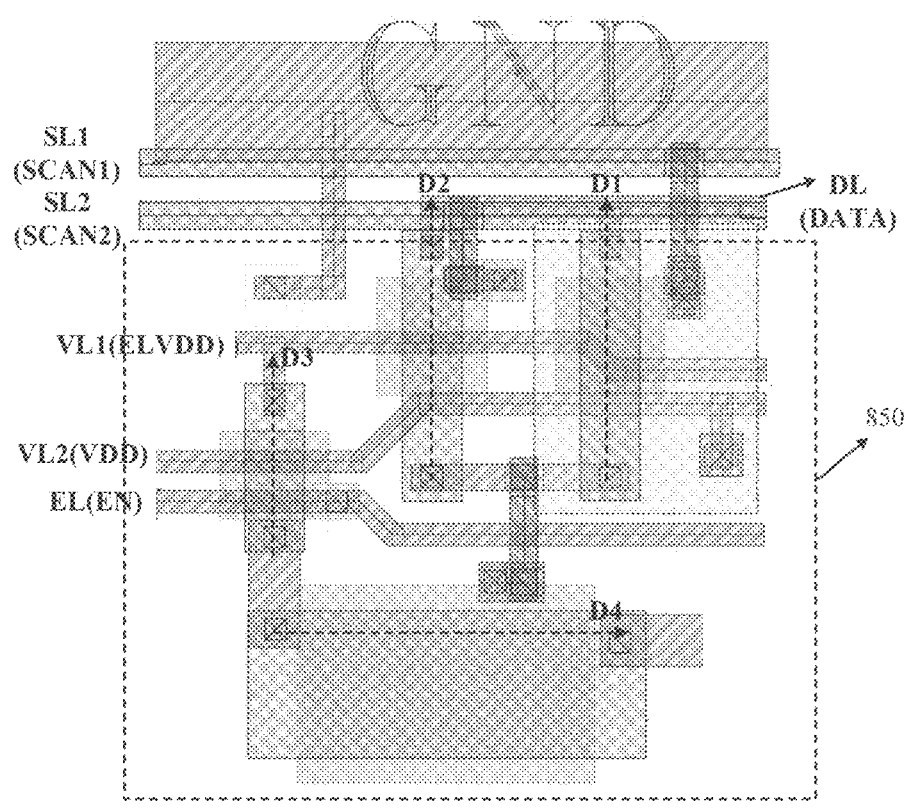
FIG. 21 is a schematic diagram of a region of a display substrate for arranging storage capacitors provided by an embodiment of the present disclosure.

As illustrated in FIG. 21, the region 850 illustrated in FIG. 21 is an region where the storage capacitor CST is arranged. It should be noted that, for the sake of clarity, corresponding symbols of all structures are not illustrated in FIG. 21, omitted parts may refer to the corresponding symbols in FIG. 19.

Figure 22:
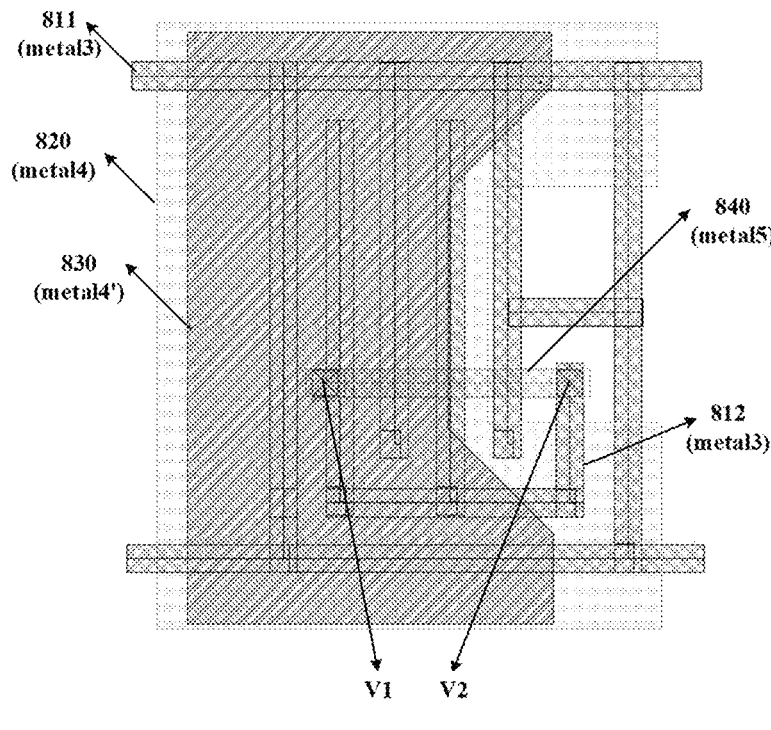
FIG. 22 is a layout diagram of a storage capacitor in a display substrate provided by an embodiment of the present disclosure.
Figure 23A:
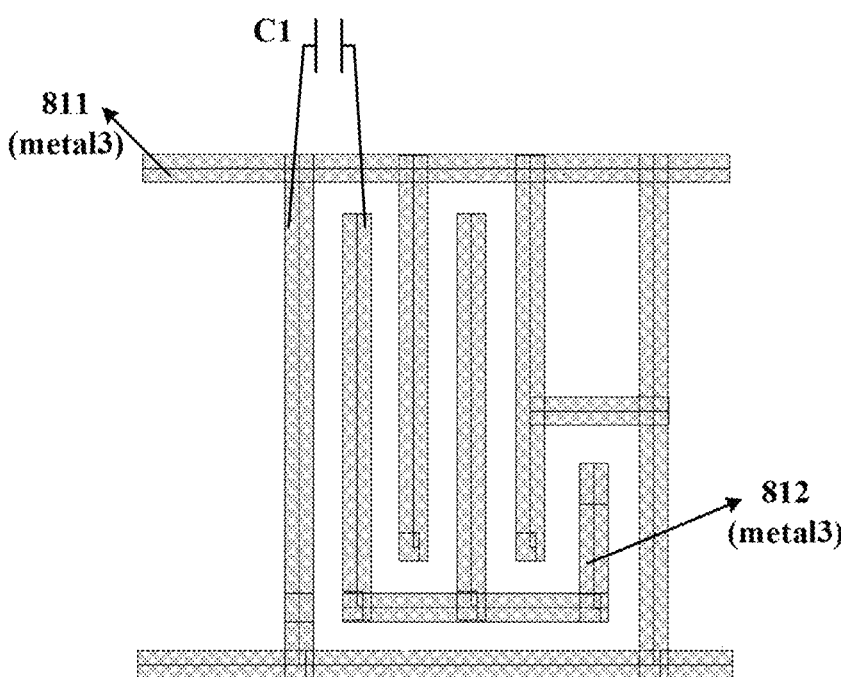
FIGS. 23A to 23D are planar schematic diagrams of layout of various layers in FIG. 22.
Figure 23B:
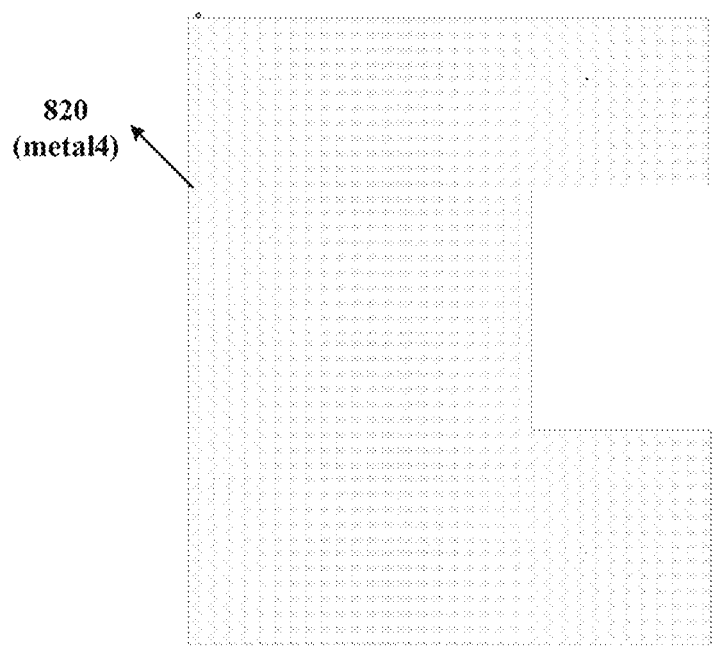
Figure 23C:
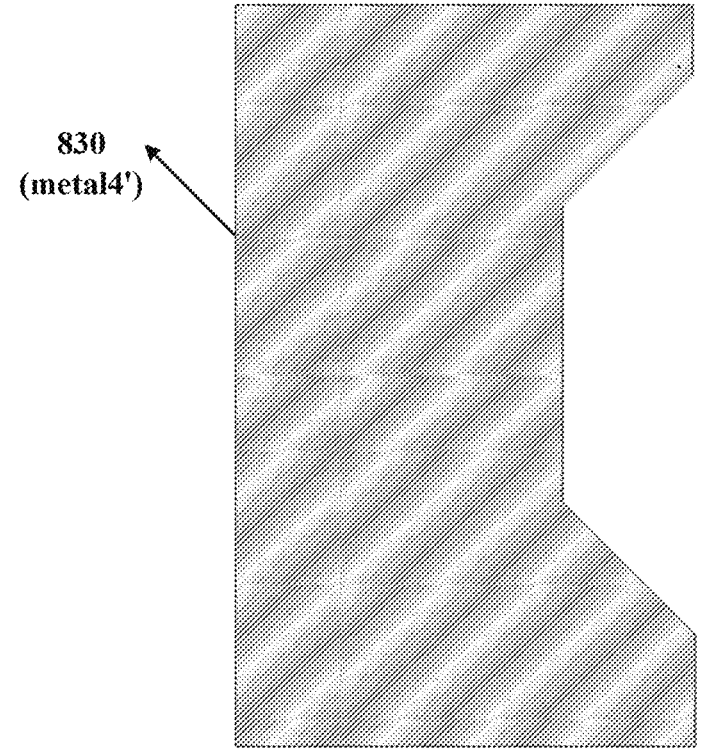
Figure 23D:
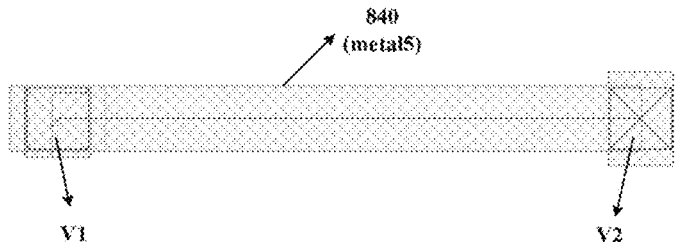
Figure 23E:
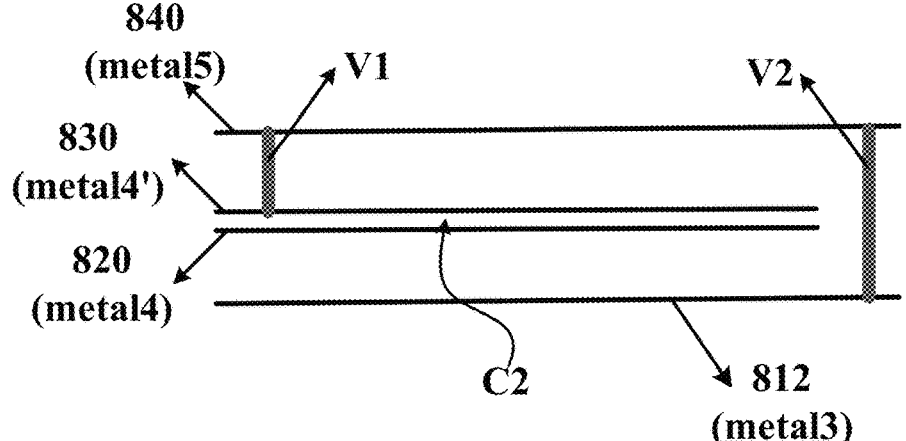
FIG. 23E is a cross-sectional schematic diagram of a storage capacitor in a display substrate provided by an embodiment of the present disclosure.

FIG. 22 is a layout diagram of the storage capacitor CST, FIGS. 23A to 23D are planar schematic diagrams of layout of various layers in FIG. 22, and FIG. 23E is a cross-sectional schematic diagram of the storage capacitor CST.

FIG. 22 shows a four-layer structure, which are the third metal layer metal3, the fourth metal layer metal4, an auxiliary metal layer metal4', and a fifth metal layer metal5, respectively; in addition, FIG. 22 further shows a first via hole V1 and a second via hole V2, the first via hole V1 and the second via hole V2 will be described below with reference to the cross-sectional schematic diagram, which is omitted herein.

For example, FIG. 23A shows the third metal layer metal3, for example, the third metal layer is a same layer as the layer illustrated in FIG. 20E. As illustrated in FIG. 23A, the third metal layer metal3 includes two parts, which are an electrode 811 serving as the first electrode of the first capacitor C1 and an electrode 812 serving as the second electrode of the first capacitor C1, respectively. For example, the electrode 811 is configured to receive a third supply voltage AVSS; the electrode 812 is electrically connected with the electrode 840 in the fifth metal layer metal5 through the second via hole V2, so that the electrode 812 is electrically connected with the control electrode 143 of the driving transistor 140.

The electrode 811 includes a plurality of striped electrodes, the electrode 812 includes a plurality of striped electrodes, the plurality of striped electrodes of the electrode 811 and the plurality of striped electrodes of the electrode 812 are alternately arranged with each other, and the electrode 811, the electrode 812 and a space between them form a first capacitor C1. For example, the first capacitor C1 is a part of the storage capacitor CST, for example, the first capacitor C1 and the following second capacitor C2 are connected in parallel to form a storage capacitor CST.

For example, FIG. 23B shows an electrode 820 at the fourth metal layer metal4, for example, the electrode 820 is a planar electrode, and the electrode 820 serves as the first electrode of the second capacitor C2.

For example, FIG. 23C shows an electrode 830 at the auxiliary metal layer metal4', for example, the electrode 830 is a planar electrode, and the electrode 830 serves as the second electrode of the second capacitor C2.

For example, FIG. 23D shows an electrode 840 at the fifth metal layer metal5, and the first via hole V1 and the second via hole V2.

FIG. 23E shows a cross-sectional schematic diagram of a partial structure of the above-mentioned storage capacitor CST, as illustrated in FIG. 23E, the electrode 840 on the fifth metal layer metal5 is electrically connected with the electrode 830 on the auxiliary metal layer metal4' through the first via hole V1; in addition, the electrode 840 on the fifth metal layer metal5 is electrically connected with the electrode 812 on the third metal layer metal3 through the second via hole V2. It should be noted that the second via hole V2 penetrates through the fourth metal layer metal4, which is not illustrated in FIG. 23E.

As illustrated in FIG. 23E, the electrode 820 located in the fourth metal layer metal4, the electrode 830 located in the auxiliary metal layer metal4' and a space between them form a second capacitor C2; for example, the above-mentioned first capacitor C1 and the second capacitor C2 are connected in parallel to form a storage capacitor CST.

In an embodiment of the present disclosure, as illustrated in FIG. 23E, an auxiliary metal layer metal4' is arranged between the fourth metal layer metal4 and the fifth metal layer metal5, so that a distance between the fourth metal layer metal4 and the auxiliary metal layer metal4' can be, for example, about ⅒ of a distance between the fourth metal layer metal4 and the fifth metal layer metal5, and thus a capacitance value within an unit area of the second capacitor C2 can be effectively increased.

As illustrated in FIG. 18 and FIG. 19, an embodiment of the present disclosure further provides a display substrate 500, which includes a substrate and at least one driving circuit formed on the substrate. The driving circuit includes a driving transistor 140, a first transistor 110, a second transistor 120 and a third transistor 130.

The driving transistor 140 includes a control electrode 143, a first electrode 141 and a second electrode 142, and is configured to control the driving current flowing through the first electrode 141 of the driving transistor 140 and the second electrode 142 of the driving transistor 140 for driving the light emitting element LE to emit light according to the voltage of the control electrode 143 of the driving transistor 140.

The first transistor 110 is connected with the control electrode 143 of the driving transistor 140, and is configured to write the data signal DATA to the control electrode 143 of the driving transistor 140 in response to the first scan signal SCAN1. The second transistor 120 is connected with the control electrode 143 of the driving transistor 140, and is configured to write the data signal DATA into the control electrode 143 of the driving transistor 140 in response to the second scan signal SCAN2. The third transistor 130 is connected with the first electrode 141 of the driving transistor 140, and is configured to apply the first power supply voltage ELVDD to the first electrode 141 of the driving transistor 140 in response to the light emitting control signal EN.

The display substrate 500 further includes a first scan signal line SL1 for transmitting the first scan signal SCAN1 and a second scan signal line SL2 for transmitting the second scan signal SCAN2, a first power supply voltage line VL1 for transmitting the first power supply voltage ELVDD and a light emitting control line EL for transmitting the light emitting control signal EN; an orthographic projection of the first scan signal line SL1, an orthographic projection of the second scan signal line SL2, an orthographic projection of the first power supply voltage line VL1 and an orthographic projection of the light emitting control line EL on the substrate are sequentially arranged along a direction perpendicular to the fourth direction D4.

For example, a direction along the first electrode 111 of the first transistor 110 to the second electrode 112 of the first transistor 110 is the first direction D1, a direction along the first electrode 121 of the second transistor 120 to the second electrode 122 of the second transistor 120 is the second direction D2, a direction along the first electrode 131 of the third transistor 130 to the second electrode 132 of the third transistor 130 is the third direction D3, a direction along the first electrode 141 of the driving transistor 140 to the second electrode 142 of the driving transistor 140 is the fourth direction D4, and the first direction D1, the second direction D2, and the third direction D3 are all intersected with the fourth direction D4. For example, the first direction D1, the second direction D2 and the third direction D3 are all perpendicular to the fourth direction D4.

The display substrate provided by at least one embodiment of the present disclosure, by an optimized layout and wiring design process in the design, a sub-pixel area of 5.45 um×13.6 um can be achieved, the high resolution (PPI) and the optimized arrangement of the pixel circuit array are realized, and the display effect is better.

Figure 24A:
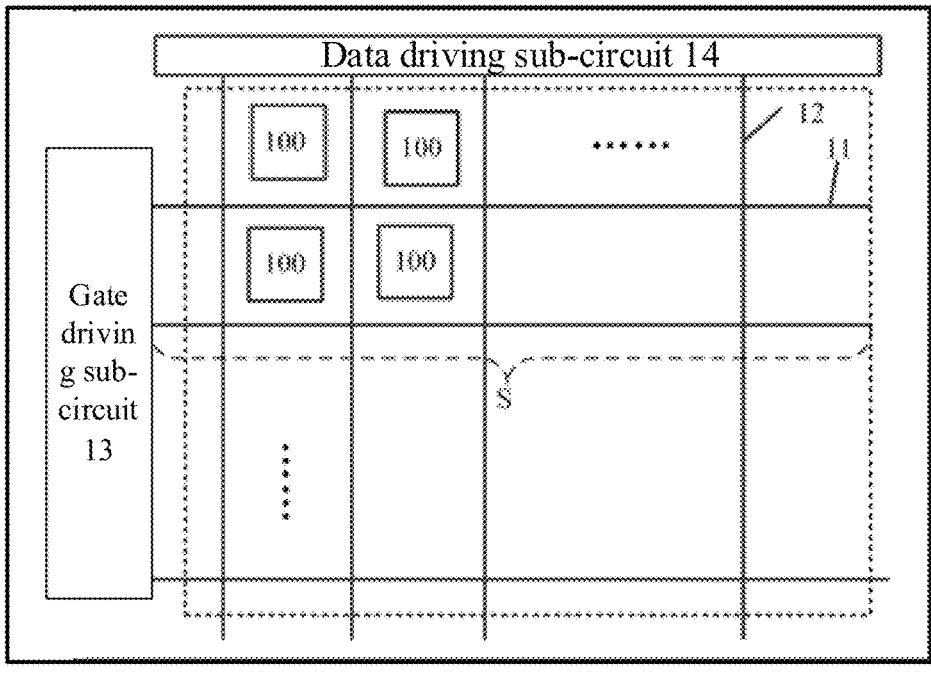
FIG. 24A is a block diagram of a display substrate provided by an embodiment of the present disclosure.

FIG. 24A is a block diagram of a display substrate provided by at least one embodiment of the present disclosure. As illustrated in FIG. 24A, the display substrate 10 includes a plurality of sub-pixels 100, a plurality of scan lines 11 and a plurality of data lines 12 that are distributed in an array. Each of the plurality of sub-pixels 100 includes a light emitting element and a pixel circuit that drives the light emitting element. The plurality of scan lines 11 and the plurality of data lines 12 are crossed each other in the display region to define a plurality of pixel regions distributed in an array, a pixel circuit of one sub-pixel 100 is arranged in each of the plurality of pixel regions. The pixel circuit is, for example, a conventional pixel circuit, such as a 2T1C (that is, two transistors and one capacitor) pixel circuit, 4T2C, 5T1C, 7T1C and other nTmC (n, m are positive integers) pixel circuits, and in different embodiments, the pixel circuit may further include a compensation sub-circuit, the compensation sub-circuit includes an internal compensation sub-circuit or an external compensation sub-circuit, the compensation sub-circuit may include transistors and capacitors. For example, as required, the pixel circuit may further include a reset circuit, a light emitting control sub-circuit and a detection circuit. For example, the display substrate may further include a gate driving sub-circuit 13 and a data driving sub-circuit 14 located in a non-display region. The gate driving sub-circuit 13 is connected with the pixel circuit through the scan line 11 to provide various scan signals, and the data driving sub-circuit 14 is connected with the pixel circuit through the data line 12 to provide data signals. In which, a positional relationship of the gate driving sub-circuit 13 and the data driving sub-circuit 14, and a positional relationship of the scan line 11 and the data line 12 in the display substrate illustrated in FIG. 24A are only examples, and the actual arrangement position can be designed as required.

For example, the display substrate 10 may further include a control circuit (not illustrated). For example, the control circuit is configured to control the data driving sub-circuit 14 to apply the data signal, and to control the gate driving sub-circuit to apply the scan signal. An example of such a control circuit is a timing control circuit (T-con). The control circuit can be in various forms, for example, including a processor and a memory, the memory includes executable code, and the processor runs the executable code to perform the above-mentioned detection method.

For example, the processor may be a central processing unit (CPU) or other form of processing device having data processing capabilities and/or instruction execution capabilities, for example, may include a microprocessor or a programmable logic controller (PLC).

For example, a storage device may include one or more computer program products, the computer program products may include various forms of computer-readable storage medium, such as volatile memory and/or non-volatile memory. Volatile memory may include, for example, random access memory (RAM) and/or cache memory (cache). Non-volatile memory may include, for example, read only memory (ROM), hard disk and flash memory. One or more computer program instructions may be stored on the computer-readable storage medium, the processor may perform functions desired by the program instructions. Various application programs and various data can also be stored in the computer-readable storage medium.

The pixel circuit may include a driving sub-circuit, a data writing sub-circuit, a compensation sub-circuit and a storage sub-circuit as required, and may also include a light-emitting control sub-circuit, and a reset circuit as required.

Figure 24B:
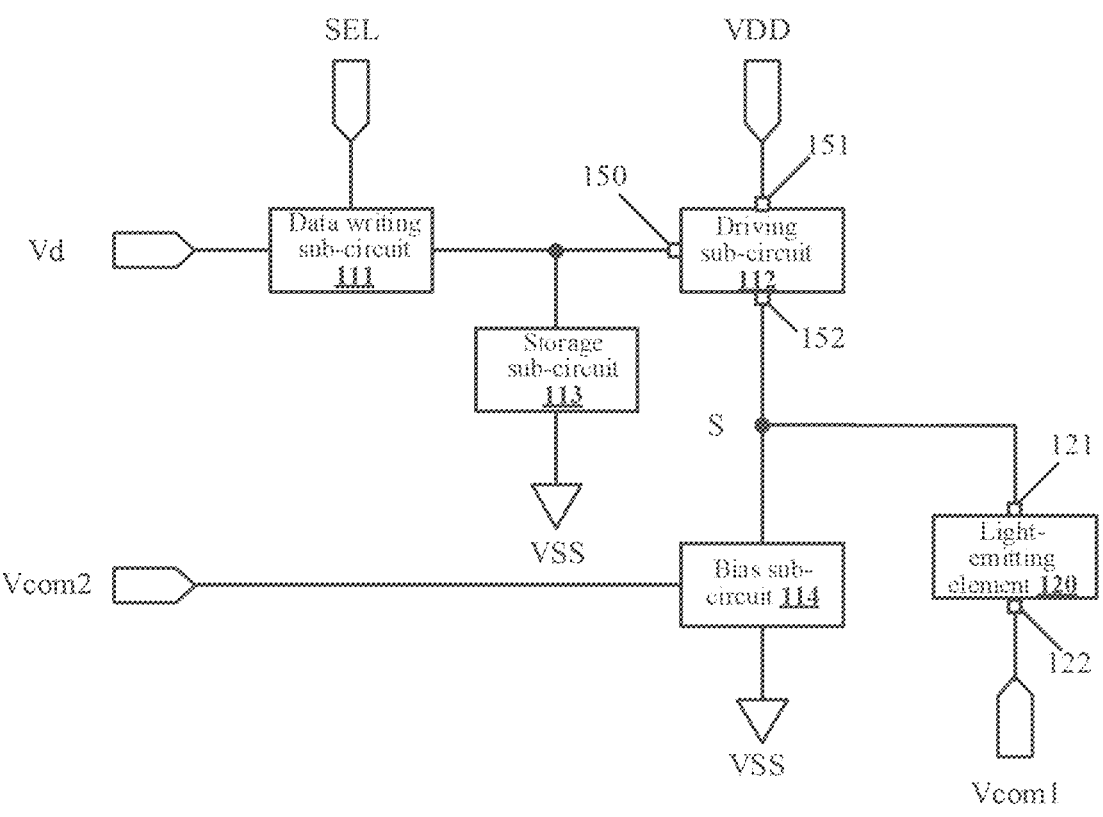
FIG. 24B is a schematic diagram of a pixel circuit provided by an embodiment of the present disclosure.

FIG. 24B shows a schematic diagram of a pixel circuit. As illustrated in FIG. 24B, the pixel circuit includes a data writing sub-circuit 111, a driving sub-circuit 112 and a storage sub-circuit 113.

The data writing sub-circuit 111 is electrically connected with a first end of the storage sub-circuit 113, and is configured to transmit a data signal Vd to a first end of the storage sub-circuit 113 in response to a control signal (a first control signal SEL). A second end of the storage sub-circuit 113 is, for example, configured to receive a second power supply voltage VSS.

The driving sub-circuit 112 includes a control electrode 150 of the driving sub-circuit 112, a first electrode 151 of the driving sub-circuit 112 and a second electrode 152 of the driving sub-circuit 112, the control electrode 150 of the driving sub-circuit is electrically connected with the first end of the storage sub-circuit, the first electrode 151 of the driving sub-circuit 112 is configured to receive a first power supply voltage VDD, the second electrode 152 of the driving sub-circuit 112 is electrically connected with a first node S, and is connected with the first electrode 121 of the light-emitting element 120. The driving sub-circuit 112 is configured to drive the light-emitting element 120 to emit light in response to a voltage of the first end of the storage sub-circuit. The second electrode 122 of the light-emitting element 120 is, for example, configured to receive a first common voltage Vcom1.

In at least some embodiments of the present disclosure, as illustrated in FIG. 24B, the pixel circuit also includes a bias sub-circuit 114. The bias sub-circuit 114 includes a control end, a first end and a second end, the control end of the bias sub-circuit 114 is configured to receive a bias signal; the first end of the bias sub-circuit 114 is configured to receive a second power supply voltage VSS, for example, the second end of the bias sub-circuit 114 is electrically connected with the first node S. For example, the bias signal is a second common voltage Vcom2. For example, the bias signal Vcom2 is a constant voltage signal, for example, is from 0.8V to 1V; the bias sub-circuit 114 is in a normally open state under an action of the bias signal, and is configured to provide a constant current, so that the voltage applied to the light-emitting element 120 has a linear relationship with the data signal, which helps to achieve fine-grained control of grayscale, thus the display effect is improved. This will be further described later in conjunction with specific circuits.

For example, in a case that the data signal (voltage) Vd changes from high to low, the gray-scale voltage written to the first electrode 121 of the light-emitting element 120 needs to change rapidly, the bias sub-circuit 114 can also allow the first electrode 121 of the light-emitting element 120 to rapidly discharge charges, so that better dynamic contrast is achieved.

The transistors used in the embodiments of the present disclosure may all be thin film transistors or field effect transistors or other switching devices with same characteristics, in the embodiments of the present disclosure, a metal-oxide semiconductor field effect transistor is used as an example for description. The source electrode and the drain electrode of the transistor used here can be symmetrical in structure, thus the source electrode and the drain electrode can be indistinguishable in structure. In the embodiments of the present disclosure, in order to distinguish the two electrodes of the transistor except the gate electrode, one electrode is directly described as a first electrode, and the other electrode is a second electrode. In addition, the transistors can be divided into N-type and P-type transistors according to their characteristics. In a case that the transistors are a P-type transistor, a turn-on voltage is a low level voltage (for example, 0V, −5V, −10V or other suitable voltage), a shutdown voltage is a high level voltage (for example, 5V, 10V or other suitable voltage); in a case that the transistor is an N-type transistor, the turn-on voltage is a high-level voltage (for example, 5V, 10V, or other suitable voltages), and the shutdown voltage is a low level voltage (for example, 0V, −5V, −10V, or other suitable voltage).

The display substrate provided by the embodiment of the present disclosure may adopt a rigid substrate, such as a glass substrate, a silicon substrate, etc., can also be formed of flexible materials with excellent heat resistance and durability, such as polyimide (PI), polycarbonate (PC), polyethylene terephthalate (PET), polyethylene, polyacrylate, polyarylate, polyetherimide, polyether Sulfone, Polyethylene Glycol Terephthalate (PET), Polyethylene (PE), Polypropylene (PP), Polysulfone (PSF), Polymethyl Methacrylate (PMMA), Triacetate Cellulose (TAC), cyclic olefin polymers (COP) and cyclic olefin copolymers (COC), etc. . . . The embodiments of the present disclosure are all described by taking a silicon substrate as an example, that is, the pixel structure is manufactured on the silicon substrate, however, which is not limited in the embodiments of the present disclosure.

For example, the pixel circuit includes a complementary metal oxide semiconductor circuit (CMOS circuit), that is, the pixel circuit is manufactured on a single crystal silicon substrate. Relying on mature CMOS integrated circuit technology, silicon-based processes can achieve high precision (for example, PPI can reach 6500 or even more than 10,000).

For example, in a case that the display substrate is short-circuited between the first electrode 121 and the second electrode 122 of the light-emitting element 120 in the sub-pixel due to process fluctuations, the voltage of the first electrode 121 of the light-emitting element 120 is too high (for example, the first common voltage Vcom1 is at a high level) or too low (for example, the first common voltage Vcom1 is at a low level), so that a latch-up effect is induced at the first node S, and the CMOS circuit fails, resulting in defects such as dark lines on the display substrate.

In some examples, for example, the data writing sub-circuit includes a first data writing transistor P1, the driving sub-circuit includes a driving transistor N2; for example, the first data writing transistor is a P-type metal-oxide semiconductor field effect transistor (PMOS), the driving transistor N2 is an N-type metal-oxide semiconductor field effect transistor (NMOS), the gate electrode of the driving transistor N2, the first electrode of the driving transistor N2 and the second electrode of the driving transistor N2 serve as the control electrode 150 of the driving sub-circuit 112, the first electrode 151 of the driving sub-circuit 112 and the second electrode 152 of the driving sub-circuit 112 respectively. In this case, for example, in a case that the first common voltage Vcom1 supplied to the second electrode 122 of the light emitting element 120 is at a low potential, and the first electrode 121 and the second electrode 122 of the light-emitting element 120 are short-circuited, so that potential of the second electrode of the driving transistor directly connected with the first electrode 121 is too low.

Figure 24C:
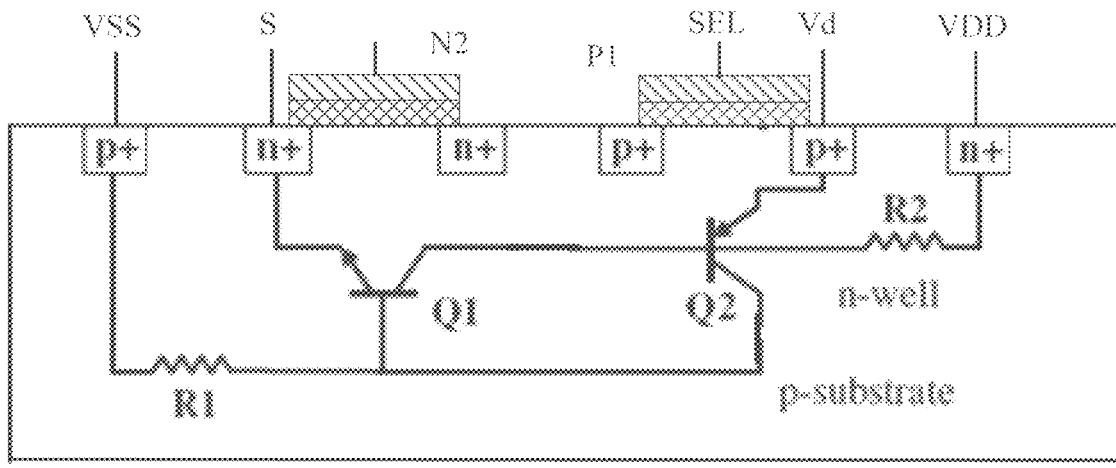
FIG. 24C shows a schematic diagram of the pixel circuit forming a latch-up effect.

FIG. 24C shows a schematic diagram of the pixel circuit forming a latch-up effect. An N-type active region (such as the second electrode) of the driving transistor N2, a P-type silicon substrate, a N-type well region where the first data writing transistor P1 is located, and a P-type active region (such as the first electrode) of the first data writing transistor P1 form two parasitic transistors Q1 and Q2 connected with each other, to form an N-P-N-P structure. In a case that potential of the second electrode of the driving transistor N2 (that is, at the first node S) is too low, a PN junction (a transmitter junction) between the second electrode (a N-type heavily doped region) of the driving transistor N2 and the P-type substrate is forward biased, and Q1 is turned on, which will provide a large enough current to turn on the parasitic transistor Q2, in turn, the current is fed back to the parasitic transistor Q1, a vicious circle is formed, which finally causes most of the current from VDD to pass directly through the parasitic transistor to VSS, and the current is not controlled by a gate voltage of the transistor, thus the CMOS pixel circuit fails; and the latch-up effect causes the parasitic transistor Q2 to continuously draw the current from the transmitter, that is, from the data line, so that a column of sub-pixels connected with the data line fails, resulting in defects such as dark lines on the display substrate, and the display effect is greatly affected.

In at least some embodiments of the present disclosure, at least one sub-pixel further includes a resistor, which is connected between the second electrode 152 of the driver sub-circuit 112 and the first electrode 121 of the light-emitting element 120, and can play a role in raising or lowering the potential of the first node S, thereby mitigating or avoiding the latch effect, improving the reliability of the circuit, and improving the display effect.

Figure 25A:
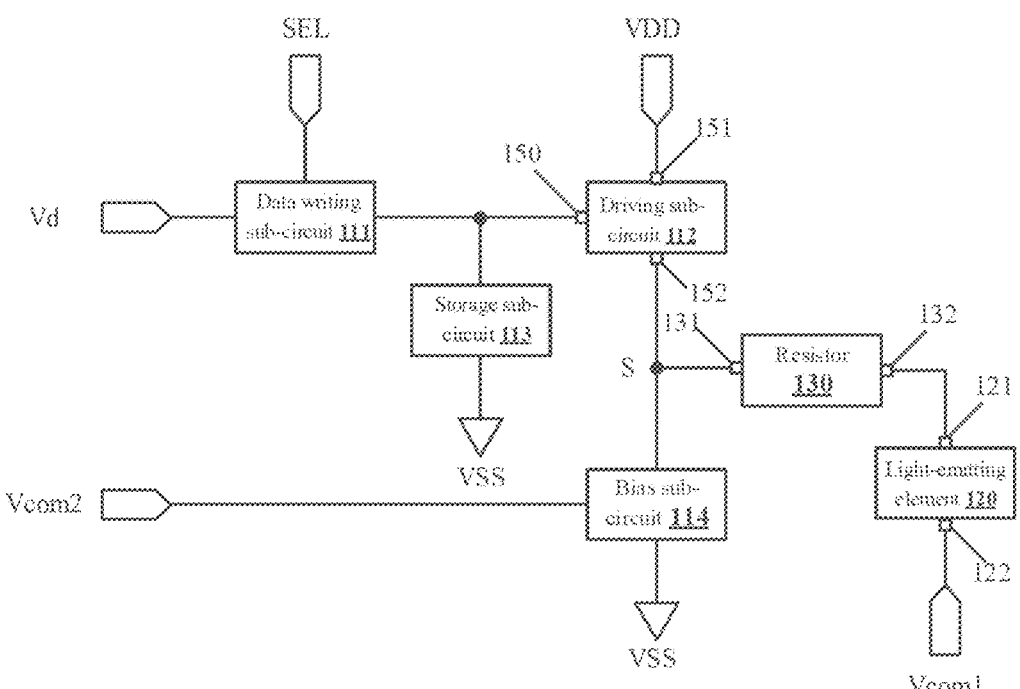
FIG. 25A is a schematic diagram of another pixel circuit provided by an embodiment of the present disclosure.

FIG. 25A is a schematic diagram of a pixel circuit provided by at least one embodiment of the present disclosure. As illustrated in FIG. 25A, the pixel circuit further includes a resistor 130, a first end 131 of the resistor 130 is electrically connected with a second electrode 152 of the driving sub-circuit 112, a second end 132 of the resistor 130 is electrically connected with a first electrode 121 of the light-emitting element 120, that is, the second electrode 152 of the driving sub-circuit 112 is electrically connected with the first electrode 121 of the light-emitting element 120 through the resistor 130.

For example, the resistor 130 is a constant resistance or a variable resistance, or may be an equivalent resistance formed by other devices (such as transistors).

For example, the resistor 130 and the control electrode 150 of the driving sub-circuit 112 are insulated and arranged in a same layer, and a resistivity of the resistor is higher than a resistivity of the control electrode of the driving sub-circuit. For example, the resistivity of the resistor is more than ten times the resistivity of the control electrode.

It should be noted that the "arranged in a same layer" in the present disclosure refers to a structure formed by two (or more than two) structures formed by a same deposition process and patterned by a same patterning process, their materials can be the same or different. For example, materials for forming precursors of various structures arranged in the same layer are the same, final formed material can be the same or different. The "integrated structure" in the present disclosure refers to a structure in which two (or more than two) structures are formed by the same deposition process and patterned by the same patterning process and are connected with each other, and their materials can be the same or different.

By this arrangement, the control electrodes of the driving sub-circuit and the resistors can be formed in a same patterning process, so that the process is saved.

For example, materials of the resistors and the control electrodes of the driving sub-circuits are all polysilicon materials, and a doping concentration of the resistor is lower than a doping concentration of the control electrode, thus the resistor has a higher resistivity than the control electrode. For example, the resistors can be intrinsic polysilicon or lightly doped polysilicon, and the control electrode is heavily doped polysilicon.

In other examples, the materials of the control electrodes and resistors may be different. For example, the materials of the control electrodes and the resistors may respectively include a metal and a corresponding metal oxide of the metal. For example, the metal may include gold (Au), silver (Ag), copper (Cu), aluminum (Al), molybdenum (Mo), magnesium (Mg), tungsten (W), and alloy materials formed by combining the above metals.

In at least one embodiment of the present disclosure, the data writing sub-circuit 111 may include a transmission gate circuit composed of two complementary transistors in parallel with each other; and the control signal includes two control signals in opposite phases. The data writing sub-circuit 111 adopts a circuit with a transmission gate structure, which can help to transmit a data signal to the first end of the storage sub-circuit 113 without loss.

For example, the data writing sub-circuit includes a first control electrode, a second control electrode, a first end and a second end, the first control electrode and the second control electrode of the data writing sub-circuit are respectively configured to receive a first control signal and a second control signal, the first end of the data writing sub-circuit is configured to receive a data signal, the second end of the data writing sub-circuit is electrically connected to the first end of the storage sub-circuit, and is configured to transmit the data signal to the first end of the storage sub-circuit in response to the first control signal and the second control signal.

It should be noted that, in the descriptions of the embodiments of the present disclosure, the first node S does not necessarily represent an actual component, but rather represents a junction of related circuit connections in a circuit diagram.

It should be noted that, in the descriptions of the embodiments of the present disclosure, the symbol Vd can represent either a data signal end or a level of the data signal, similarly, the symbol SEL can represent either a control signal or a control signal end, the symbols Vcom1 and Vcom2 can represent either a first common voltage, a second common voltage, or a first common voltage end and a second common voltage end; the symbol VDD can represent either a first voltage end or a first power supply voltage, the symbol VSS may represent either a second voltage end and a second supply voltage. The following embodiments are the same as the embodiment, which is omitted herein.

Figure 25B:
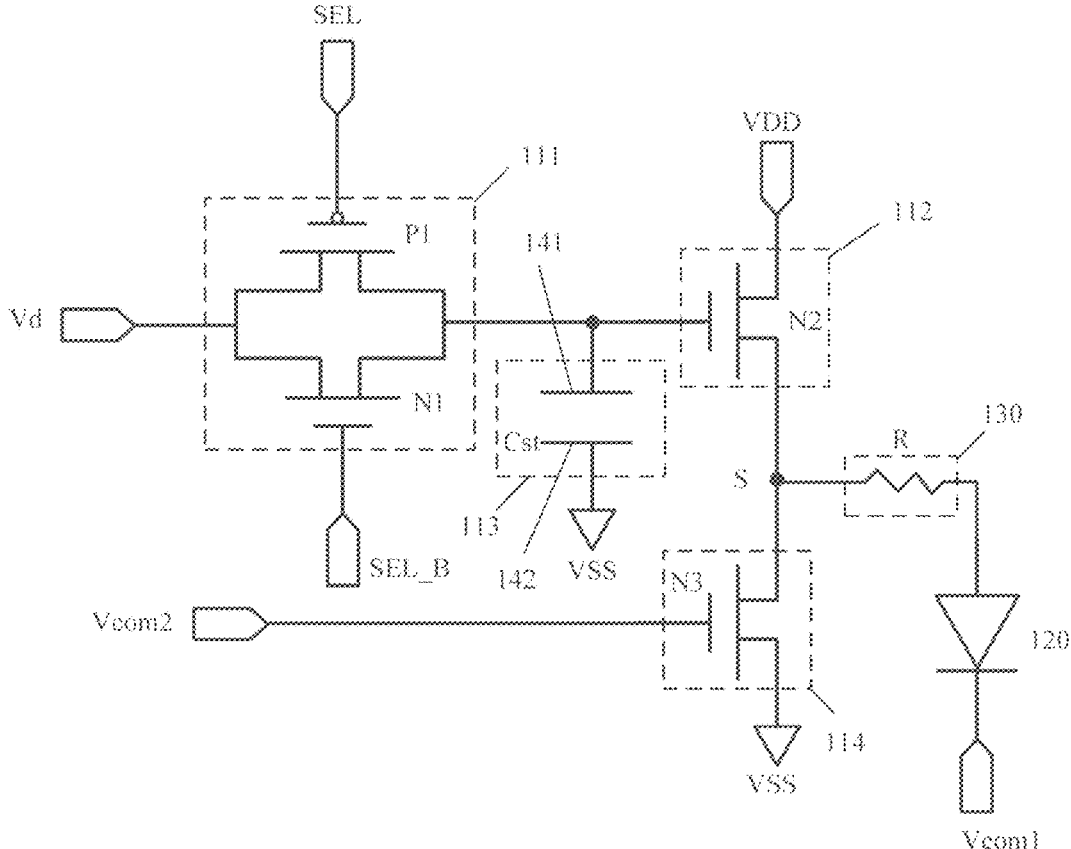
FIG. 25B is a circuit diagram of a specific implementation example of the pixel circuit illustrated in FIG. 24A.

FIG. 25B is a circuit diagram of a specific implementation example of the pixel circuit illustrated in FIG. 24A. As illustrated in FIG. 25B, the data writing sub-circuit 111 includes a first data writing transistor P1 and a second data writing transistor N1 connected in parallel with each other. The first data writing transistor P1 and the second data writing transistor N1 are a P-type metal-oxide semiconductor field effect transistor (PMOS) and an N-type metal-oxide semiconductor field effect transistor (NMOS), respectively. The control signal includes a first control signal SEL and a second control signal SEL_B which are mutually inverse, and a gate electrode of the first data writing transistor P1 serves as a first control electrode of the data writing sub-circuit, and is configured to receive the first control signal SEL, a gate electrode of the second data writing transistor N1 serves as a second control electrode of the data writing sub-circuit, and is configured to receive the second control signal SEL_B. A first electrode of the second data writing transistor N1 and a first electrode of the first data writing transistor P1 are electrically connected as a first end of the data writing sub-circuit, and is configured to receive the data signal Vd; the second electrode of the second data writing transistor N1 is electrically connected with the second electrode of the first data writing transistor P1 as a second end of the data writing sub-circuit, and is electrically connected with the control electrode 150 of the driving sub-circuit 112.

For example, the first data writing transistor P1 and the second data writing transistor N1 have a same size, and have a same channel width to length ratio.

The data writing sub-circuit 111 utilizes complementary electrical characteristics of transistors, whether transmitting high level or low level, the data writing sub-circuit 111 has a low on-state resistance, so that the data writing sub-circuit 111 has an advantage of integrity of electrical signal transmission, and the data signal Vd can be transmitted to the first end of the storage sub-circuit 113 without loss.

For example, as illustrated in FIG. 25B, the driving sub-circuit 112 includes a driving transistor N2, for example, the driving transistor N2 is an NMOS. The gate electrode, the first electrode and the second electrode of the driving transistor N2 serve as a control electrode, a first electrode and a second electrode of the driving sub-circuit 112 respectively.

For example, the storage sub-circuit 113 includes a storage capacitor Cst, the storage capacitor Cst includes a first capacitor electrode 141 and a second capacitor electrode 142, and the first capacitor electrode 141 and the second capacitor electrode 142 serve as a first end and a second end of the storage sub-circuit 113, respectively.

For example, the resistor 130 includes a resistance R. For example, a PN junction is formed between the second electrode 152 of the driving sub-circuit 112 and the base substrate, a resistance value of the resistor 130 is configured such that in a case that the driving transistor N2 operates in a saturation region, that is, in a case that the pixel circuit operates to drive the light-emitting element 120 to emit light, the PN junction is turned off. In this case, even if a short circuit occurs between the two electrodes of the light emitting element 120, due to a voltage drop on the resistor 130, the potential of the second electrode 152 can be protected, so that occurrence of latch-up effect is avoided.

For example, the light emitting element 120 is specifically implemented as an organic light emitting diode (OLED). For example, the light emitting element 120 may be an OLED with a top emission structure, which may emit red light, green light, blue light, or white light. For example, the light emitting element 120 is a Micro OLED. The embodiments of the present disclosure do not limit the specific structure of the light-emitting element. For example, the first electrode 121 of the light-emitting element 120 is an anode of the OLED, the second electrode 122 is a cathode of the OLED, that is, the pixel circuit is a common cathode structure. However, the embodiments of the present disclosure do not limit this, according to change of a circuit structure, the pixel circuit can also be a common anode structure.

For example, the bias sub-circuit 114 includes a bias transistor N3, the gate electrode, the first electrode and second electrode of the bias transistor N3 serve as a control end, a first end and a second end of the bias sub-circuit 114, respectively.

Figures 25C, 26A:
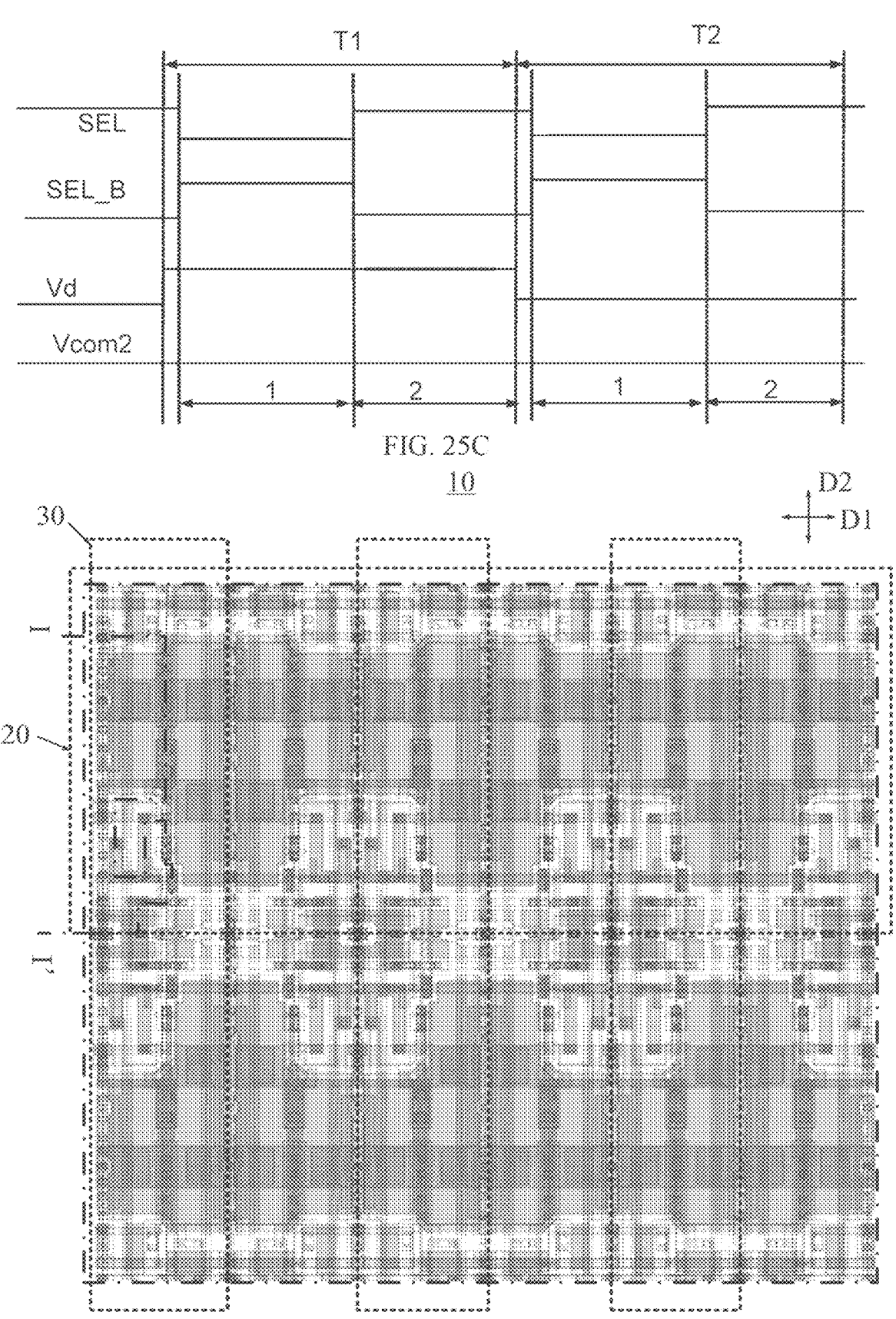
FIG. 25C shows a signal timing diagram of the pixel circuit illustrated in FIG. 25B.
FIG. 26A is a schematic diagram of another display substrate provided by an embodiment of the present disclosure.

FIG. 25C shows a signal timing diagram of the pixel circuit illustrated in FIG. 25B, an operation principle of the pixel circuit illustrated in FIG. 25C will be described below with reference to the signal timing diagram illustrated in FIG. 25B. For example, the second data writing transistor, the driving transistor, and the bias transistor are all N-type transistors, and the first data writing transistor is a P-type transistor, which are not limited in the embodiment of the present disclosure.

FIG. 25C shows a waveform diagram of each signal in two consecutive display periods T1 and T2, for example, the data signal Vd is a high grayscale voltage in the display period T1, and is a low grayscale voltage in the display period T2.

For example, as illustrated in FIG. 25C, a display process of each frame of image includes a data writing stage 1 and a light-emitting stage 2. A working process of the pixel circuit includes: in the data writing phase 1, the first control signal SEL and the second control signal SEL_B are both turn-on signals, the first data writing transistor P1 and the second data writing transistor N1 are turned on, the data signal Vd is transmitted to the gate electrode of the driving transistor N2 through the first data writing transistor P1 and the second data writing transistor N1; in the light-emitting stage 2, the first control signal SEL and the second control signal SEL_B are both off signals, due to a bootstrap effect of the storage capacitor Cst, the voltage across the storage capacitor Cst remains unchanged, the driving transistor N2 operates in a saturated state with a constant current, and drives the light-emitting element 120 to emit light. In a case that the pixel circuit enters the display period T2 from the display period T1, the data signal Vd changes from a high grayscale voltage to a low grayscale voltage, the bias transistor N3 generates a stable drain current under control of the second common voltage Vcom2, the current of the drain electrode can quickly discharge charge stored in the anode of the OLED in a case that the display gray scale of the OLED needs to change rapidly. For example, the discharge process occurs in a case that data is written to 1 in the display period T2, thus in the light-emitting stage 2 of the display period T2, the voltage of the anode of the OLED drops rapidly, so that a better dynamic contrast ratio is achieved, and the display effect is improved.

For example, in a case that the first node S is directly electrically connected with the light-emitting element 120, a voltage V0 is directly loaded on the first electrode 121 of the light-emitting element 120, for example, the voltage V0 is an anode voltage of the OLED; in a case that the first node S is electrically connected with the light-emitting element 120 through the resistor 130, since the current flowing through the light-emitting element 120 is extremely small, the voltage of the first node S can be approximately equal to the voltage of the first electrode 121 of the light-emitting element 120; that is, the voltage of the first electrode 121 of the light-emitting element 120 has a linear relationship with the data signal (the data voltage) Vd, so that fine control of the gray scale can be realized, and the display effect can be improved.

For example, the first control signal SEL and the second control signal SEL_B are differential complementary signals with a same amplitude and opposite phases. This helps to improve the anti-interference performance of the circuit. For example, the first control signal SEL and the second control signal SEL_B may be output by a same gate driving circuit unit (for example, a GOA unit), so that the circuit is simplified.

For example, as illustrated in FIG. 24A, the display substrate 10 may further include a data driving circuit 13 and a scan driving circuit 14. The data driving circuit 13 is configured to send out a data signal, such as the above-mentioned data signal Vd, as required (for example, an image signal input to the display device). The scan driving circuit 14 is configured to output various scan signals, for example, including the above-mentioned first control signal SEL and the second control signal SEL_B, for example, the scan driving circuit 14 is an integrated circuit chip (IC) or a gate driving circuit (GOA) fabricated directly on the display substrate.

For example, the display substrate uses a silicon substrate as the base substrate 101, the pixel circuit, the data driving circuit 13 and the scanning driving circuit 14 can all be integrated on the silicon substrate. In this case, since silicon-based circuits can achieve higher precision, the data driving circuit 13 and the scanning driving circuit 14 may also, for example, be formed in a region corresponding to the display region of the display substrate, but not necessarily in the non-display region.

For example, the display substrate 10 further includes a control circuit (not illustrated). For example, the control circuit is configured to control the data driving circuit 13 to apply the data signal Vd, and to control the gate driving circuit 13 to apply various scan signals. An example of such a control circuit is a timing control circuit (T-con). The control circuit can be in various forms, for example, including a processor and a memory, the memory includes executable code, and the processor runs the executable code to perform the above-mentioned detection method.

For example, the processor may be a central processing unit (CPU) or other form of processing device having data processing capabilities and/or instruction execution capabilities, for example, may include a microprocessor or a programmable logic controller (PLC).

For example, the storage device may include one or more computer program products, the computer program product may include various forms of computer-readable storage medium, for example, volatile memory and/or non-volatile memory. Volatile memory may include, for example, random access memory (RAM) and/or cache memory (cache). Non-volatile memory may include, for example, read only memory (ROM), hard disk and flash memory. One or more computer program instructions may be stored on the computer-readable storage medium, the processor 121 may perform the functions desired by the program instructions. Various application programs and various data can also be stored in the computer-readable storage medium, such as electrical characteristic parameters obtained in the above detection method.

The display substrate provided by at least one embodiment of the present disclosure is exemplarily described below by taking the pixel circuit illustrated in FIG. 25B as an example, but the embodiments of the present disclosure are not limited to this.

FIG. 26A is a schematic diagram of a display substrate 10 provided by at least one embodiment of the present disclosure. For example, as illustrated in FIG. 26A, the display substrate 10 includes a base substrate 101, a plurality of sub-pixels 100 are located on the base substrate 101. The plurality of sub-pixels 100 are arranged in a sub-pixel array, a row direction of the sub-pixel array is the first direction D1, its column direction is the second direction D2, the first direction D1 is intersected with, for example, is orthogonal with the second direction D2. FIG. 26A exemplarily shows two rows and six columns of sub-pixels, that is, two pixel rows 20 and six pixel columns 30, and regions of three pixel columns spaced apart from each other are respectively illustrated with dashed boxes.

For example, the base substrate 101 may be a rigid substrate, such as a glass substrate and a silicon substrate, and can also be formed of flexible materials with excellent heat resistance and durability, such as polyimide (PI), polycarbonate (PC), polyethylene terephthalate (PET), polyethylene, polyacrylates, polyarylates, polyetherimides, poly Ethersulfone, polyethylene glycol terephthalate (PET), polyethylene (PE), polypropylene (PP), polysulfone (PSF), polymethyl methacrylate (PMMA), cellulose triacetate (TAC), cyclic olefin polymer (COP) and cyclic olefin copolymer (COC). The embodiments of the present disclosure are all described by taking the base substrate 101 as an example of a silicon substrate, but the embodiments of the present disclosure are not limited to this.

For example, the base substrate 101 includes single crystal silicon or high-purity silicon. The pixel circuit is formed on the base substrate 10 by a CMOS semiconductor process, for example, an active region of the transistor (including a channel region, a first electrode and a second electrode of the transistor) is formed in the base substrate 101 through a doping process, each of the insulating layers is formed through a silicon oxidation process or a chemical vapor deposition process (CVD), and a plurality of conductive layers are formed by a sputtering process, so that a wiring structure is formed. The active region of each of the transistors is located inside the base substrate 101.

Figure 26B:
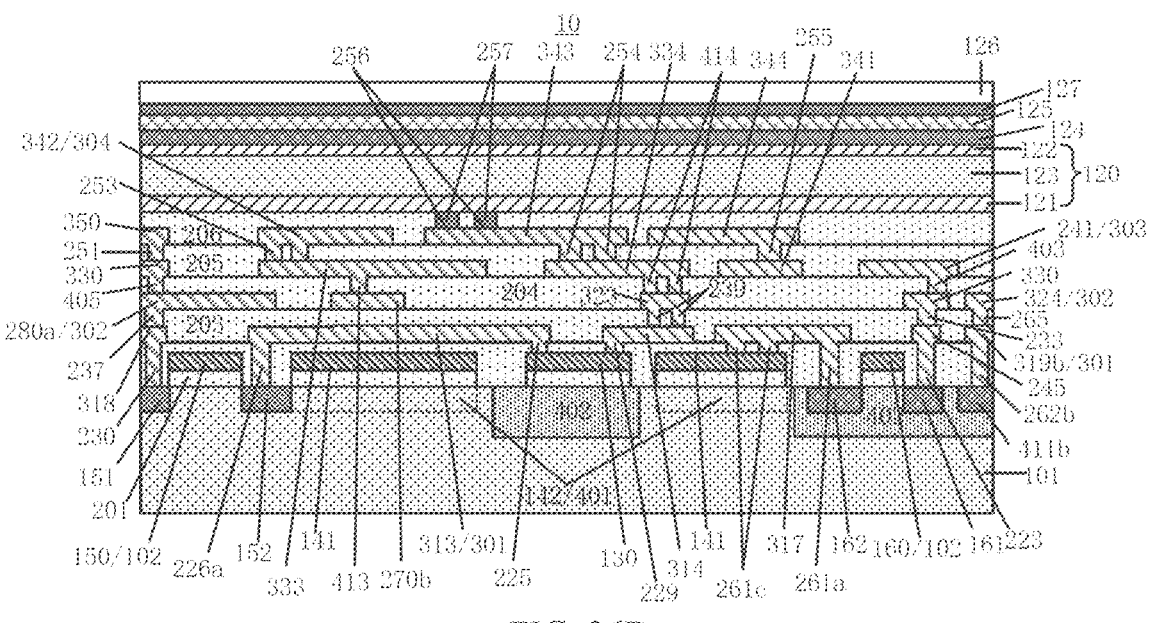
FIG. 26B is a cross-sectional diagram of FIG. 26A taken along a section line I-I'.

FIG. 26B is a cross-sectional diagram of FIG. 26A taken along a section line I-I'. For clarity, some traces or electrode structures without direct connection relationship are omitted in FIG. 26B.

For example, as illustrated in FIG. 26B, the display substrate 10 includes a base substrate 101, and a first insulating layer 201, a polysilicon layer 102, a second insulating layer 202, a first conductive layer 301, a third insulating layer 203, a second conductive layer 302, a fourth insulating layer 204, a third conductive layer 303, a fifth insulating layer 205 and a fourth conductive layer 304 that are sequentially located on the base substrate 101. The structure of the display substrate 10 will be described in layers below, and FIG. 26B will be described together as a reference.

Figure 27A:
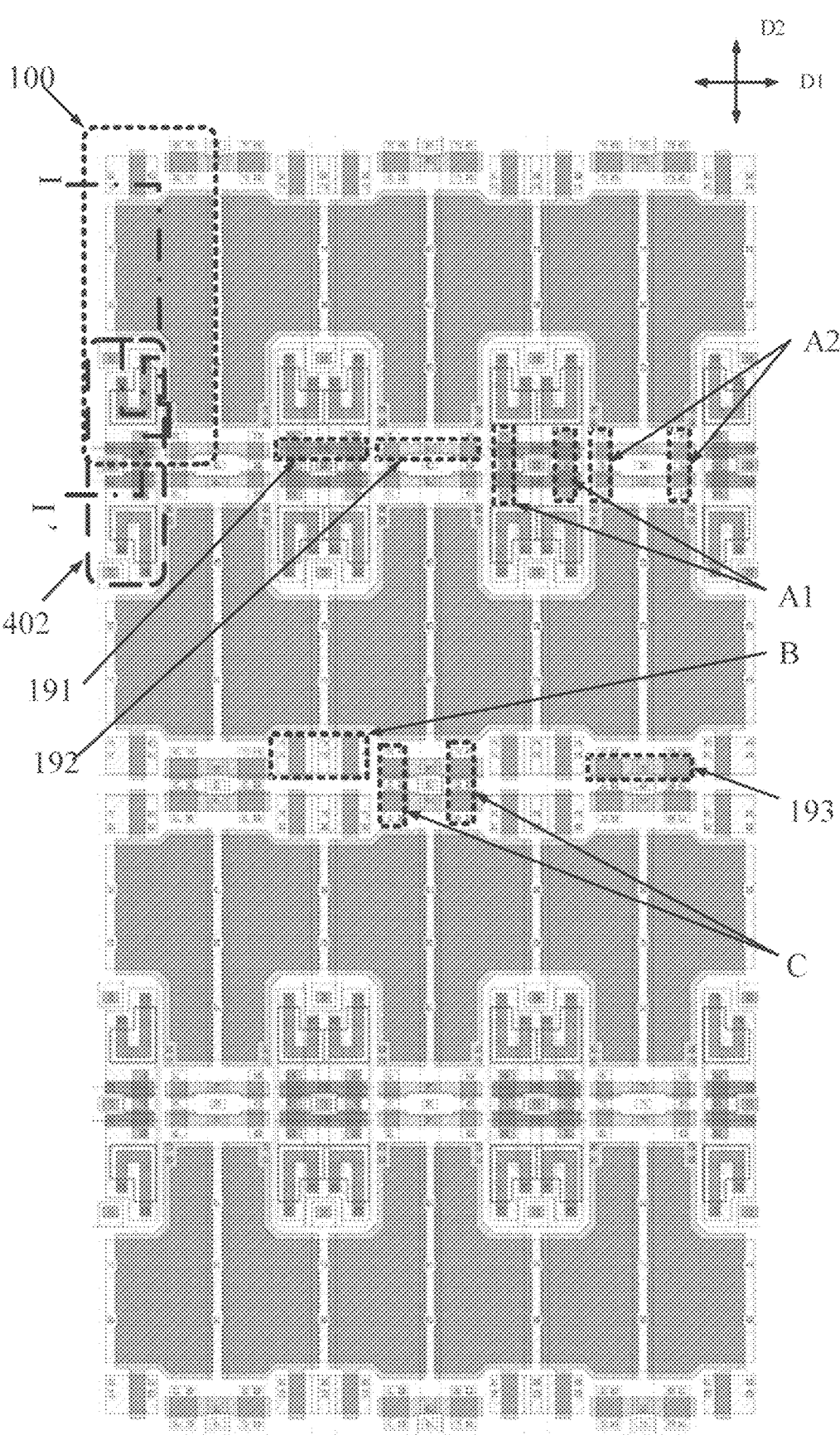
FIG. 27A is a schematic diagram of still another display substrate provided by an embodiment of the present disclosure.
Figure 27B:
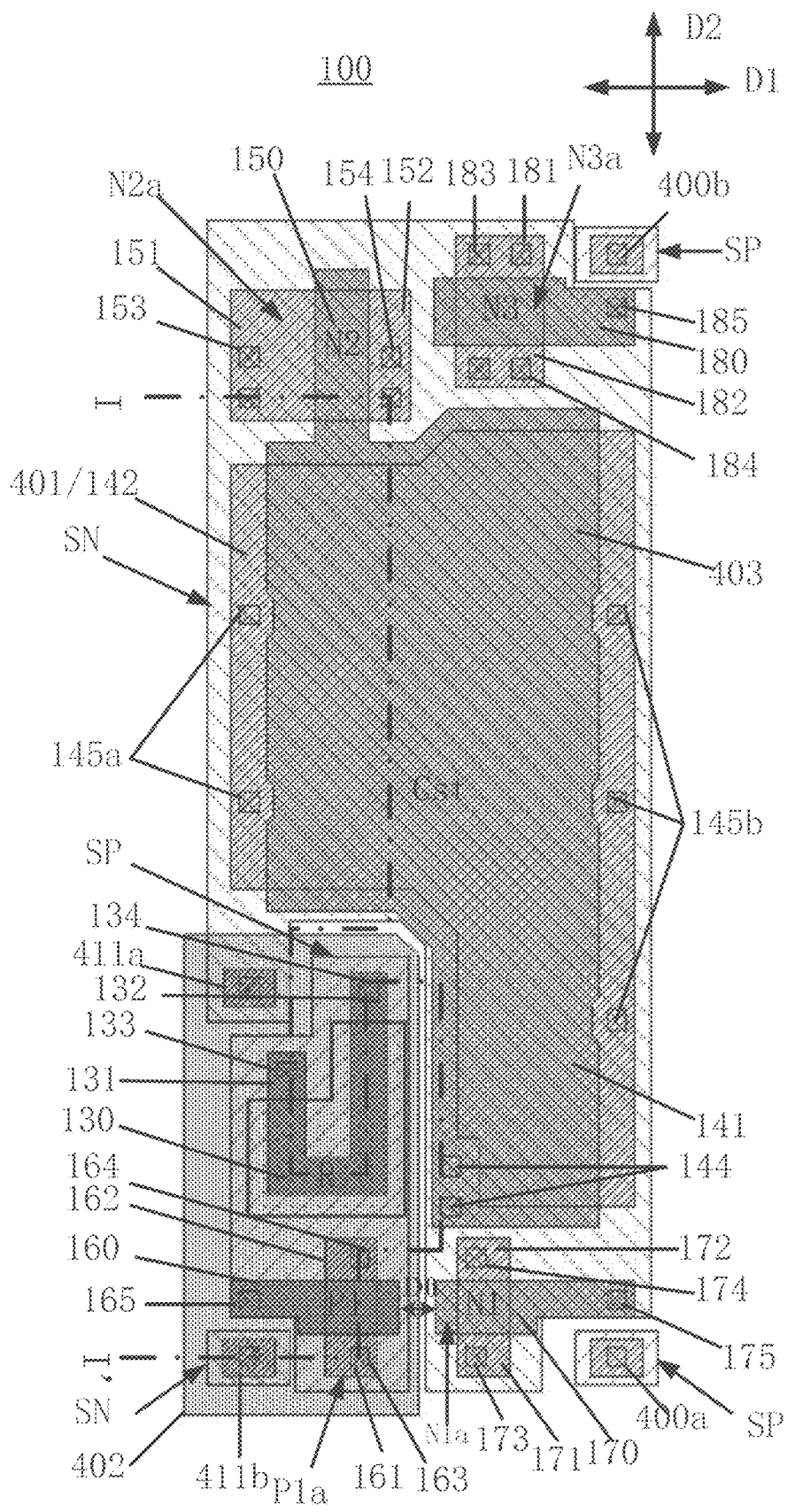
FIG. 27B is a schematic diagram of still another display substrate provided by an embodiment of the present disclosure.

For clarity and convenience, FIG. 27A shows a part of the display substrate 10 below the first conductive layer 301, that is, the base substrate 101 and the first insulating layer 201 and the polysilicon layer 102 that are located on the base substrate 101 include each of the transistors (P1, N1 to N3), the storage capacitor Cst and the resistor 130; FIG. 27B shows an enlarged schematic diagram of one sub-pixel 100 in FIG. 27A; for clarity, the section line I-I' in FIG. 26A is also illustrated correspondingly in FIG. 27A. FIGS. 28A to 28E illustrate a formation process of the substrate structure illustrated in FIG. 27A.

As illustrated in FIG. 27B, for example, in a direction parallel to a board surface of the base substrate 101, the first data writing transistor P1 and the driving transistor N2 are located on opposite sides of the storage capacitor Cst, for example, on opposite sides of the storage capacitor Cst in the second direction D2.

With reference to FIG. 24C, this arrangement helps to increase a distance between the first data writing transistor P1 and the driving transistor N2, so that resistance of a parasitic circuit is increased, and a risk of the latch-up effect of the CMOS circuit is further reduced.

For example, material of the second capacitor electrode 142 of the storage capacitor 140 is a conductor or a semiconductor. For example, as illustrated in conjunction with FIG. 26B and FIG. 27B, the second capacitor electrode 142 of the storage capacitor 140 is a first region 401 of the base substrate 101; for example, the base substrate 101 is a P-type silicon-based substrate, and the material of the second capacitor electrode 142 is P-type single crystal silicon. In a case that a voltage is applied to the first capacitor electrode 141, the first region 401 with semiconductor properties located under the first capacitor electrode 141 in the base substrate 101 forms an inversion region and becomes a conductor, so that the first region 401 is electrically connected with contact hole regions on both sides of the first region 401 (the contact hole regions 145 a and 145 b illustrated in FIG. 4B). In this case, the first region 401 is not subjected to additional treatment such as doping.

In another example, the first region 401 is, for example, a conductive region in the base substrate 101, such as a heavily doped region, so that the second capacitor electrode 142 can obtain a stable and higher conductivity.

For example, the base substrate 101 further includes a second region 402, the second region 402 is an N-type well region in the base substrate 101. As illustrated in FIG. 27B, for example, the first data writing transistor P1 and the resistor 130 are arranged side by side in the second region 402 in the second direction D2. Arranging the resistor 130 made of polysilicon material in the N-type substrate helps to reduce parasitic effects, and circuit characteristics are improved.

For example, in a direction parallel to the board surface of the base substrate 101, the resistor (R) 130 is located on a same side of the second capacitor electrode 142 as the first data writing transistor P1. For example, in the direction parallel to the board surface of the base substrate 101, the driving transistor N2 and the bias transistor N3 are located on a same side of the second capacitive electrode 142.

For example, as illustrated in FIG. 27B, the first data writing transistor P1 and the second data writing transistor N1 are arranged side by side in the first direction D1, and is symmetrical about an axis of symmetry along the second direction D2. For example, the gate electrode 160 of the first data writing transistor P1 and the gate electrode 170 of the second data writing transistor N1 are arranged side by side in the first direction D1, and is symmetrical about the axis of symmetry along the second direction D2.

For example, the resistor 130 is a U-shaped structure, such as an asymmetric U-shaped structure, for example, lengths of two branches of the U-shaped structure are not equal. For example, as illustrated in FIG. 27B, a second end 132 of the resistor 130 is closer to the driving transistor N2.

The resistor 130 is arranged in a U-shaped structure to help save a layout area occupied by the resistor, so that space utilization rate of the layout is improved, and resolution of the display substrate is improved. For example, in a same space, the resistor with a U-shaped structure can increase a length of the resistor, so that a desired resistance value is obtained.

In addition, the design of the resistor 130 as an asymmetric structure is also for a rational use of the layout space, for example, as illustrated in FIG. 27B, a contact hole region 411a is designed above a shorter branch of the U-shaped resistor, the contact hole region 411a is juxtaposed with the second end 132 of the resistor 130 in the first direction D1. For example, the contact hole region 411a is an N-type heavily doped region (N+). For example, the contact hole region 411 is used to bias a well region 401 where the first data writing transistor P1 is located, so that threshold voltage variations due to latch-up and substrate bias effects is avoided, and stability of the circuit is improved. For example, referring to FIG. 26B, by biasing the P-type substrate 101 at a low voltage, an N-type well region 402 is biased at high voltage, so that the parasitic PN junction between the P-type substrate 101 and the N-type well region 402 can be reverse biased, the devices are electrically isolated, and parasitic effects between the devices are reduced, thus the stability of the circuit is improved.

For example, an opening of the U-shaped structure faces the first capacitor electrode 141, the first end 131 and the second end 132 of the resistor 130 are located at two ends of the U-shaped structure, respectively. As illustrated in the FIG. 27B, the first end 131 of the resistor 130 is arranged with a contact hole region 133, for being electrically connected with the gate electrode 150 of the driving transistor N2; the second end 132 of the resistor 130 is arranged with a contact hole region 134, for being electrically connected with the first electrode 121 of the light-emitting element 120.

For example, material of the resistor 130 includes polysilicon material, the contact hole regions 133 and 134 are doped regions, which are used to reduce contact resistance; a body region of the resistor 130 other than the contact hole regions is, for example, an intrinsic region or a low-doped region, so that the desired resistance value is obtained.

For example, the first capacitor electrode 141 of the storage capacitor 140 and the resistor 130 are insulated in a same layer, and both include polysilicon material; doping concentration of the first capacitor electrode 141 of the storage capacitor 140 is higher than doping concentration of the body region of the resistor 130. For example, the main body of the resistor 130 is an intrinsic polysilicon material.

For example, the gate electrodes 160, 170, 150, 180 of the transistors P1, N1 to N3 and the first capacitor electrode 141 of the storage capacitor 140 are arranged in a same layer, which all include polysilicon material. For example, as illustrated in FIG. 27B, the gate electrode 150 of the driving transistor N2 and the first capacitor electrode 141 are connected with each other as an integral structure.

FIG. 27B further shows active regions P1a, N1a, N2a and N3a of the transistors P1, N1 to N3, respectively, and shows a first electrode 161 and a second electrode 162 of the first data writing transistor P1, a first electrode 171 and a second electrode 172 of the second data writing transistor N1, a first electrode 151 and a second electrode 152 of the driving transistor N2, and a first electrode 181 and a second electrode 182 of the bias transistor N3.

FIG. 27B further shows a gate electrode contact region 165, a first electrode contact region 163 and a second electrode contact region 164 of the first data writing transistor P1, a gate electrode contact region 175, a first electrode contact region 173 and a second electrode contact region 174 of the second data writing transistor N1, a gate electrode contact region 155, a first electrode contact region 153 and a second electrode contact region 154 of the drive transistor N2, and a gate electrode contact region 185, a first electrode contact region 183 and a second electrode contact region 184 of the bias transistor N3, respectively. For example, each of the first electrode contact regions is a region where the corresponding first electrode is used to form electrical contact, each of the second electrode contact regions is a region where the corresponding second electrode is used to form electrical contact, each of the gate electrode contact regions is a region where the corresponding gate electrode is used to form electrical contact.

For example, the active region P1a of the first data writing transistor P1 and the active region N1a of the second data writing transistor N1 are arranged side by side in the first direction D1, and are symmetrical about the axis of symmetry along the second direction D2.

As illustrated in FIG. 27B, an area of the active region N2a of the driving transistor N2 is larger than areas of the active regions of other transistors, a larger width to length ratio can be obtained, which helps to improve driving ability of the driving transistor N2, so that the display effect is improved.

As illustrated in FIG. 27B, for transistors with larger active regions, such as a driving transistor N2 and a bias transistor N3, since the transistors have enough space, at least two contact hole regions may be arranged on the first electrode and the second electrode, respectively, so that the transistors can obtain sufficient contact with a structure to be connected and a parallel structure can be formed, and thus the contact resistance is reduced.

FIG. 27B further shows a contact hole region 144 on the first capacitor electrode 141 and contact hole regions 145a, 145b that are configured to be electrically connected with the second capacitor electrode 142. As illustrated in FIG. 27B, the first capacitor electrode 141 and the second capacitor electrode 142 are respectively arranged with at least two contact hole regions to reduce the contact resistance.

With reference to FIG. 27A, distributions of transistors, storage capacitors, and resistors in two adjacent sub-pixels 100 in the first direction D1 are symmetrical about the axis of symmetry along the second direction D2, that is, corresponding structures in the two sub-pixels are respectively symmetrical about the axis of symmetry along the second direction D2. The distribution of transistors in two adjacent sub-pixels 100 in the second direction D2 is axially symmetric with respect to the first direction.

The symmetrical arrangement can maximize uniformity of process errors, so that uniformity of the display substrate is improved. In addition, the symmetrical arrangement enables some structures in the substrate that are arranged on a same layer and can be connected with each other to be integrally formed, compared with separate arrangement, this symmetrical arrangement can make the pixel layout more compact, and the utilization of the space is improved, thus the resolution of the display substrate is improved.

For example, as illustrated in FIG. 27A, the second regions 402 of the two adjacent sub-pixels 100 in the first direction D1 is an integrated structure, the second regions 402 of the two adjacent sub-pixels 100 in the second direction D2 is an integrated structure, that is, the first data writing transistors N1 and the resistors 130 in the adjacent four sub-pixels 100 are located in a same well region. Compared with the independent well regions arranged separately, the arrangement can make an arrangement of the pixels more compact under the premise of satisfying design rules, which helps to improve the resolution of the display substrate.

For example, as illustrated in FIG. 27A, a structure in which the active regions P1a of the first data writing transistors P1 of two adjacent sub-pixels in the second direction D2 are connected with each other as a whole, that is, the active regions P1a of the two first data writing transistors P1 are located in a same doped region A1 (P well) of the same second region 402, and the structure in which the first electrodes of the two first data transistors P1 are connected with each other as a whole, to receive the same data signal Vd.

For example, as illustrated in FIG. 27A, a structure in which the active regions N1a of the second data writing transistors N1 of two adjacent sub-pixels in the second direction D2 are connected with each other as a whole, that is, the active regions N1a of the two second data writing transistors N1 are located in a same doped region A2 (N well) of the base substrate 101, and the structure in which the first electrodes of the two second data writing transistors N1 are connected with each other as a whole, to receive the same data signal Vd.

For example, as illustrated in FIG. 27A, a structure in which the gate electrodes of the first data writing transistors P1 or the gate electrodes of the second data writing transistors N2 of two adjacent sub-pixels 100 in the first direction D1 are connected with each other as a whole.

Since for each row of the pixels, the gate electrodes of the first data writing transistors P1 are configured to receive a same first control signal SEL, the gate electrodes of the second data writing transistors N1 are all configured to receive a same second control signal SEL_B. In addition, since the transistors of the two adjacent sub-pixels in the first direction D1 are mirror-symmetrical, in the first direction D1, a situation where the first writing transistors P1 of the two sub-pixels are adjacent and a situation where the second writing transistors N1 are adjacent alternately occur. Therefore, the gate electrodes of the adjacent two first data writing transistors P1 can be directly connected into an integrated structure, and the first control electrode group 191 is formed, the gate electrodes of the adjacent second data writing transistors N1 can be directly connected into an integrated structure, and the second control electrode group 192 is formed. This arrangement can make the arrangement of the pixels more compact under the premise of satisfying the design rules, which helps to improve the resolution of the display substrate.

As illustrated in FIG. 27A, for two adjacent sub-pixels 100 in the first direction D1, in a case that their driving transistors N2 are adjacent, the active regions N2a of the two driving transistors N2 are connected with each other as a whole structure, that is, the active regions N2a of the two driving transistors N2 are located in a same doped region B (N well) of the base substrate 101, and the first electrodes of the two driving transistors N2 are connected with each other as a whole to form a third control electrode group 193, to receive the same first power supply voltage VDD; in a case that their bias transistors N3 are adjacent, the gate electrodes of the two bias transistors N3 are connected with each other as a whole structure, to receive a same second common voltage Vcom2; the active regions N3a of the two bias transistors N3 are connected with each other as a whole structure, that is, the active regions N3a of the two bias transistors N3 are located in a same doped region C (N well) of the base substrate 101, and the first electrodes of the two bias transistors N3 are connected with each other as a whole structure, to receive a same second power supply voltage VSS.

This arrangement can make the arrangement of pixels more compact under the premise of meeting the design rules, which helps to improve the resolution of the display substrate.

FIGS. 28A to 28D show the formation process of the substrate structure illustrated in FIG. 27A, for clarity, only two rows and two columns of sub-pixels are illustrated in the FIGS. 28A to 28D and FIG. 27A, that is, four adjacent sub-pixels 100. The formation process of the display sub-strate provided by the embodiment of the present disclosure will be exemplarily described below with reference to FIGS. 28A to 28D, but this is not intended to limit the present disclosure.

For example, a silicon-based substrate is provided, for example, the material of which is P-type single crystal silicon. N-type transistors (such as driving transistors) can be manufactured directly on the P-type silicon substrate, that is, the P-type substrate acts as a channel region of the N-type transistor, which is beneficial to take advantage of the high speed of NMOS devices, so that the circuit performance is improved.

Figures 28A, 28B:
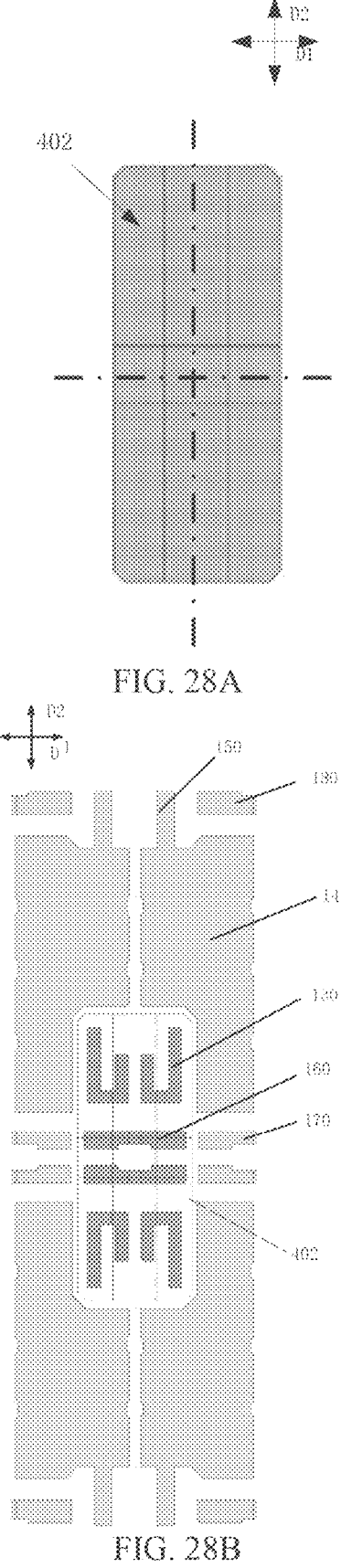
FIGS. 28A to 28E illustrate a formation process of the substrate structure illustrated in FIG. 27A.

As illustrated in FIG. 28A, for example, N-type doping is performed on the P-type silicon substrate, to form an N-type well region, that is, the second region 402, which serves as the substrate of the first data writing transistor P1 and the resistor 130.

For example, the second regions 402 of two sub-pixels adjacent in the first direction D1 may be connected with each other, and the second regions 402 of two sub-pixels adjacent in the second direction D2 may be connected with each other. For example, in a case that the N-type doping is performed, an undoped region on the base substrate 101 is shielded.

As illustrated in FIG. 27B and FIG. 28B, for example, a first insulating layer 201 is formed on the base substrate 101, and then a polysilicon layer 102 is formed on the first insulating layer 201.

The first insulating layer 201 includes a gate insulating layer of each of the transistors, and further includes a dielectric layer 104 of the storage capacitor Cst. The polysilicon layer 102 includes a first capacitor electrode 141, a resistor 130, and the gate electrodes 150, 160, 170, and 180 of the transistors (P1, N1 to N3).

The gate electrode of the first data writing transistor P1 is located in the second region 402, the N-type well region serves as a channel region of the P-type transistor. The resistor 130 is also located in the second region 402, forming the resistor 130 of polysilicon material in the N-type sub-strate helps to reduce parasitic effects, and the circuit char-acteristics are improved. Each of the N-type transistors is formed directly on the P-type substrate.

As illustrated in FIG. 28B, patterns of the polysilicon layers in the two adjacent sub-pixels in the first direction D1 are symmetrical about the axis of symmetry along the second direction D2; and patterns of the polysilicon layers in the two adjacent sub-pixels in the second direction D2 are symmetrical about the axis of symmetry along the first direction D1.

For example, the gate electrodes of the first data writing transistor P1 and the second data writing transistor N1 of two adjacent sub-pixels in the first direction D1 may be integrally formed respectively.

For example, the first insulating layer is formed on the base substrate by a thermal oxidation method. For example, material of the first insulating layer is silicon nitride, oxide or oxynitride.

For example, a polysilicon material layer is formed on the first insulating layer by a chemical vapor deposition process (PVD), and then the polysilicon layer 102 is formed by performing a photolithography process on the polysilicon material layer.

Figure 28C:
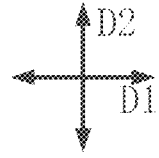
Figure 28C:
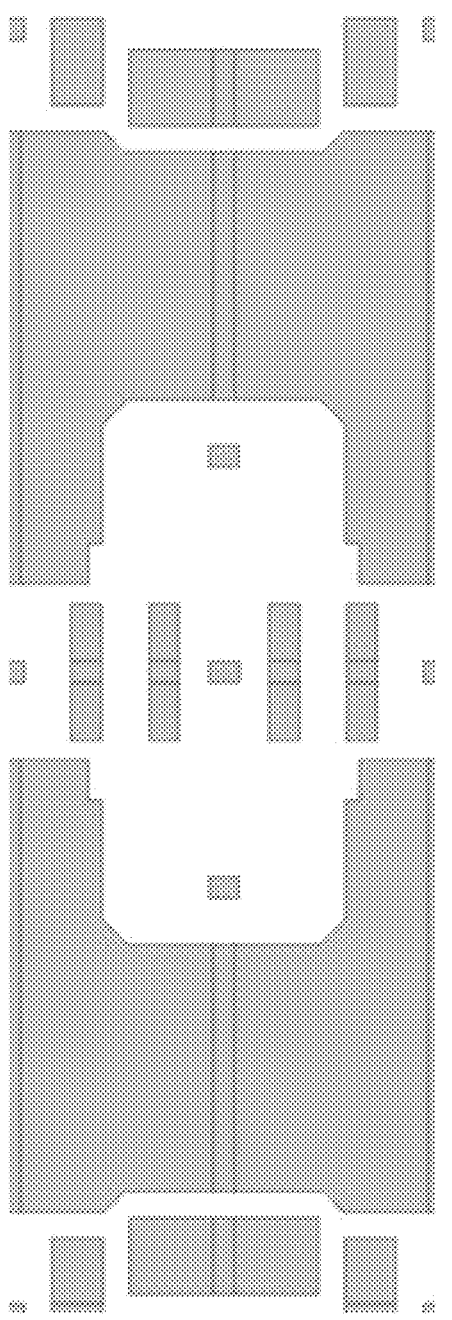
Figure 28C:
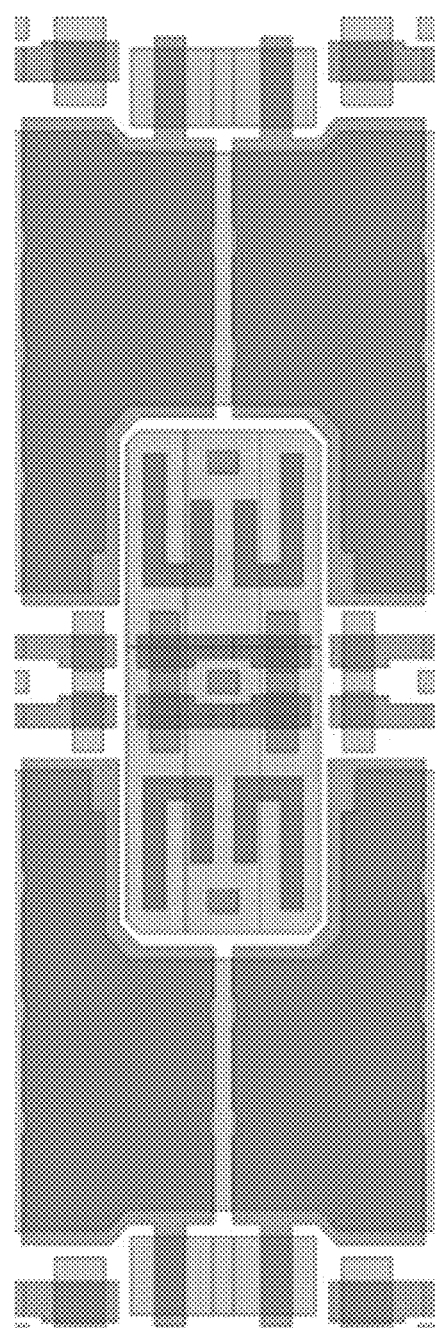

FIG. 28C shows a doped window region 103 of the base substrate (left figure), and the doped window region is illustrated on a substrate structure illustrated in FIG. 28B (right figure). For example, the doping is a heavy doping, to form contact hole regions for electrical connection on the base substrate. For example, the doped window region includes the source region and the drain region of each of the transistors. For example, the doped window region further includes the contact hole regions of the substrate and the contact hole region of the resistor 130, for example, includ-ing the contact hole regions 400*a*, 400*b*, 411*a*, 411*b*, 145*a*, 145*b*, 133, and 134 illustrated in FIG. 27B. For example, since the gate electrodes of the transistors are formed of polysilicon material, the gate electrodes of the polysilicon material also need to be doped. During doping, a barrier layer needs to be formed to shield the undoped region, and only the corresponding doped window region and amor-phous silicon region are exposed.

It should be noted that FIG. 28C only illustrates each of the doping window regions, in a case that the doping process is actually performed, a corresponding barrier layer/mask layer is arranged to expose the corresponding doping win-dow region and the polysilicon region for doping. For example, material of the barrier layer/the mask layer may be a photoresist or an oxide material.

Figure 28D:
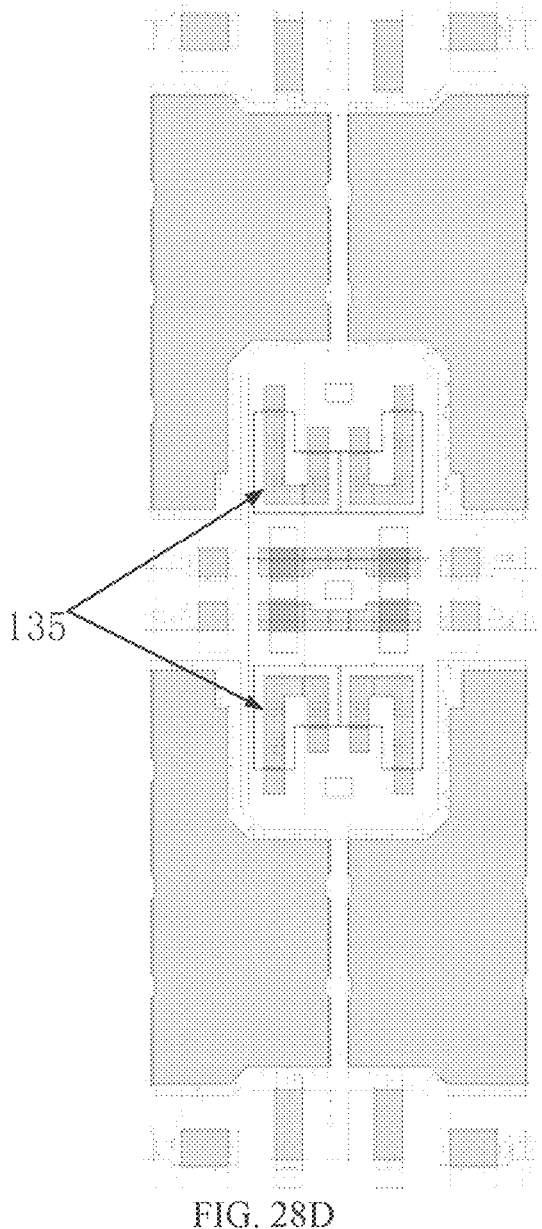

As illustrated in FIG. 28D, a barrier layer 135 is formed corresponding to the resistor 130. In order to protect a resistance value of the resistor 130, the resistor 130 needs to be shielded during the doping process to prevent the resistor 130 from being damaged due to doping. The barrier layer 135 shields a main body portion of the resistor 130, only the contact hole regions 133 and 134 at two ends of the resistor 130 are exposed.

For example, the barrier layer 135 may be silicon nitride, silicon oxide or silicon oxynitride, or may be a photoresist material. After the doping process is completed, the barrier layer 135 may remain in the display substrate or may be removed.

In other examples, the barrier layer 135 of the resistor 130 can also be formed together with the barrier layer/the mask layer in other regions during the doping process, which is not limited in the embodiments of the present disclosure.

For example, in the doping process, N-type doping and P-type doping are required, respectively, for example, to form the source region and the drain region of an N-type transistor and the source region and the drain region of a P-type transistor. In a case that the N-type doping process is performed, a barrier layer needs to be formed to shield a region without the N-type doping; and in a case that the P-type doping process is performed, a barrier layer needs to be formed to shield a region without the P-type doping.

Figure 28E:
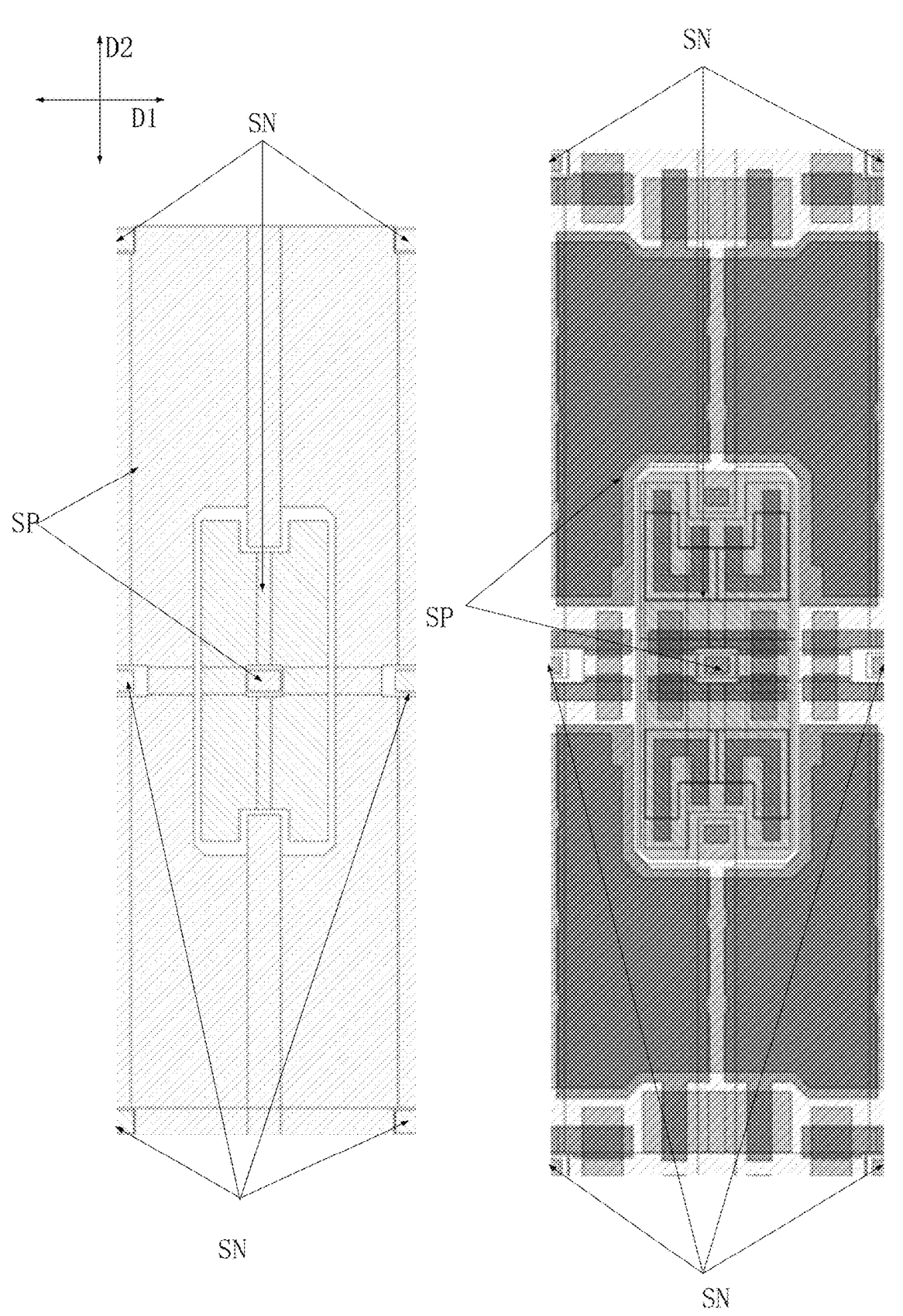

The N-type doped region SN and the P-type doped region SP are illustrated with different hatching patterns (left figure) in FIG. 28E, and the N-type doped region SN and the P-type doped region SP are illustrated on the substrate illustrated in FIG. 28D (right figure). The N-type doped region SN and the P-type doped region SP are also illustrated in FIG. 27B and may be referred to together.

For example, performing the N-type doping process includes forming a barrier layer to cover the P-type doping region SP, and to cover the N-type doping region SN except for the doping window region and the polysilicon region, only the doping window region and the polysilicon region in the N-type doping region SN are retained, that is, the SN region is overlapped with the doped window region 103 and the polysilicon region illustrated in FIG. 28C; and then an N-type doping process is performed. Referring to FIG. 27B, the gate electrodes, the first electrodes and second electrodes of the transistors N1 to N3, and contact hole regions 411*a*, 411*b*, 145*a*, 145*b* can be formed through the N-type doping process. The N-type doping process can be, for example, an ion implantation process, and doping element may be, for example, boron element.

For example, performing the P-type doping process includes forming a barrier layer to cover the N-type doping region SN, and to cover an region except the doped window region and the polysilicon region in the P-type doped region SP, only the doping window region and polysilicon region in the P-type doping region SP are retained, that is, an over-lapping region of the SP region, the doped window region 103 and the polysilicon region illustrated in FIG. 28C; then a P-type doping process is performed. Referring to FIG. 27B, the gate electrode, the first electrode and the second electrode of the transistor P1 and the contact holes 400 *a*, 400 *b*, 133, and 134 can be formed through the P-type doping process. The P-type doping process can be, for example, an ion implantation process, a doping element may be, for example, a phosphorus element.

During the doping process, for example, an ion implantation process is used, the polysilicon pattern can act as a mask, so that implantation of ions into the silicon-based substrate occurs on two sides of the polysilicon, so that the first electrode and the second electrode of each of the transistors are formed, and self-alignment is realized. In addition, resistivity of the polysilicon with high resistance is reduced after the doping process, and the gate electrodes of the transistors and a first capacitor electrode can be formed. Therefore, the use of polysilicon materials as materials of the resistors and the gate electrodes has various beneficial effects, and a process cost is saved.

In this way, the structure of the display substrate illustrated in FIG. 27A is formed, including the transistors P1, N1 to N3, the resistor 130, and the storage capacitor Cst.

For example, the corresponding transistors, resistors and storage capacitors Cst in two adjacent sub-pixels in the first direction D1 are respectively symmetrical about the axis of symmetry along the second direction D2; and the corre-sponding transistors, resistors and storage capacitors Cst in two adjacent sub-pixels in the second direction D2 are respectively symmetrical about the axis of symmetry along the first direction D1.

It should be noted that, in the present embodiment, the storage capacitor Cst is a capacitor formed by the field effect, after a voltage is applied to the first capacitor electrode 141, inverse charges are generated in a region of the base substrate 101 under the first capacitor electrode 141, and a lower plate of the storage capacitor Cst, that is, the second capacitor electrode 142, is conductive.

In other embodiments, the region of the base substrate 101 under the first capacitor electrode 141 may also be pre-conducted (for example, doping treatment) to form the second capacitor electrode 142. The embodiment of the present disclosure does not limit this.

A second insulating layer 202, a first conductive layer 301, a third insulating layer 203, a second conductive layer 302, a fourth insulating layer 204, a third conductive layer 303, a fifth insulating layer 205, and a fourth conductive layer 304 are sequentially formed on the substrate illustrated in FIG. 27A, and then the display substrate illustrated in FIG. 26A is formed.

Figure 29A:
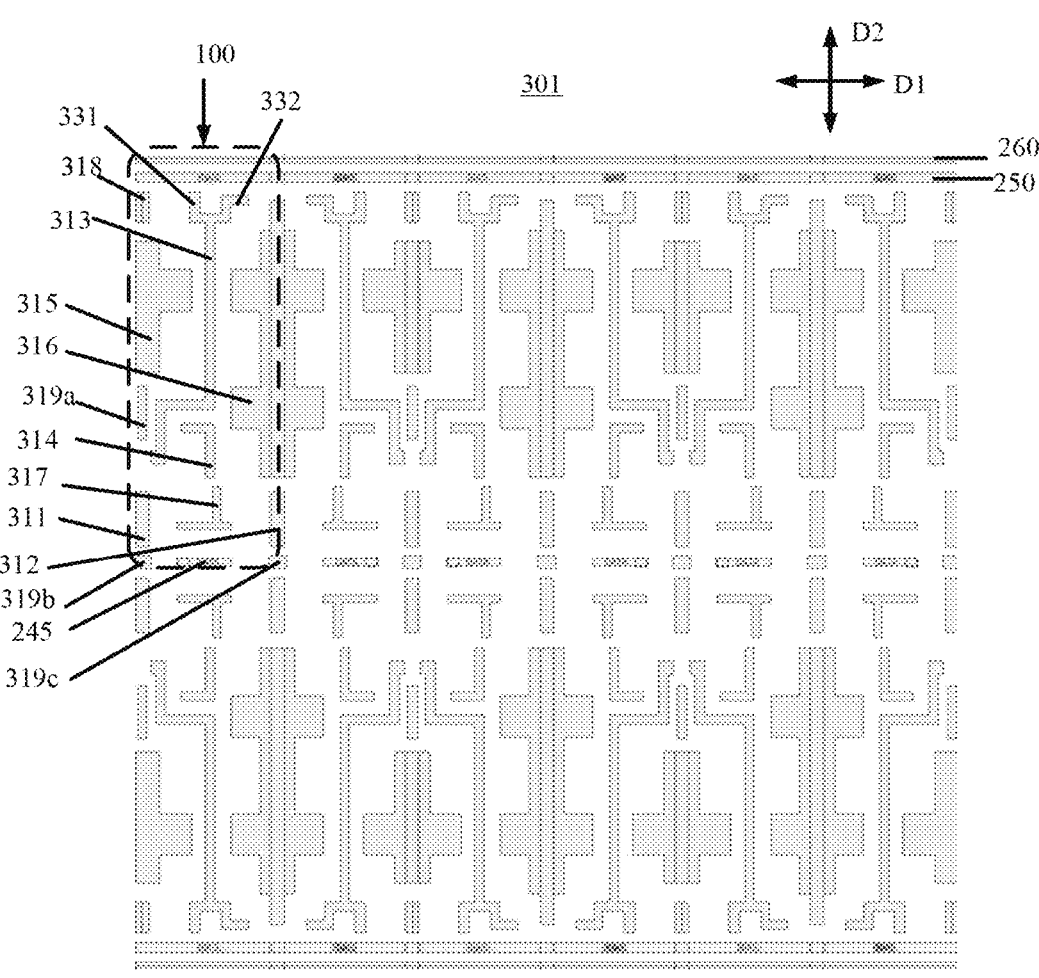
FIGS. 29A to 29C are schematic diagrams of a process of forming a display substrate provided by an embodiment of the present disclosure.
Figures 29B, 29C:
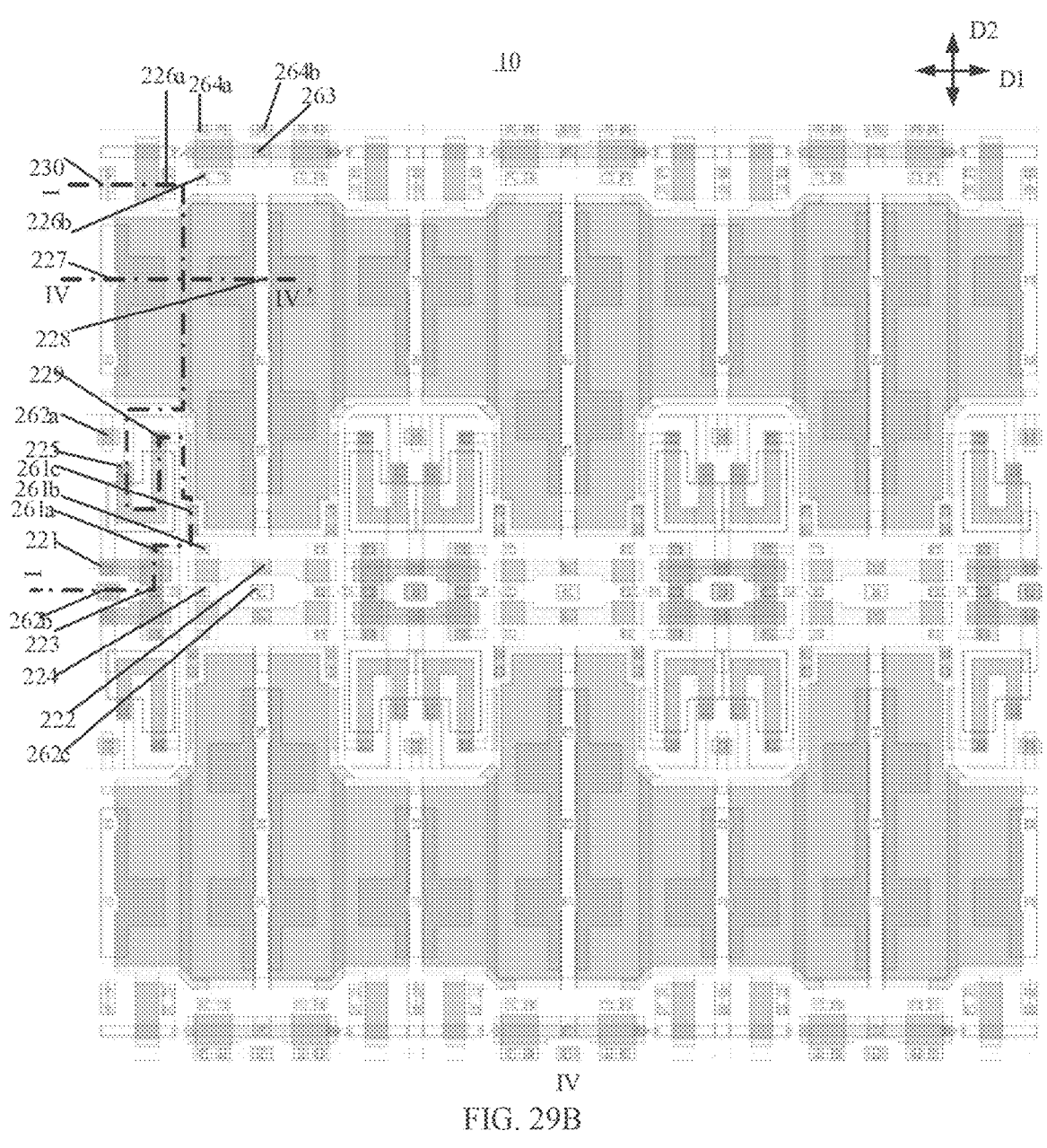

FIGS. 29A and 29B respectively show situations in which a pattern of the first conductive layer 301 and the first conductive layer 301 are arranged on the substrate structure illustrated in FIG. 27A, FIG. 29C shows a cross-sectional schematic diagram of FIG. 29B along a section line IV-IV'; the via holes in the second insulating layer 202 are also illustrated in FIG. 29B, the via holes correspond to the contact regions in FIG. 27B one by one, and are used to electrically connect the contact hole regions with the pattern in the first conductive layer 301. For the sake of clarity, only two rows and six columns of sub-pixels are shown in FIG. 29, and a region of a sub-pixel 100 is shown with a dashed box; in addition, FIG. 29B also shows a position of the section line I-I' in FIG. 26A correspondingly.

As illustrated in FIG. 29A, patterns of the first conductive layers in two adjacent sub-pixels in the first direction D1 are symmetrical about the axis of symmetry along the second direction D2; and patterns of the first conductive layers in two adjacent sub-pixels in the second direction D2 are symmetrical about the axis of symmetry along the first direction D1. The patterns of the first conductive layers will be exemplarily described below by taking a sub-pixel as an example.

As illustrated in FIG. 29A, the first conductive layer 301 includes a connection electrode 313, and the connection electrode 313 is used to electrically connect the first end 131 of the resistor 130 with the second electrode 152 of the driving sub-circuit 112.

For example, with reference to FIG. 29B, the first end of the connection electrode 313 is electrically connected to the first end 131 of the resistor 130 through the via hole 225 in the second insulating layer 202; the second end of the connection electrode 313 includes a first branch 331 and a second branch 332, referring to FIG. 26B, the first branch 331 is electrically connected with the first electrode 151 of the driving transistor N2 through the via hole 226*a* in the second insulating layer 202, and the second branch 332 is electrically connected with the first electrode 181 of the bias transistor N3 through the via hole 226*b* in the second insulating layer 202.

For example, as illustrated in FIG. 29B, in the second direction D2, the via hole 225 and the via hole 226*a* are respectively located on opposite sides of the first capacitor electrode 141; that is, an orthographic projection of the connection electrode 313 on the base substrate 101 passes through an orthographic projection of the first capacitor electrode 141 on the base substrate 101 in the second direction D2.

For example, the via hole 226*a* and the via hole 226*b* may be arranged to at least two, to reduce contact resistance.

For example, with reference to FIG. 29A and FIG. 29B, the first conductive layer 301 further includes a connection electrode 314, the connection electrode 314 is electrically connected with the second end 132 of the resistor 130 through the via hole 229 in the second insulating layer 202, and the connection electrode 314 is used for electrical connection with the first electrode 121 of the light emitting element 120.

For example, the connection electrode 314 is in a shape of an L, one branch of the connection electrode 314 is electrically connected with the second end 132 of the resistor 130, and the other branch is used to electrically connect with the first electrode 121 of the light-emitting element 120.

For example, as illustrated in FIG. 29B and FIG. 29C, the first conductive layer 301 further includes a third capacitor electrode 315, and the third capacitor electrode 315 is overlapped with the first capacitor electrode 141 in a direc-tion perpendicular to the base substrate. The third capacitor electrode 315 is electrically connected with the contact hole region 145*a* through the via hole 227 in the second insulat-ing layer 202, to be electrically connected with the second capacitor electrode 142; that is, in the direction perpendicu-lar to the base substrate, the second capacitor electrode 142 and the third capacitor electrode 315 are respectively located on two sides of the first capacitor electrode 141, and are electrically connected with each other, so that a structure of parallel capacitors is formed, and the capacitance value of the storage capacitor Cst is increased.

For example, as illustrated in FIG. 29B and FIG. 29C, the first conductive layer 301 further includes a fourth capacitor electrode 316, and the fourth capacitor electrode 316 is overlapped with the first capacitor electrode 141 and the second capacitor electrode 142 in a direction perpendicular to the base substrate. The fourth capacitor electrode 316 is electrically connected with the contact hole region 145b through the via hole 228 in the second insulating layer 202, to be electrically connected with the second capacitor electrode 142. The fourth capacitor electrode 316 can further increase the capacitance value of the storage capacitor Cst, and the circuit performance is improved.

For example, the third capacitance electrode 315 and the fourth capacitance electrode 316 are located on two sides of the connection electrode 313 in the first direction D1.

For example, as illustrated in FIG. 29A, the adjacent third capacitor electrodes 315 in the two sub-pixels adjacent to each other in the first direction D1 may be integrally formed to receive a same second power supply voltage VSS, and the adjacent fourth capacitor electrodes 316 in the two sub-pixels adjacent to each other in the first direction D1 may be integrally formed to receive the same second power supply voltage VSS.

For example, at least two via holes 227 and at least two via holes 228 can be arranged respectively to reduce contact resistance; for example, the at least two via holes 227 are arranged along the second direction D2, and the at least two via holes 228 are arranged along the second direction D2.

For example, the first conductive layer 301 further includes a connection electrode 317, the connection electrode 317 is used to electrically connect the second end of the data writing sub-circuit with the first end of the storage sub-circuit, that is, the second electrode 161 of the first data writing transistor P1, the second electrode 171 of the second data writing transistor N1 and the first capacitor electrode 141 are electrically connected.

With reference to FIGS. 29A and 29B, the connection electrode 317 includes three ends, for example, is a structure in a shape of a T. Referring to FIG. 26B, the first end of the connection electrode 317 is electrically connected with the second electrode of the first data writing transistor P1 through the via hole 261a in the second insulating layer 202, the second end of the connection electrode 317 is electrically connected with the second electrode of the second data writing transistor N1 through the via hole 261b in the second insulating layer 202, and the third end of the connection electrode 317 is electrically connected with the first capacitor electrode 141 through the via hole 261c in the second insulating layer 202.

For example, as illustrated in FIG. 29B, in the second direction D2, the connection electrode 314 is at least partially overlapped with the third end of the connection electrode 317. This arrangement makes the pixel layout more compact, so that the space utilization rate of the display substrate is improved, and the resolution of the display substrate is improved.

With referring to FIG. 29A and FIG. 29B, the first conductive layer 301 further includes a first scan line connection part 311 and a second scan line connection part 312, and the first scan line connection part 311 is used for electrically connecting with the first scan line so that the gate electrode of the first data writing transistor P1 receives the first control signal SEL. The second scan line connection part 312 is used for electrically connecting with the second scan line so that the gate electrode of the second data writing transistor N1 receives the first control signal SEL_B.

For example, the first scan line connection part 311 is electrically connected with the gate electrode of the first data writing transistor P1 through the via hole 221 in the second insulating layer 202, and the second scan line connection part 312 is electrically connected with the gate electrode of the second data writing transistor N1 through the via hole 222 in the second insulating layer 202.

For example, as illustrated in FIG. 29A, adjacent sub-pixels in the first direction D1 share the first scan line connection part 311 or the second scan line connection part 312.

As illustrated in FIG. 29A, the first conductive layer 301 further includes a data line connection part 245 (an example of the third connection electrode of the present disclosure), the data line connection part 245 is used for electrical connection with the data line, so that the first electrode of the first data writing transistor P1 and the first electrode of the second data writing transistor N1 receive the data signal Vd transmitted by the data line.

As illustrated in FIG. 29B, the data line connection part 245 is electrically connected with the first electrode 161 of the first data writing transistor P1 through the via hole 223 in the second insulating layer 202, and is electrically connected with the first electrode 171 of the second data writing transistor N1 through the hole 224 in the second insulating layer 202.

For example, as illustrated in FIG. 29A, a plurality of data line connection parts 245 are arranged at intervals in the first direction D1, for example, the plurality of data line connection parts 245 are located at the boundary between two sub-pixel rows. For example, two adjacent sub-pixels in the second direction D2 share one data line connection part 245.

Referring to FIGS. 29A and 29B, the first conductive layer 301 further includes a connection electrode 318, and the connection electrode 318 is electrically connected with the first electrode of the driving transistor N2 through the via hole 230 in the second insulating layer 202.

Referring to FIGS. 27A and 27B, the first conductive layer 301 further includes connection electrodes 319a, 319b and 319c, these connection electrodes are arranged for biasing the substrates of the transistors, for example, for connecting the N-type substrate to the first power supply voltage end to receive the first power supply voltage VDD (high voltage), or for connecting the P-type substrate to the second power supply voltage end to receive the second power supply voltage VSS (low voltage), in this way, parasitic effects such as offset effect can be avoided, and the stability of the circuit can be improved.

Referring to FIG. 27B, the connection electrodes 319a and 319b are respectively electrically connected with the contact hole regions 411a and 411b in the second region (N well region) 402 in the base substrate 101 through the via holes 262a and 262b in the second insulating layer 202, and the connection electrodes 319a and 319b are used to connect to the first voltage end VDD to bias the N-type substrate of the first data writing transistor P1. The connection electrode 319c is electrically connected with the contact hole region 400a in the base substrate 101 through the via hole 262c in the second insulating layer 202, and the connection electrode 319c is used for connecting to the second voltage end VSS to bias the P-type substrate where the second data writing transistor N1 is located.

With reference to FIGS. 29A and 29B, the first conductive layer 301 further includes a bias voltage line 250. and the bias voltage line 250 extends along the first direction D1, and is electrically connected with the gate electrode of the bias transistor N3 through the via hole 263 in the second insulating layer 202, to provide the second common voltage Vcom2.

With referring to FIG. 27B and FIGS. 29A and 29B, the first conductive layer 301 further includes a power supply line 260 (one example of a ninth power line of the present disclosure), the power line 260 extends along the first direction D1, for transmitting the second power supply voltage VSS. The power supply line 260 is electrically connected with the first electrode of the bias transistor N3 through the via hole 264a in the second insulating layer 202 to provide the second power supply voltage VSS, and is electrically connected with the contact hole region 400b in the base substrate 101 through the via hole 264b in the second insulating layer 202, to bias the P-type substrate (one example of the second doped region of the present disclosure) where the second data writing transistor N1 is located.

Figure 30A:
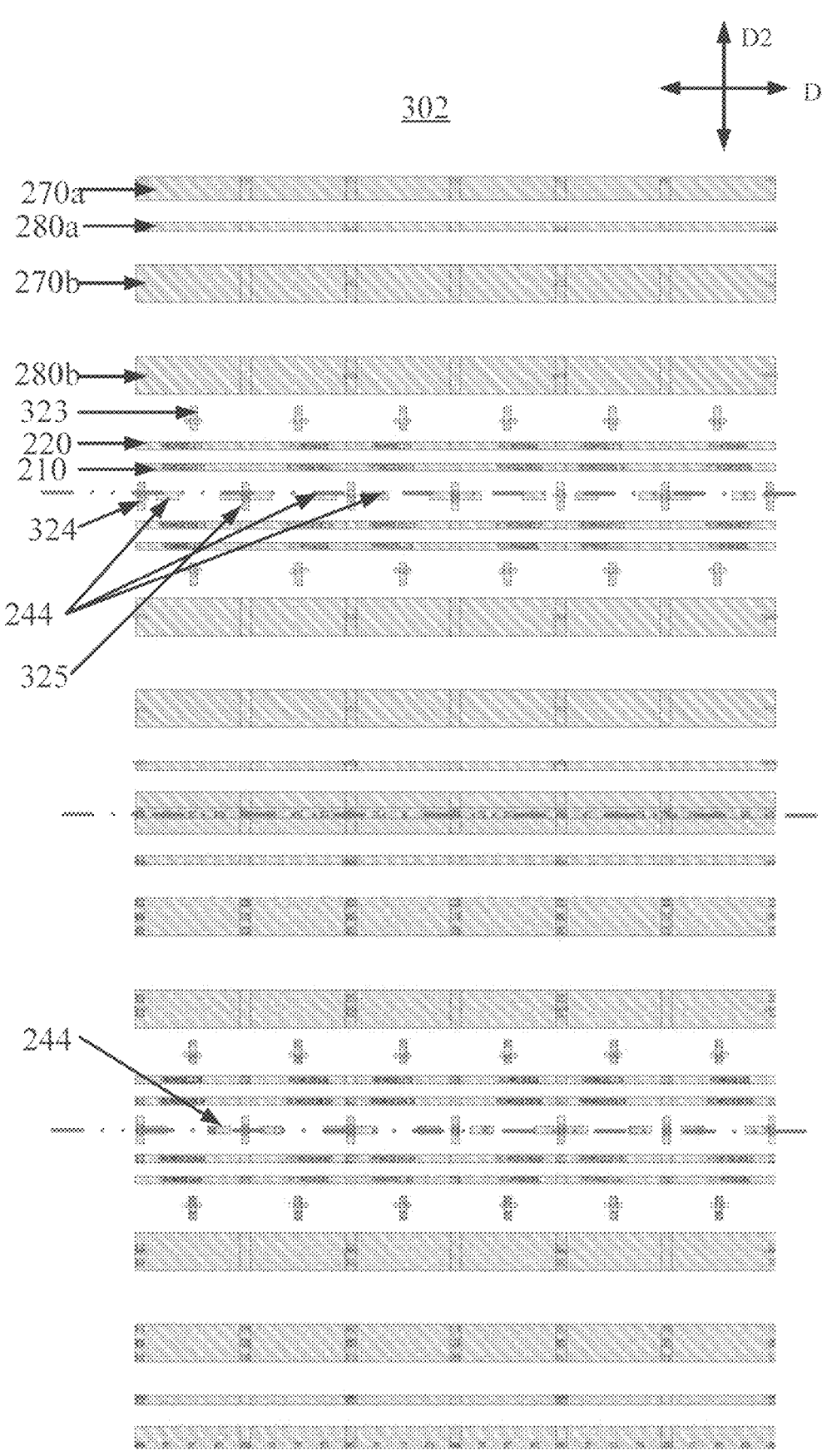
FIG. 30A is a schematic diagram of a second conductive layer in a display substrate provided by an embodiment of the present disclosure.
Figure 30B:
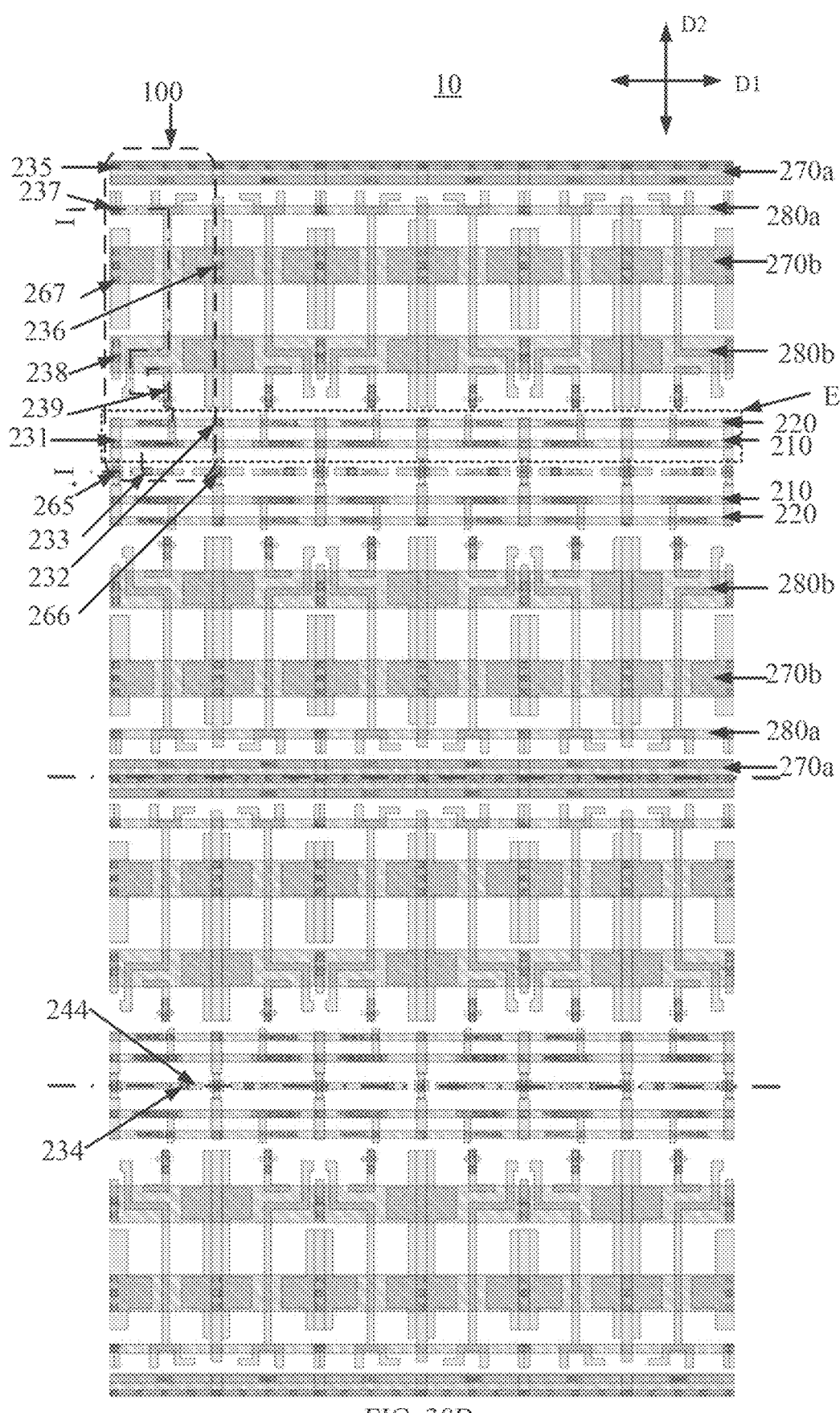
FIG. 30B is a schematic diagram of a first conductive layer and a second conductive layer in a display substrate provided by an embodiment of the present disclosure.

FIG. 30A shows a schematic diagram of the second conductive layer 302, FIG. 30B shows the second conductive layer 302 on the basis of the first conductive layer 301, FIG. 30B also shows via holes in the third insulating layer 203. The via holes in the third insulating layer 203 are used to connect the patterns in the first conductive layer 301 and the patterns in the second conductive layer 302. For the sake of clarity, only four rows and six columns of sub-pixels are illustrated in FIG. 30B, and a dividing line between the two sub-pixel rows is shown with a dashed line; in addition, FIG. 30B also shows the position of the section line I-I' in FIG. 26A correspondingly.

As illustrated in FIG. 30A, the patterns of the second conductive layers in the two adjacent sub-pixels in the first direction D1 are symmetrical about the axis of symmetry along the second direction D2; and the patterns of the second conductive layers in the two adjacent sub-pixels in the second direction D2 are symmetrical about the axis of symmetry along the first direction D1. The patterns of the second conductive layers will be exemplarily described below by taking a sub-pixel as an example.

As illustrated in FIG. 30A, the second conductive layer 302 includes power lines 270a, 270b, 280a and 280b extending along the first direction D1, the power lines 270a and 270b are used to transmit the second power supply voltage VSS, and the power lines 280a and 280b are used to transmit the first power supply voltage VDD. The power lines 270a, 280a, 270b and 280b are alternately arranged in the second direction D2.

With reference to FIG. 26B, FIGS. 30A and 30B, the power line 270a (one example of the first power line of the present disclosure) is electrically connected with the power line 260 in the first conductive layer 301 through a plurality of via holes 235 in the third insulating layer 203, so that a parallel structure is formed, and resistance on the traces are effectively reduced; and the plurality of via holes 235 are arranged along the first direction D1. For example, the power line 270b is electrically connected with the fourth capacitor electrode 316 through a plurality of via holes 236 in the third insulating layer 203 to provide the second power supply voltage VSS; for example, the plurality of via holes 236 are arranged along the second direction D2. For example, the power supply line 270b is also electrically connected with the third capacitor electrode 315 through a plurality of via holes 267 in the third insulating layer 203 to provide the second power supply voltage VSS; for example, the plurality of via holes 267 are arranged along the second direction D2.

For example, in the second direction D2, an average line width of the power line 270b (one example of the seventh power line in the present disclosure) is greater than an average line width of the power line 270a, this is because the fourth capacitor electrode 316 and the third capacitor electrode 315 electrically connected with the power line 270b both have large areas, setting the power line 270b to have a larger width can facilitate the formation of a plurality of connection holes 236 and 267 with the fourth capacitor electrode 316 and the third capacitor electrode 315, so that the contact resistance is effectively reduced.

With referring to FIGS. 30A and 30B, the power line 280a (one example of the second power line of the present disclosure) is electrically connected with the connection electrode 318 (one example of a fifth connection electrode of the present disclosure) in the first conductive layer 301 through the via hole 237 in the third insulating layer 203, so that the power line 280a is connected to the first electrode of the driving transistor N2 to provide the first power supply voltage VDD. The power line 280b is electrically connected with the connection electrode 319a in the first conductive layer 301 through the via hole 238 in the third insulating layer 203, so that a high voltage bias is performed on the second region (N-well region) 402 (an example of the first doped region of the present disclosure) in the base substrate 101; for example, the plurality of via holes 238 are arranged along the second direction D2.

For example, in the second direction D2, an average line width of the power line 280b (one example of an eighth power line in the present disclosure) is greater than an average line width of the power line 280a, this is because the connection electrode 319a electrically connected with the power supply line 280b has a larger size in the second direction D2, setting the power line 280b to have a larger width can facilitate the formation of a plurality of connection holes 238 between the power line 280b and the connection electrode 319a, so that the contact region with the connection electrode 319a is increased, and the contact resistance is effectively reduced.

For example, the second conductive layer 302 further includes a plurality of first scan lines 210 and a plurality of second scan lines 220 extending along the first direction D1. For example, the scan line 11 shown in FIG. 24A may be the first scan line 210 or the second scan line 220.

With referring to FIG. 29A and FIG. 29B, the first scan line 210 is electrically connected with the first scan line connection part 311 through the via hole 231 in the third insulating layer 203. The second scan line 220 is electrically connected with the second scan line connection part 312 through the via hole 232 in the third insulating layer 203.

For example, with reference to FIGS. 26B, 30A and 30B, the second conductive layer 302 further includes a connection electrode 323, the connection electrode 323 is electrically connected with the connection electrode 314 in the first conductive layer 301 through the via hole 239 in the third insulating layer 203, so that the connection electrode 323 is connected to the second end 132 of the resistor 130. The connection electrode 323 is used for electrical connection with the first electrode 121 of the light emitting element 120. For example, a number of the via holes 239 is at least two.

For example, with reference to FIGS. 30A and 30B, the second conductive layer 302 further includes a connection electrode 324, the connection electrode 324 is electrically connected with the connection electrode 319b in the first conductive layer 301 through the via hole 265 in the third insulating layer 203, so that the connection electrode 324 is electrically connected to the contact hole region 411 *b* in the second region (N well region) 402 in the base substrate 101.

For example, with reference to FIGS. 30A and 30B, the second conductive layer 302 further includes a connection electrode 325, and the connection electrode 325 is electrically connected with the connection electrode 319*c* in the first conductive layer 301 through the via hole 266 in the third insulating layer 203, to be electrically connected with the contact hole region 400*a* in the base substrate 101.

For example, the connection electrode 325 is a cross-shaped structure. For example, the connection electrodes 324 and the connection electrodes 325 are alternately distributed in the first direction D1, and are located at the boundary between two sub-pixel rows.

For example, as illustrated in FIG. 30A, the second conductive layer 302 further includes a data line connection part 244 (an example of a fourth connection electrode of the present disclosure). With referring to FIG. 30B, the data line connection part 244 is electrically connected with the data line connection part 245 in the first conductive layer 301 through the via hole 233.

For example, as illustrated in FIG. 30A, the plurality of data line connection parts 244 are arranged at intervals in the first direction D1, a connection electrode 324 or a connection electrode 325 is arranged between every two adjacent data line connection parts 244.

For example, the data line connection parts 244 are located at the boundary between two sub-pixel rows. For example, two adjacent sub-pixels in the second direction D2 share one data line connection part 244.

For example, with referring to FIG. 30A and FIG. 30B, in the second direction D2, the data line connection parts 244 located in each column of sub-pixels are alternately located on two sides of the data line connection parts 245, which are electrically connected with the first ends and the second ends of the data line connecting parts 245 through the via holes 233 and 234 respectively, which is to connect the data line connection parts 245 to different data lines.

Figure 31A:
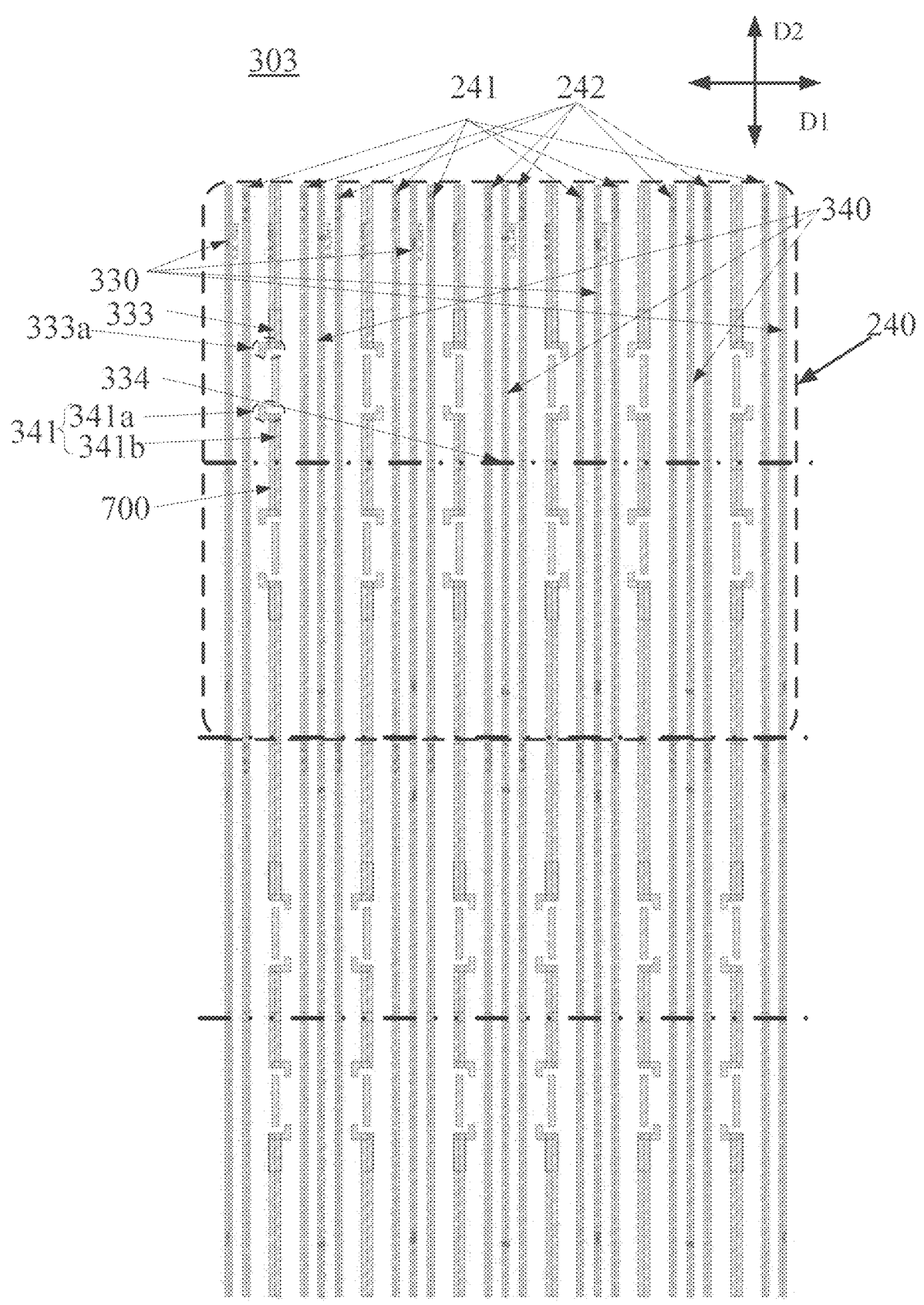
FIG. 31A is a schematic diagram of a third conductive layer in a display substrate provided by an embodiment of the present disclosure.
Figure 31B:
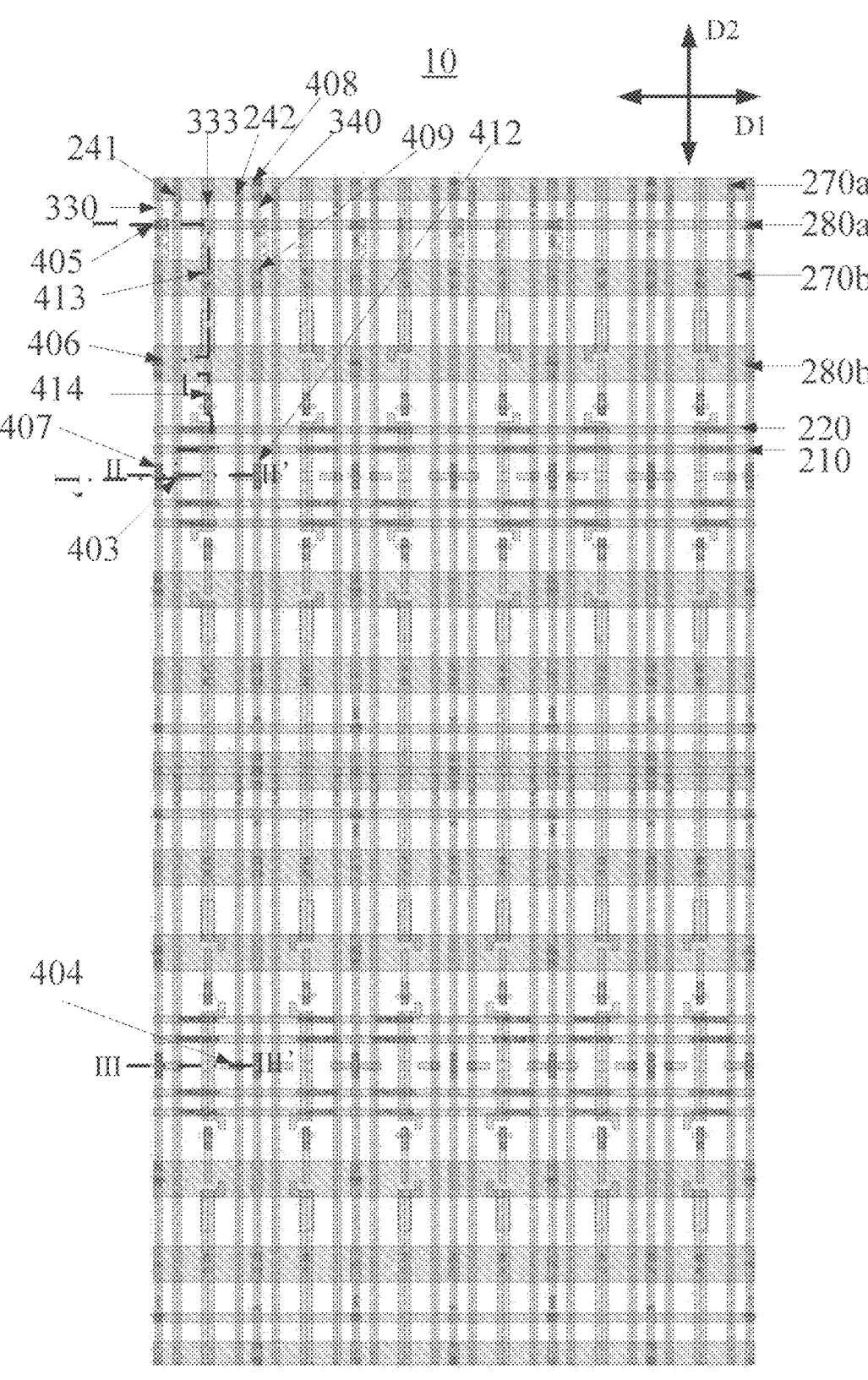
FIG. 31B is a schematic diagram of a second conductive layer and a third conductive layer in a display substrate provided by an embodiment of the present disclosure.

FIG. 31A shows a schematic diagram of the third conductive layer 303, FIG. 31B shows the third conductive layer 303 on the basis of the second conductive layer 302, the via holes in the fourth insulating layer 204 are also shown in FIG. 31B, the via holes in the fourth insulating layer 204 are used to connect the patterns in the second conductive layer 302 and the patterns in the third conductive layer 303. For the sake of clarity, only the conductive patterns corresponding to four rows and six columns of sub-pixels are shown in the FIG. 31B, and the dividing line of two rows of sub-pixels is shown in FIG. 31A with dashed lines; in addition, FIG. 31B also shows the position of the section line I-I' in FIG. 26A correspondingly.

For example, the third conductive layer 303 includes a plurality of data lines extending along the second direction D2, the plurality of data lines are used for connecting with the first ends of the data writing sub-circuits in the sub-pixels to provide a data signal Vd. For example, as illustrated in FIG. 31A, the plurality of data lines include a plurality of first data lines 241 and a plurality of second data lines 242, and the plurality of first data lines 241 and the plurality of second data lines 242 are alternately arranged in the first direction D1. For example, the data line 12 illustrated in FIG. 24A may be the first data line 241 or the second data line 242.

For example, the data lines are divided into a plurality of data line groups, each of the data line groups includes one first data line 241 and one second data line 242. For example, each of the sub-pixel columns is correspondingly connected with a data line group, that is, each of the sub-pixel columns is connected with a first data line 241 and a second data line 242; that is, one column of sub-pixels are driven by two data lines. This helps reduce the load on each of the data lines, so that the driving capability of the data line is improved, delay of the signal is reduced, and the display effect is improved.

Referring to FIG. 31B, the first data line 241 is electrically connected with the data line connection part 244 in the second conductive layer 302 illustrated in FIG. 30B between the sub-pixels in the first row and the sub-pixels in the second row through the via holes 403 in the fourth insulating layer 204, so that data signals are provided to the first rows and the second rows of sub-pixels. The second data line 242 is electrically connected with the data line connection part 244 in the second conductive layer 302 shown in FIG. 30B between the sub-pixels in the third row and the sub-pixels in the fourth row through the via holes 404 in the fourth insulating layer 204, so that data signals are provided to the third and fourth rows of sub-pixels.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other to obtain new embodiments.

What are described above is related to only the illustrative embodiments of the present disclosure and not limitative to the protection scope of the present application. Therefore, the protection scope of the present application shall be defined by the accompanying claims.

What is claimed is:

1. A display substrate, comprising:

a driving substrate, comprising a substrate and a driving circuit;

a first planarization layer, located on the driving circuit;

an anode layer, located at a side of the first planarization layer away from the driving substrate;

a pixel definition layer, located at a side of the anode layer away from the driving substrate;

a light emitting functional layer, located at a side of the anode layer away from the driving substrate;

a cathode layer, located at a side of the light emitting functional layer away from the driving substrate; and an encapsulation layer, located at a side of the cathode layer away from the driving substrate;

wherein the driving circuit comprises at least one transistor, the at least one transistor comprises a semiconductor layer, the anode layer comprises a plurality of anodes, the display substrate comprises a plurality of pixel openings, and the plurality of pixel openings are located at a side of the plurality of anodes away from the driving substrate, the plurality of pixel openings are configured to at least overlap with the plurality of anodes;

each of the anodes comprises a main body portion and a protrusion portion, the protrusion portion is connected with the main body portion, a size of the protrusion portion in a first direction is larger than a size of the main body portion in the first direction, the light emitting functional layer comprises a plurality of light emitting portions, and the plurality of light emitting portions are arranged in contact with main body portions of the plurality of anodes, a distance between a surface of the main body portion away from the substrate and a surface of the first planarization layer away from the substrate is smaller than a distance between a surface of the protrusion portion away from the substrate and a surface of the first planarization layer away from the substrate.

2. The display substrate according to claim 1, wherein an orthographic projection of the pixel definition layer on the driving substrate is overlapped with an orthographic projection of the protrusion portion on the driving substrate, the pixel definition layer comprises a pixel definition portion, and the pixel definition portion comprises:

a pixel definition planarization portion, located between two adjacent anodes; and protruding structures, respectively located at a side of protrusion portions of the two adjacent anodes away from the driving substrate, wherein the protruding structures are connected by the pixel definition planarization portion.

3. The display substrate according to claim 2, wherein each of the protruding structures comprises:

a first side wall, located at a side of the protruding structure close to a center of the main body portion; and a second side wall, connected with the first side wall, wherein the second side wall is further away from the driving substrate than the first side wall; and a slope angle of the first side wall is greater than a slope angle of the second side wall.

4. The display substrate according to claim 3, wherein each of the protruding structures further comprises:

a third side wall, located at a side of the protruding structure close to the pixel definition planarization portion, wherein the slope angle of the first side wall is $\alpha$, the slope angle of the second side wall is $\beta$, the slope angle of the third side wall is $\gamma$, and $\alpha$, $\beta$, and $\gamma$ satisfy the following formula:

$$\beta < \gamma < \alpha.$$

5. The display substrate according to claim 4, wherein the slope angle $\alpha$ of the first side wall, the slope angle $\beta$ of the second side wall, and the slope angle $\gamma$ of the third side wall satisfy the following formula:

$$(\alpha - \beta) = i * \gamma,$$

wherein a value range of i is from 0.8 to 1.2;

or, the slope angle $\alpha$ of the first side wall, the slope angle $\beta$ of the second side wall, and the slope angle $\gamma$ of the third side wall satisfy the following formula:

$$(\alpha - \beta) = j * (\gamma - \beta),$$

wherein a value range of j is from 1.5 to 3.

6. The display substrate according to claim 4, wherein the slope angle $\alpha$ of the first side wall, the slope angle $\beta$ of the second side wall, and the slope angle $\gamma$ of the third side wall satisfy the following formula:

$$(\alpha + \beta) = k * \gamma - \beta,$$

wherein a value range of k is from 2 to 3.

7. The display substrate according to claim 4, wherein a size of the first side wall in the first direction is H1, a size of the second side wall in the first direction is H2, a size of the third side wall in the first direction is H3, and H1, H2 and H3 satisfy the following formula:

$$H3 * \cos \gamma > H2 * \cos \beta > H1 * \cos \alpha.$$

8. The display substrate according to claim 4, wherein the protrusion portion of each of the anodes comprises a fourth side wall, located at the side of the protrusion portion close to the center of the main body portion, wherein a slope angle of the fourth side wall is $\delta$, and $\alpha$, $\beta$, and $\delta$ satisfy the following formula:

$$\beta < \delta < \alpha.$$

9. The display substrate according to claim 8, wherein the protrusion portion of each of the anodes comprises:

a first sub-anode layer, located at a side of the driving circuit away from the substrate;

a second sub-anode layer, located at a side of the first sub-anode layer away from the driving substrate; and a third sub-anode layer, located at a side of the second sub-anode layer away from the driving substrate, one end of the first sub-anode layer away from the main body portion comprises a bulge portion, and a thickness of the bulge portion in the first direction is greater than an average thickness of the first sub-anode layer in the first direction.

10. The display substrate according to claim 9, wherein one end of the third sub-anode layer away from the main body portion is bent in a direction close to the first sub-anode layer.

11. The display substrate according to claim 9, wherein the protrusion portion of each of the anodes further comprises:

a fourth sub-anode layer, located between the second sub-anode layer and the third sub-anode layer, wherein a size of the fourth sub-anode layer in the second direction is smaller than a size of the second sub-anode layer in the second direction.

12. The display substrate according to claim 11, wherein a size of a part of the third sub-anode layer going beyond the fourth sub-anode layer in the second direction is smaller than a size in the second direction of the overlapping region of the orthographic projection of the pixel definition layer on the driving substrate and the orthographic projection of the protrusion portion on the driving substrate.

13. The display substrate according to claim 11, wherein the second sub-anode layer comprises a fifth side wall, located at a side of the second sub-anode layer away from the main body portion, and the fourth sub-anode layer comprises a sixth side wall, located at a side of the fourth sub-anode layer away from the main body portion, a slope angle of the fifth side wall is greater than the slope angle of the fourth side wall, a slope angle of the sixth side wall is greater than the slope angle of the fourth side wall, and the slope angle of the fifth side wall is greater than the slope angle of the sixth side wall.

14. The display substrate according to claim 1, wherein the encapsulation layer comprises:

an inorganic encapsulation layer, located at a side of the cathode layer away from the driving substrate, wherein the inorganic encapsulation layer comprises a plurality of sub-inorganic encapsulation layers.

15. The display substrate according to claim 14, wherein, in a direction away from the driving substrate, refractive indexes of the plurality of sub-inorganic encapsulation layers first increase and then decrease.

16. The display substrate according to claim 14, wherein each of the sub-inorganic encapsulation layers comprises: alternately arranged flat regions and double arch interval regions, a first arch region located at a side of one flat region away from one double arch interval region, a second arch region between the flat region and the double arch interval region, and a third arch region located at a side of the flat region away from the second arch region, and the first arch region and the second arch region are symmetrically arranged with respect to a center of the flat region.

17. The display substrate according to claim 16, wherein a size of the flat region in the second direction is L, a distance between a center of the second arch region and a center of the third arch region in the second direction is a first distance D1, a distance between a center of the first arch region and the center of the second arch region in the second direction is a second distance D2, a radius of curvature of the first arch region, a radius of curvature of the second arch region and a radius of curvature of the third arch region are all R, and the first distance D1 satisfies the following formula:

$$D2 \leq (L + D1) < (L + R).$$

18. The display substrate according to claim 16, wherein a size of the flat region in a second direction is L, a distance between a center of the second arch region and a center of the third arch region in the second direction is a first distance D1, a distance between a center of the first arch region and the center of the second arch region in the second direction is a second distance D2, a radius of curvature of the first arch region, a radius of curvature of the second arch region and a radius of curvature of the third arch region are all R, the first distance D1 satisfies the following formula:

$$(L + D1) \leq D2 < (L + R).$$

19. The display substrate according to claim 16, wherein the plurality of sub-inorganic encapsulation layers comprises:

a first sub-inorganic encapsulation layer, located at a side of the cathode layer away from the driving substrate;

a second sub-inorganic encapsulation layer, located at a side of the first sub-inorganic encapsulation layer away from the driving substrate;

a third sub-inorganic encapsulation layer, located at a side of the second sub-inorganic encapsulation layer away from the driving substrate; and a fourth sub-inorganic encapsulation layer, located at a side of the third sub-inorganic encapsulation layer away from the driving substrate.

20. The display substrate according to claim 19, wherein an included angle between a first connection line of an edge of the flat region of the first sub-inorganic encapsulation layer close to the second arch region, an edge of the flat region of the second sub-inorganic encapsulation layer close to the second arch region, an edge of the flat region of the third sub-inorganic encapsulation layer close to the second arch region and an edge of the flat region of the fourth sub-inorganic encapsulation layer close to the second arch region and a surface of the driving substrate away from the anode layer is a first included angle, an included angle between a second connection line of a vertex of the second arch region of the first sub-inorganic encapsulation layer, a vertex of the second arch region of the second sub-inorganic encapsulation layer, a vertex of the second arch region of the third sub-inorganic encapsulation layer and a vertex of the second arch region of the fourth sub-inorganic encapsulation layer and the surface of the driving substrate away from the anode layer is a second included angle, and the first included angle is smaller than the second included angle.

21. The display substrate according to claim 19, wherein an upper surface of the first arch region of the first sub-inorganic encapsulation layer away from the substrate has a first radius of curvature, an upper surface of the first arch region of the second sub-inorganic encapsulation layer away from the substrate has a second radius of curvature, an upper surface of the first arch region of the third sub-inorganic encapsulation layer away from the substrate has a third radius of curvature, an upper surface of the first arch region of the fourth sub-inorganic encapsulation layer away from the substrate has a fourth radius of curvature, the first radius of curvature is smaller than the second radius of curvature, the second radius of curvature is smaller than the third radius of curvature, and the third radius of curvature is smaller than the fourth radius of curvature.

22. A display device, comprising the display substrate according to claim 1.

\* \* \* \* \*